(12) United States Patent
Farrar

(10) Patent No.: US 7,105,914 B2
(45) Date of Patent: Sep. 12, 2006

(54) INTEGRATED CIRCUIT AND SEED LAYERS

(75) Inventor: Paul A. Farrar, So. Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 10/117,041

(22) Filed: Apr. 5, 2002

(65) Prior Publication Data

US 2002/0109233 A1 Aug. 15, 2002

Related U.S. Application Data

(62) Division of application No. 09/484,002, filed on Jan. 18, 2000, now Pat. No. 6,376,370.

(51) Int. Cl.
*H01L 23/58* (2006.01)

(52) U.S. Cl. .................. 257/646; 257/295; 257/751; 257/758; 438/622; 438/626; 438/692

(58) Field of Classification Search ............... 257/295, 257/646, 751, 758, 762, 774; 438/622, 626, 438/692, 640, 625
See application file for complete search history.

(56) References Cited

U.S. PATENT DOCUMENTS

| | | | |
|---|---|---|---|
| 2,842,438 A | 7/1958 | Saarivirta et al. ............. | 75/153 |
| 3,954,570 A | 5/1976 | Shirk et al. .................... | 204/15 |
| 4,386,116 A | 5/1983 | Nair et al. ..................... | 427/99 |
| 4,394,223 A | 7/1983 | Hall .............................. | 204/15 |
| 4,423,547 A | 1/1984 | Farrar et al. .................. | 29/571 |
| 4,565,157 A | 1/1986 | Brors et al. ................... | 118/719 |
| 4,574,095 A | 3/1986 | Baum et al. ................. | 427/53.1 |
| 4,762,728 A | 8/1988 | Keyser et al. ................ | 427/38 |
| 4,788,082 A | 11/1988 | Schmitt ..................... | 427/248.1 |
| 4,847,111 A | 7/1989 | Chow et al. .................. | 427/38 |

(Continued)

FOREIGN PATENT DOCUMENTS

| | | |
|---|---|---|
| JP | 5-267643 | 10/1993 |
| JP | 05160826 | 3/1995 |
| JP | 07078815 | 3/1995 |
| JP | 07-321111 | 8/1995 |

OTHER PUBLICATIONS

Eisenbraun, E. T., et al., "Selective and Blanket Low–Temperature Copper CVD for Multilevel Metallization in ULSI", *Conference Proceedings ULSI–VII*, (1992), 5 pages.

Fukuda, T., et al., "0.5 –micrometer–Pitch Copper–Dual–Damascene Metallization Using Organic SOG (k=2.9) for 0.18–micrometer CMOS Applications", *IEEE*, (1999), pp. 619–622.

(Continued)

*Primary Examiner*—Huan Hoang
*Assistant Examiner*—Dao H. Nguyen
(74) *Attorney, Agent, or Firm*—Schwegman, Lundberg, Woessner & Kluth, P.A.

(57) ABSTRACT

Structures are provided which improve performance in integrated circuits. The structures include a diffusion barrier and a seed layer in an integrated circuit both formed using a low energy ion implantation followed by a selective deposition of metal lines for the integrated circuit. The low energy ion implantation allows for the distinct placement of both the diffusion barrier and the seed layer. Structures are formed with a barrier/adhesion layer deposited in the number of trenches using a low energy ion implantation, e.g. a 100 to 800 electron volt (eV) ion implantation. A seed layer is deposited on the barrier/adhesion layer in the number of trenches also using the low energy ion implantation. Such structures include aluminum, copper, gold, and silver metal interconnects.

38 Claims, 47 Drawing Sheets

U.S. PATENT DOCUMENTS

| | | | |
|---|---|---|---|
| 4,931,410 A | 6/1990 | Tokunaga et al. | 437/189 |
| 4,948,459 A | 8/1990 | Van Laarhoven et al. | 156/643 |
| 4,962,058 A | 10/1990 | Cronin et al. | 437/187 |
| 4,996,584 A | 2/1991 | Young et al. | 357/71 |
| 5,019,531 A | 5/1991 | Awaya et al. | 437/180 |
| 5,034,799 A | 7/1991 | Tomita et al. | 357/71 |
| 5,084,412 A | 1/1992 | Nakasaki | 437/189 |
| 5,100,499 A | 3/1992 | Douglas | 156/635 |
| 5,130,274 A | 7/1992 | Harper et al. | 437/195 |
| 5,158,986 A | 10/1992 | Cha et al. | 521/82 |
| 5,173,442 A | 12/1992 | Carey | 437/173 |
| 5,231,056 A | 7/1993 | Sandhu | 437/200 |
| 5,240,878 A | 8/1993 | Fitzsimmons et al. | 437/187 |
| 5,243,222 A | 9/1993 | Harper et al. | 257/774 |
| 5,256,205 A | 10/1993 | Schmitt, III et al. | 118/723 |
| 5,334,356 A | 8/1994 | Baldwin et al. | 422/133 |
| 5,348,811 A | 9/1994 | Nagao et al. | |
| 5,354,712 A | 10/1994 | Ho et al. | 437/195 |
| 5,371,042 A | 12/1994 | Ong | 437/194 |
| 5,384,284 A | 1/1995 | Doan et al. | 437/190 |
| 5,401,680 A | 3/1995 | Abt et al. | |
| 5,413,687 A | 5/1995 | Barton et al. | 204/192.14 |
| 5,426,330 A | 6/1995 | Joshi et al. | 257/752 |
| 5,442,237 A | 8/1995 | Hughes et al. | 257/759 |
| 5,447,887 A | 9/1995 | Filipiak et al. | 437/200 |
| 5,470,789 A | 11/1995 | Misawa | 437/190 |
| 5,470,801 A | 11/1995 | Kapoor et al. | 437/238 |
| 5,506,449 A | 4/1996 | Nakano et al. | 257/758 |
| 5,538,922 A | 7/1996 | Cooper et al. | 437/195 |
| 5,539,060 A | 7/1996 | Tsunogae et al. | 525/338 |
| 5,595,937 A * | 1/1997 | Mikagi | 438/626 |
| 5,609,721 A | 3/1997 | Tsukune et al. | 156/646.1 |
| 5,633,200 A | 5/1997 | Hu | |
| 5,635,253 A | 6/1997 | Canaperi et al. | 427/437 |
| 5,654,245 A | 8/1997 | Allen | 438/629 |
| 5,670,420 A | 9/1997 | Choi | 437/189 |
| 5,674,787 A | 10/1997 | Zhao et al. | 437/230 |
| 5,679,608 A | 10/1997 | Cheung et al. | 437/195 |
| 5,681,441 A | 10/1997 | Svendsen et al. | 205/114 |
| 5,695,810 A | 12/1997 | Dubin et al. | 427/96 |
| 5,719,089 A | 2/1998 | Cherng et al. | 438/637 |
| 5,719,410 A | 2/1998 | Suehiro et al. | 257/77 |
| 5,739,579 A | 4/1998 | Chiang et al. | 257/751 |
| 5,763,953 A | 6/1998 | Iijima et al. | 257/762 |
| 5,780,358 A | 7/1998 | Zhou | 438/645 |
| 5,785,570 A | 7/1998 | Bruni | 445/52 |
| 5,789,264 A | 8/1998 | Chung | |
| 5,792,522 A | 8/1998 | Jin et al. | 427/575 |
| 5,801,098 A | 9/1998 | Fiordalice et al. | 438/653 |
| 5,814,557 A | 9/1998 | Venkatraman et al. | 438/622 |
| 5,821,168 A * | 10/1998 | Jain | 438/692 |
| 5,824,599 A | 10/1998 | Schacham-Diamand et al. | 438/678 |
| 5,858,877 A | 1/1999 | Dennison et al. | 438/700 |
| 5,891,797 A | 4/1999 | Farrar | 438/619 |
| 5,891,804 A | 4/1999 | Havemann et al. | 438/674 |
| 5,895,740 A | 4/1999 | Chien et al. | 430/313 |
| 5,897,370 A | 4/1999 | Joshi et al. | 438/632 |
| 5,907,772 A | 5/1999 | Iwasaki | 438/253 |
| 5,911,113 A | 6/1999 | Yao et al. | 438/649 |
| 5,925,930 A | 7/1999 | Farnworth et al. | 257/737 |
| 5,930,669 A | 7/1999 | Uzoh | 438/627 |
| 5,932,928 A | 8/1999 | Clampitt | 257/758 |
| 5,940,733 A | 8/1999 | Beinglass et al. | 438/655 |
| 5,948,467 A | 9/1999 | Nguyen et al. | 427/99 |
| 5,962,923 A | 10/1999 | Xu et al. | 257/774 |
| 5,972,179 A | 10/1999 | Chittipeddi et al. | 204/192.17 |
| 5,972,804 A | 10/1999 | Tobin et al. | 438/786 |
| 5,976,710 A | 11/1999 | Sachdev et al. | 428/620 |
| 5,981,350 A | 11/1999 | Geusic et al. | 438/386 |
| 5,985,759 A | 11/1999 | Kim et al. | 438/653 |
| 5,989,623 A | 11/1999 | Chen et al. | 427/97 |
| 5,994,777 A | 11/1999 | Farrar | 257/758 |
| 6,008,117 A | 12/1999 | Hong et al. | 438/629 |
| 6,015,465 A | 1/2000 | Kholodenko et al. | 118/719 |
| 6,017,820 A | 1/2000 | Ting et al. | 438/689 |
| 6,030,877 A | 2/2000 | Lee et al. | 438/381 |
| 6,037,248 A | 3/2000 | Ahn | 438/619 |
| 6,065,424 A | 5/2000 | Shacham-Diamand et al. | 118/696 |
| 6,069,068 A | 5/2000 | Rathore et al. | 438/628 |
| 6,071,810 A | 6/2000 | Wada et al. | 438/635 |
| 6,100,193 A | 8/2000 | Suehiro et al. | 438/685 |
| 6,126,989 A | 10/2000 | Robinson et al. | 427/97 |
| 6,136,095 A | 10/2000 | Xu et al. | 118/719 |
| 6,139,699 A | 10/2000 | Chiang et al. | 204/192.15 |
| 6,140,228 A | 10/2000 | Shan et al. | 438/653 |
| 6,140,234 A | 10/2000 | Uzoh et al. | 438/678 |
| 6,143,646 A | 11/2000 | Wetzel | 438/637 |
| 6,143,655 A | 11/2000 | Forbes et al. | |
| 6,143,671 A | 11/2000 | Sugai | |
| 6,150,261 A * | 11/2000 | Hsu et al. | 438/640 |
| 6,153,507 A | 11/2000 | Mikagi | 438/618 |
| 6,159,769 A | 12/2000 | Farnworth et al. | 438/108 |
| 6,169,024 B1 | 1/2001 | Hussein | |
| 6,171,661 B1 | 1/2001 | Zheng et al. | 427/535 |
| 6,177,350 B1 | 1/2001 | Sundarrajan et al. | 438/688 |
| 6,183,564 B1 | 2/2001 | Reynolds et al. | 118/719 |
| 6,187,656 B1 | 2/2001 | Lu et al. | 438/592 |
| 6,190,732 B1 | 2/2001 | Omstead et al. | 118/729 |
| 6,197,688 B1 | 3/2001 | Simpson | 438/678 |
| 6,207,222 B1 | 3/2001 | Chen et al. | 427/97 |
| 6,207,553 B1 * | 3/2001 | Buynoski et al. | 438/622 |
| 6,207,558 B1 | 3/2001 | Singhvi et al. | 438/648 |
| 6,211,049 B1 | 4/2001 | Farrar | 438/597 |
| 6,211,073 B1 | 4/2001 | Ahn | 438/653 |
| 6,215,186 B1 | 4/2001 | Konecni et al. | |
| 6,221,763 B1 | 4/2001 | Gilton | 438/643 |
| 6,232,219 B1 | 5/2001 | Blalock et al. | 438/637 |
| 6,249,056 B1 | 6/2001 | Kwon et al. | 257/758 |
| 6,251,781 B1 | 6/2001 | Zhou et al. | |
| 6,255,217 B1 | 7/2001 | Agnello et al. | |
| 6,258,707 B1 | 7/2001 | Uzoh | |
| 6,265,311 B1 | 7/2001 | Hautala et al. | 438/680 |
| 6,271,592 B1 | 8/2001 | Kim et al. | 257/751 |
| 6,284,656 B1 | 9/2001 | Farrar | 438/687 |
| 6,287,954 B1 * | 9/2001 | Ashley et al. | 438/622 |
| 6,288,447 B1 | 9/2001 | Amishiro et al. | |
| 6,303,498 B1 | 10/2001 | Chen et al. | |
| 6,323,553 B1 | 11/2001 | Hsu et al. | 257/751 |
| 6,326,303 B1 | 12/2001 | Robinson et al. | 438/678 |
| 6,350,687 B1 | 2/2002 | Avanzino et al. | |
| 6,358,849 B1 * | 3/2002 | Havemann et al. | 438/689 |
| 6,359,328 B1 | 3/2002 | Dubin | 257/622 |
| 6,361,667 B1 | 3/2002 | Kobayashi et al. | |
| 6,365,511 B1 | 4/2002 | Kizilyalli et al. | |
| 6,372,622 B1 | 4/2002 | Tan et al. | 438/612 |
| 6,376,370 B1 | 4/2002 | Farrar | 438/678 |
| 6,387,542 B1 | 5/2002 | Kozlov et al. | 428/673 |
| 6,399,489 B1 * | 6/2002 | M'Saad et al. | 438/680 |
| 6,403,481 B1 | 6/2002 | Matsuda et al. | 438/687 |
| 6,417,094 B1 | 7/2002 | Zhao et al. | |
| 6,420,262 B1 | 7/2002 | Farrar | 438/652 |
| 6,426,289 B1 | 7/2002 | Farrar | 438/670 |
| 6,429,120 B1 | 8/2002 | Ahn et al. | 438/635 |
| 6,492,266 B1 | 12/2002 | Ngo et al. | |
| 6,562,416 B1 | 5/2003 | Ngo et al. | |
| 6,589,863 B1 | 7/2003 | Usami | |
| 6,740,392 B1 | 5/2004 | Farrar | |
| 6,984,891 B1 | 1/2006 | Ahn et al. | |
| 2001/0002333 A1 | 5/2001 | Huang et al. | 438/637 |

| | | | | |
|---|---|---|---|---|
| 2002/0014646 | A1 | 2/2002 | Tsu et al. | 257/296 |
| 2002/0028552 | A1 | 3/2002 | Lee et al. | 438/243 |
| 2002/0096768 | A1 | 7/2002 | Joshi | 257/750 |
| 2002/0109233 | A1 | 8/2002 | Farrar | 257/762 |
| 2005/0023697 | A1 | 2/2005 | Ahn et al. | |
| 2005/0023699 | A1 | 2/2005 | Ahn et al. | |
| 2005/0032352 | A1 | 2/2005 | Farrar | |

OTHER PUBLICATIONS

Kaloyeros, A. E., et al., "Blanket and Selective Copper CVD from Cu(FOD)2 for Multilivel Metallization", *Mat. Res. Soc. Symp. Proc.*, vol. 181,(1990), 6 pages.

Klaus, J. W., "Atomic Layer Deposition of Tungsten Nitride Films Using Sequential Surface Reactions", *Journal of the Electrochemical Society*, 147(3),(2000), pp. 1175–1181.

Min, Jae–Sik , et al., "Metal–Organic Atomic–Layer Deposition of Titanium–Silicon–Nitride Films", *Applied Physics Letters*, vol. 75, No. 11,(1999), pp. 1521–1523.

*In: Metals Handbook, Ninth Edition, vol. 2,* Properties and Selection: Nonferrous Alloys and Pure Metals, ASM Handbook Committee, (eds.), American Society for Metals, Metals Park, OH,(1989), 157, 395.

*In: Kirk–Othmer Concise Encyclopedia of Chemical Technology,* Grayson, M., (ed.), John Wiley & Sons, Inc., New York, NY,(1985),p. 433–435, 926–938.

"Brooks Model 5964 High Performance Metal Seal Mass Flow Controller (Introduced in 1991)", *Brooks Instrument,* http://www.frco.com/brooks/semiconductor/products1i.html,(1991), 1 page.

Abe, K..,et al. ,"Sub–half Micron Copper Interconnects Using Reflow of Sputtered Copper Films", *VLSI Multilevel Interconnection Conference,* (Jun. 25–27, 1995),308–311.

Andricacos, P..C. ,"Copper On–Chip Interconnections", *The Electrochemical Society Interface,* (1999),pp. 32–37.

Anonymous,"Formation of Conductors at Variable Depths—Using Differential Photomask, Projecting Images into Insulator by Reactive Ion Etching, Selectively Filling Images with Conductor", *Research Disclosure,* Disclosure No. RD 291015, Abstract,(Jul. 10, 1988),1 p.

Anonymous,"Improved Metallurgy for Wiring Very Large Scale Integrated Circuits", *International Technology Disclosures, 4,* Abstract,(1986),1 page.

Bae, S..,et al. ,"Low–Temperature Deposition Pathways to Silicon Nitride, Amorphous Silicon, Polycrystalline Silicon, and n type Amorphous Silicon Films Using a High Density Plasma System", *IEEE Conference Records—Abstracts, International Conference on Plasma Science,* (1997),p. 315.

Bai, G..,et al. ,"Copper Interconnection Depostion Techniques and Integration", *1996 Symposium on VLSI Technology,* Digest of Technical Papers,(1996),48–49.

Bernier, M..,et al. ,"Laser processing of palladium for selective electroless copper plating", *SPIE, 2045,* (1994),pp. 330–337.

Bhansali, S..,et al. ,"A novel technique for fabrication of metallic structures on polymide by selective electroless copper plating using ion implantation", *Thin Solid Films, 270, No. 1/02,* (1995),pp. 489–492.

Bhansali, S..,et al. ,"Selective electroless copper plating on silicon seeded by copper ion implantation", *Thin Solid Films, 253,* (1994),pp. 391–394.

Braud, E..,et al. ,"Ultra Thin Diffusion Barriers for Cu Interconnections at The Gigabit Generation and Beyond", *VMIC Conference Proceedings,* (1996),pp. 174–179.

Cabrera, A..L. ,et al. ,"Oxidation protection for a variety of transition metals and copper via surface silicides formed with silane containing atmospheres", *J. Mater. Res., 6(1),* (1991),pp. 71–79.

Craig, J..D. ,"Polymide Coatings", *In: Packaging, Electronic Materials Handbook, vol. 1,* ASM International Handbook Committee (eds.), ASM International, Materials Park, OH,(1989),767–772.

De Felipe, T..S. ,et al. ,"Electrical Stability and Microstructural Evolution in Thin Films of High Conductivity Copper Alloys", *IEEE,* (1999),pp. 293–295.

Ding,et al. ,"Copper Barrier, Seed Layer and Planerization Technologies", *VMIC Conference Proceedings,* (1997),pp. 87–92.

Dubin, V..M. ,et al. ,"Selective and Blanket Electroless Copper Deposition for Ultralarge Scale Integration", *J. Electrochem. Soc., 144(3),* (1997),pp. 898–908.

Dushman, S..,et al. , *Scientific Foundations of Vacuum Technique, 2nd Edition,* John Wiley and Sons,(1962),1–806.

Edelstein, D..,et al. ,"Full Copper Wiring in a Sub–0.25 micrometer CMOS ULSI Technology", *IEDM,* (1997),pp. 773–776.

Eldridge, J..M. ,"New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics,* Mpls, MN,(1987),pp. 283–285.

Ernst,et al. ,"Growth Model for Metal Films on Oxide Surface: Cu on ZnO(0001)–O"", *Physical Review B, 47,* (May 15, 1993), 13782–13796.

Gladlfelter, W..L. ,et al. ,"Trimethylamine Complexes of Alane as Precursors for the Low–Pressure Chemical Vapor Deposition of Aluminum", *Chemistry of Materials, 1,* (1989),pp. 339–343.

Godbey, D..J. ,et al. ,"Copper Diffusion in Organic Polymer Resists and Inter–level Dielectrics", *Thin Solid Films, 308–309,* (1997),pp. 470–474.

Grimblot, J..,et al. ,"II. Oxidation of Aluminum Films", *J. Electrochem., 129,* (1982),pp. 2369–2372.

Hattangady, S..V. ,et al. ,"Integrated processing of silicon oxynitride films by combined plasma and rapid–thermal processing", *J. Vac. Sci. Technol. A, 14(6),* (1996),pp. 3017–3023.

Hirao, S..,et al. ,"A Novel Copper Reflow Process Using Dual Wetting Layers", *1997 Symposium on VLSI Technology,* Digest of Technical Papers,(1997),57–58.

Hirata, A..,et al. ,"WSiN Diffusion Barrier Formed by ECR Plasma Nitridation for Copper Damascene Interconnection", *16th Solid State Devices and Materials,* (1998),pp. 260–261.

Holloway, K..,et al. ,"Tantalum as a diffusion barrier between copper and silicon", *Appl. Phys. Lett., 57(17),* (Oct. 1990),pp. 1736–1738.

Hu, C..K. ,et al. ,"Extendibility of Cu Damascene to 0.1 micrometer Wide Interconnections", *Mat. Res. Soc. Symp. Proc, 514,* (1998),pp. 287–292.

Hymes, S..,et al. ,"Passivation of Copper by Silicide Formation in Dilute Silane", *Conference Proceedings ULSI–VII,* (1992),pp. 425–431.

Iijima, T..,et al. ,"Microstructure and Electrical Properties of Amorphous W–Si–N Barrier Layer for Cu Interconnections", *1996 VMIC Conference,* (1996),pp. 168–173.

Izaki, M..,et al. ,"Characterization of Transparent Zinc Oxide Films Prepared by Electrochemical Reaction", *Journal of the Electrochemical Society, 144,* (Jun. 1997),1949–1952.

Jayaraj, K..,et al. ,"Low Dielectric Constant Microcellular Foams", *Proceedings from the Seventh Meeting of the DuPont Symposium on Polymides in Microelectrics,* (Sep. 1996), pp. 474–501.

Jeon, Y..,et al. ,"Low–Temperature Fabrication of Polycrystalline Silicon Thin Films by ECR Pecvd", *The Electrochemical Society Proceedings, 94(35),* (1995),pp. 103–114.

Jin, C..,et al. ,"Porous Xerogel Films as Ultra–low Permittivity Dielectrics for ULSI Interconnect Applications", *Conference Proceedings ULSI XII—1997 Materials Research Society,* (1997),pp. 463–469.

Kamins, T..I. ,"Structure and Properties of LPCVD Silicon Films", *J. Electrochem. Soc.: Solid–State Science and Technology, 127,* (Mar. 1980),pp. 686–690.

Kang, H..K. ,et al. ,"Grain Structure and Electromigration Properties of CVD CU Metallization", *Proceedings of the 10th International VLSI Multilevel Interconnection Conference,* (Jun. 8–9, 1993),223–229.

Keppner, H..,et al. ,"The "Micromorph" Cell: A New Way to High–Efficiency–Low–Temperature Crystalline Silicon Thin–Film Cell Manufacturing", *Mat. Res. Soc. Symp. Proc., 452,* (1997),pp. 865–876.

Kiang, M..,et al. ,"Pd/Si plasma immersion ion implantation for selective electrless copper plating on Sio2", *Appl. Phys. Lett., 60,* (1992),pp. 2767–2769.

Kistiakowsky, G..B. ,et al. ,"Reactions of Nitrogen Atoms. I. Oxygen and Oxides of Nitrogen", *The Journal of Chemical Physics, 27(5),* (1957),pp. 1141–1149.

Laursen, T..,et al. ,"Encapsulation of Copper by Nitridation of Cu–Ti Alloy/Bilayer Structures", *International Conference on Metallurgical Coatings and Thin Films,* Abstract No. H1.03, San Diego, CA,(Apr. 1997),p. 309.

Len, V..,et al. ,"An investigation into the performance of diffusion barrier materials against copper diffusion using metal–oxide–semiconductor (MOS) capacitor structures", *Solid–State Electronics, 43,* (1999),pp. 1045–1049.

Lyman, T..,et al. ,"Metallography, Structures and Phase Diagrams", *Metals Handbook, 8,* American Society for Metals, Metals Park, Ohio,(1989),pp. 300 & 302.

Marcadal, C..,et al. ,"OMCVD Copper Process for Dual Damascene Metallization", *VMIC Conference,* ISMIC, (1997),pp. 93–97.

Miller, R..D. ,et al. ,"Low Dielectric Constant Polyimides and Polyimide Nanofoams", *Seventh Meeting of the DuPont Symposium on Polymides in Microelectronics,* (Sep. 1996), pp. 443–473.

Miyake, T..,et al. ,"Atomic Hydrogen Enhanced Reflow of Copper", *Applied Physics Letters, 70,* (1997), 1239–1241.

Murarka, S..P. ,et al. ,"Copper Interconnection Schemes: Elimination of The Need of Diffusion Barrier/Adhesion Promoter by the Use of Corrosion Resistant, Low Resistivity Doped Copper", *SPIE, 2335,* (1994),pp. 80–90.

Nakao, S..,et al. ,"Thin and Low–Resistivity Tantalum Nitride Diffusion Barrier and Giant–Grain Copper Interconnects for Advanced ULSI Metallization", *Japanese Journal of Applied Physics, 38(4B),* (Apr. 1999),pp. 262–263.

Newboe, B..,et al. ,"Applied Materials Announces First Barrier/Seed Layer System For Copper Interconnects", *Applied Materials,* http://www.appliedmaterials.com/newsroom/pr–00103.html,(1997),pp. 1–4.

Okamoto, Y..,et al. ,"Magnetically Excited PLasma Oxynitridation of Si at Room Temperature", *Jpn. J. Appl. Phys., 34,* (1995),pp. L955–957.

Palleau, J..,et al. ,"Refractory Metal Encapsulation in Copper Wiring", *Advanced Metallization for Devices and Circuits–Science, Technology and Manufacturability, Materials Research Society Symposium Prodceedings, 337,* (Apr. 1994),pp. 225–231.

Park, C..W. ,et al. ,"Activation Energy for Electromigration in Cu Films", *Applied Physics Letters, 59(,* (Jul. 6, 1991), 175–177.

Radzimski, Z..J. ,et al. ,"Directional Copper Deposition using d–c Magnetron Self–sputtering", *J. Vac. Sci. Technol. B, 16(3),* (1998),pp. 1102–1106.

Ramos, T.,et al. ,"Nanoporous Silica for Dielectric Constant Less Than 2", *Conference Proceedings ULSI XII—1997 Materials Research Society,* (1997),455–461.

Rath, J..K. ,et al. ,"Low–Temperature deposition of polycrystalline silicon thin films by hot–wire CVD", *Solar Energy Materials and Solar Cells, 48,* (1997),pp. 269–277.

Ray, S..K. ,et al. ,"Flourine–enhanced nitridation of silicon at low temperatures in a microwave plasma", *J. Appl. Phys., 70(3),* (1991),pp. 1874–1876.

Rossnagel, S..M. ,"Magnetron Sputter Depostion of Interconnect Applications", *Conference Proceedings, ULSI XI,* (1996),227–232.

Rossnagel, S..M. ,et al. ,"Metal ion deposition from ionized mangetron sputtering discharge", *J. Vac. Sci. Technol. B, 12(1),* (1994),pp. 449–453.

Ryan, J..G. ,et al. ,"Copper Interconnects for Advanced Logic and DRAM", Extended Abstracts of the 1998 International Conference on Solid–State Devices and Materials, Hiroshima,(1998),pp. 258–259.

Ryu, C..,et al. ,"Barriers for copper interconnections", *Solid State Technology,* (Apr. 1999),pp. 53,54,56.

Saarivirta, M..J. ,"High Conductivity Copper Rich Cu–Zr Alloys", *Transactions of the Metallurgical Society of AIME, 218,* (1960),pp. 431–437.

Senzaki, Y..,"Chemical Vapor Deposition of Copper using a New Liquid Precursor with Improved Thermal Stability", *Conference Proceedings ULSI XIII, Materials Research Society,* (1998),pp. 451–455.

Shacham–Diamand, Y..,"100 nm Wide Copper Lines Made by Selective Electroless Deposition", *Journal of Micromechanics and Microengineering, 1,* (Mar. 1991),66–72.

Shacham–Diamand, Yosi.,et al. ,"Copper electroless deposition technology for ultra–large–scale–intergration (ULSI) metallization", *Microelectronic Engineering, NL, vol. 33, No. 1, XP004054497,* (1997),47–58.

Shacham–Diamand, Y..,et al. ,"Copper electroless deposition technology for ultra–large–scale–integration (ULSI) metallization", *Microelectronic Engineering, 33,* (1997),pp. 47–58.

Srivatsa, A..R. ,et al. ,"Jet Vapor Deposition: an Alternative to Electrodeposition", *Surface Engineering, 11,* (1995),75–77.

Stroud, P..T. ,et al. ,"Preferential deposition of silver induced by low energy gold ion implantation", *Thin Solid Films, Switzerland, vol. 9, No. 2, XP000993098,* (Feb. 1972), 273–281.

Tao, J..,et al. ,"Electromigration Characteristics of Copper Interconnects", *IEEE Electron Devices Letters, 14,* (May 1993),249–251.

Ting, C..H. ,"Methods and Needs for Low K Material Research", *Materials Research Society Symposium Proceedings, vol. 381,* Low–Dielectric Constant Materials—Synthesis and Applications in Microelectronics, Lu, T.M., et al., (eds.), San Francisco, CA,(Apr. 17–19, 1995),3–17.

Tsukada, T..,et al. ,"Adhesion of copper films on ABS polymers deposited in an internal magnet magnetron sputtering system", *J. Vac. Sci. Technol., 16(2),* (1979),348–351.

Van Vlack, L..H. , *Elements of Materials Science,* Addison–Wesley Publishing Co., Inc. Reading, MA,(1959),p. 468.

Venkatesan, S..,et al. ,"A High Performance 1.8V, 0.20 micrometer CMOS Technology with Copper Metalization", *IEEE,* (1997),pp. 769–772.

Vossen, J..L. ,et al. , *Thin Film Processes II,* Academic Press, Inc.,(1991),1–866.

Wang, X..W. ,et al. ,"Highly Reliable Silicon Nitride Thin Films Made by Jet Vapor Deposition", *Japanese Journal of Applied Physics, 34,* (Feb. 1995),955–958.

Wang, K..,et al. ,"Very Low Temperature Deposition of Polycrystalline Silicon Films with Micro–Meter–Order Grains on SiO2", *Mat. Res. Soc. Symp. Proc., 355,* (1995), pp. 581–586.

Winters, H..F. ,et al. ,"Influence of Surface Absorption Characteristics on Reactivity Sputtered Films Grown in the Biased and Unbiased Modes", *J. Appl. Phys., 43(3),* (1972), pp. 794–799.

Wolf, S..,et al. , *Silicon Processing for the VLSI Era, vol. 1—Process Technology,* Lattice Press, Sunset Beach, CA,(1986),p. 514–538.

Yeh, J..L. ,et al. ,"Selective Copper plating of Polysilicon Surface Micromachined Structures", *Solid–State Sensor and Actuator Workshop,* (1998),pp. 248–251.

Zhang, J..,et al. ,"Investigations of photo–induced decomposition of palladium acetate for electroless copper plating", *Thin Solid Films, 318,* (1998),pp. 234–238.

* cited by examiner

INTEGRATED CIRCUIT AND SEED LAYERS

RELATED APPLICATIONS

This application is a Divisional of U.S. application Ser. No. 09/484,002, filed Jan. 18, 2000 now U.S. Pat. No. 6,376,370, which is incorporated herewith.

This application is related to the following co-pending, commonly assigned applications: U.S. application Ser. No. 09/128,859 filed Aug. 4, 1998, now U.S. Pat. No. 6,284,656, U.S. application Ser. No. 09/488,098, filed Jan. 18, 2000, now U.S. Pat. No. 6,429,120, and U.S. application Ser. No. 09/484,303, filed Jan. 18, 2000, which are hereby incorporated by reference.

FIELD OF THE INVENTION

The present invention relates generally to integrated circuits. More particularly, it pertains to structures and methods for providing seed layers for integrated circuit metallurgy.

BACKGROUND OF THE INVENTION

One of the main problems confronting the semiconductor processing industry, in the ULSI age, is that of Capacitive-Resistance loss in the wiring levels. This has led to a large effort to reduce the resistance of and lower the capacitive loading on the wiring levels. Since its beginning, the industry has relied on aluminum and aluminum alloys for wiring. In a like manner, the industry has mainly relied on $SiO_2$ as the insulator of choice, although polyimide was used in a number of products by one vendor (IBM), for a number of years. The capacitive resistance problem grows with each succeeding generation of technology. As the dimensions decrease the minimum line space combination decreases, thus increasing both capacitance and resistance, if the designer is to take advantage of the improved ground rules.

To improve the conductivity, it has been suggested by numerous investigators, that copper or perhaps silver or gold metallurgy be substituted for the aluminum metallurgy, now being used. Several potential problems have been encountered in the development of these proposed metallurgies. One of the main ones is the fast diffusion of copper through both silicon and $SiO_2$. This along with the known junction poising effects of copper and gold have led to proposals to use a liner, to separate these metallurgies from the $SiO_2$ insulator.

For example, an article authored by Karen Holloway and Peter M. Fryer, entitled, "Tantalum as a diffusion barrier between copper and silicon", Appl. Phys. Letter vol.57, No. 17, Oct. 22, 1990, pp. 1736–1738, suggests the use of a tantalum metal liner. In another article authored by T. Laursen and J. W. Mayer, entitled, "Encapsulation of Copper by Nitridation of Cu-Ti Alloy/Bilayer Structures", International Conference on Metallurgical Coatings and Thin Films, San Diego, Calif., Apr. 21–25, 1997, Abstract No. H1.03, pg. 309, suggests using a compound such as CuTi as the liner. Still another article published by Vee S. C. Len, R. E. Hurley, N. McCusker, D. W. McNill, B. M. Armstrong and H. S. Gamble, entitled, "An investigation into the performance of diffusion barrier materials against copper diffusion using metal-oxide-semiconductor (MOS) capacitor structures", Solid-State Electronics 43 (1999) pp. 1045–1049 suggests using a compound such as TaN as the liner. These approaches, however, do not fully resolve the above-stated problem of the minimum line space decreases. Thus, the shrinking line size in the metal line and liner combination again increases both the capacitance and resistance.

At the same time other investigators, in looking at the capacitive loading effect, have been studying various polymers such as fluorinated polyimides as possible substitutions for $SiO_2$ insulators. Several of these materials have dielectric constants considerably lower than $SiO_2$. However as in the case of $SiO_2$, an incompatibility problem with copper metallurgy has been found. For example, in a presentation by D. J. Godbey, L. J. Buckley, A. P. Purdy and A. W. Snow, entitled, "Copper Diffusion in Organic Polymer Resists and Inter-level Dielectrics", at the International Conference on Metallurgical Coatings and Thin Films, San Diego, Calif., Apr. 21–25, 1997, Abstract H2.04 pg. 313, it was shown that polyimide, and many other polymers, react with copper during the curing process, forming a conductive oxide $CuO_2$, which is dispersed within the polymer. This then raises the effective dielectric constant of the polymer and in many cases increases the polymers conductivity. In addition it has been found that reactive ion etching (RIE) of all three metals, copper, silver or gold, is difficult at best.

Other approaches by investigators have continued to look for ways to continue to use aluminum wiring with a lower dielectric constant insulator. This would decrease the capacitive load with a given inter-line space but require wider or thicker lines. The use of thicker lines would increase the capacitive loading in direct proportion to the thickness increase. Thus to some measure, it defeats the objectives of decreasing the capacitive loading effects. Therefore, the use of thicker lines should be avoided as much as possible. As the resistivity of the line is directly proportional to its cross-sectional area, if it cannot be made thicker, it must be made wider. If however the lines are made wider, fewer wiring channels can be provided in each metal level. To obtain the same number of wiring channels, additional levels of metal must be provided. This increases the chip cost. So if this approach is to be followed, it is imperative that a low cost process sequence be adopted.

One approach provided by the present inventor in a co-pending application, entitled, "Copper Metallurgy in Integrated Circuits", filed Aug. 4, 1998, application Ser. No. 09/128,859, proposes a method to solve many of the problems associated with using copper in a polymer insulator. This process, which was specifically designed to be compatible with a polymer or foam insulation, required that the unwanted copper on the surface of each layer be removed by Chemical Mechanical Polishing (CMP) or a similar planarizing process. However, this method may require careful process control, leading to additional expense. Another approach is provided in a co-pending application by Kie Ahn and Leonard Forbes, entitled "Method for Making Copper and Other Metal Interconnections in Integrated Circuits", filed Feb. 27, 1998, U.S. Ser. No. 09/032,197, which proposes a method using ionized sputtering to form the underlayer, then forming a low wetting layer on the areas where no copper is desired using jet vapor deposition. The copper is deposited with ionized Magnetron sputtering followed by hydrogen annealing. The excess copper is then removed by CMP as in the aforementioned application.

Another process is described by the present inventor in a co-pending application, entitled, "Integrated Circuit with Oxidation Resistant Polymeric Layer", filed Sep. 1, 1998, U.S. Ser. No. 09/145,012, which eliminates many of the CMP processes and uses lift-off to define the trench and the seed layer simultaneously. A process is also described by the present inventor in a co-pending application, entitled, "Conductive Structures in Integrated Circuits" filed Mar. 1, 1999, U.S. Serial No. 09/259,849, which required a CMP process to remove unwanted seed material prior to a selective deposition of the metal layers in a damascene or dual damascene process.

The use of CMP has proven to be effective in reducing local non-planarity. However, extensive dishing in wide lines and rounding of corners of the insulator are a common occurrence. It has been found that by maintaining a regular structure through the use of dummy structures and small feature sizes, it is possible to planarize a level to a nearly flat surface. The use of these techniques are however costly and in some cases come with density or performance penalties. It is, however, generally possible to planarize a structure prior to the metal levels using these methods with little or no density penalty. The use of electroless plating has been suggested in an article authored by Yosi Schacham-Diamand and Valery M. Dubin, entitled "Copper electroless deposition technology for ultra-large scale-integration (ULSI) metallization", Microelectronic Engineering 33 (1997) 47–58, however a simple process for obtaining both a barrier layer as well as a seed layer is needed to improve the cost effectiveness of this technique. One technique for seeding polyimide and silicon surfaces using high energy (10–20 Kilo Electron Volts {KEV}) ion implantation has been demonstrated in an article authored by S. Bhansali, D. K. Sood and R. B. Zmood, entitled "Selective electroless copper plating on silicon seeded by copper ion implantation", Thin Solid Films V253 (1994) pp. 391–394. However this process has not been shown to be implementable into a product structure where a barrier and/or adhesion layer is required.

For the reasons stated above and for others which will become apparent from reading the following disclosure, structures and methods are needed which alleviate the problems associated with via and metal line fabrication processes. These structures and methods for via and metal line fabrication must be streamlined and accommodate the demand for higher performance in integrated circuits even as the fabrication design rules shrink.

SUMMARY OF THE INVENTION

The above mentioned problems associated with integrated circuit size and performance, the via and metal line formation process, and other problems are addressed by the present invention and will be understood by reading and studying the following specification. The structures and methods of the present invention include a diffusion barrier and a seed layer in an integrated circuit both formed using a low energy ion implantation followed by a selective deposition of metal lines for the integrated circuit. According to the teachings of the present invention, the selective deposition of the metal lines avoids the need for multiple chemical mechanical planarization (CMP) steps. The low energy ion implantation of the present invention allows for the distinct placement of both the diffusion barrier and the seed layer. A residual resist can be used to remove the diffusion barrier and the seed layer from unwanted areas on a wafer surface.

In particular one illustrative embodiment of the present invention includes a method of making a diffusion barrier and a seed layer in an integrated circuit. The method includes patterning an insulator material to define a number of trenches in the insulator layer opening to a number of first level vias in a planarized surface. A barrier/adhesion layer is deposited in the number of trenches using a low energy ion implantation, e.g. a 100 to 800 electron volt (eV) ion implantation. A seed layer is deposited on the barrier/adhesion layer in the number of trenches also using the low energy ion implantation. This novel methodology further accommodates the formation of aluminum, copper, gold, and/or silver metal interconnects.

BRIEF DESCRIPTION OF THE DRAWINGS

The following detailed description of the preferred embodiments can best be understood when read in conjunction with the following drawings, in which:

FIGS. 2A–2K illustrate another embodiment of the various processing steps for forming vias and metal lines according to the teachings of the present invention;

FIGS. 3A–3K illustrate another embodiment of the various processing steps for forming vias and metal lines according to the teachings of the present invention;

FIGS. 4A–4L illustrate another embodiment of the various processing steps for forming vias and metal lines according to the teachings of the present invention;

DETAILED DESCRIPTION

Figure 1A:
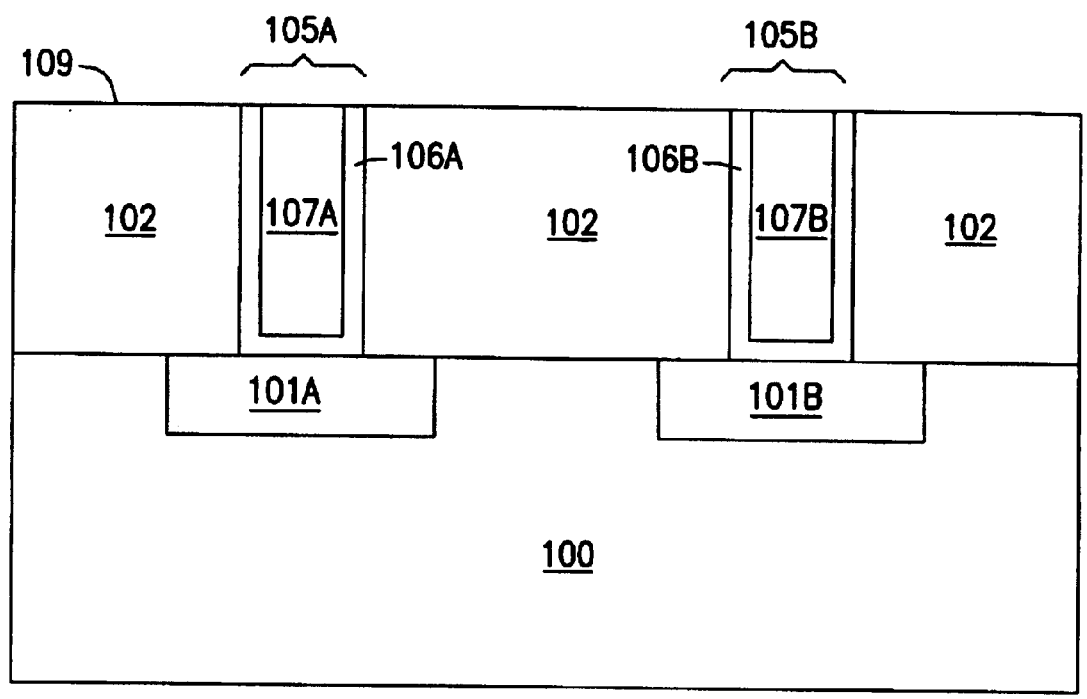
FIGS. 1A–1K illustrate one embodiment of the various processing steps for forming vias and metal lines according to the teachings of the present invention.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Substrate include doped and unhoped semiconductors, epitaxial semiconductor layers supported by a base semiconductor or insulator, as well as other semiconductor structures well known to one skilled in the art. The term insulator is defined to include any material that is less electrically conductive than the materials generally referred to as conductors by those skilled in the art. The following detailed description is, therefore, not to be taken in a limiting sense.

What is disclosed herein is a low cost process to achieve reduced capacitance and resistance loss in wiring levels. The present invention requires only one complete CMP planarizing coupled with the formation of the first level vias, no matter how many levels of metallurgy are used. What are essentially cleanup CMP steps on each metal level are used in one process sequence. This process can be used with an aluminum, copper, silver, gold or any other material which can subsequently be electrolessly plated or deposited by selective CVD or any other selective deposition process. A polyimide, other polymer or foam polymer can be used as an insulator. It can also be used with an oxide or other inorganic insulating structure if the insulating stack is compatible with the metal being used. It can also be used to form air bridge structures as well. The process uses low energy ion implantation to deposit both the adhesion and/or barrier layer along with the seed layer. This is coupled with using the resist layer which defines the damascene trench as the blocking layer to define the implant areas. Low energy implantation allows the placing of distinct layers of both barrier/adhesion and seed layers. The use of the same resist layers to define both the trench and seed layers allows a low cost implementation of the process.

Embodiment of a Metal Interconnect Using Copper and Polyimide

FIGS. 1A–1K illustrate a novel methodology for the formation of metal interconnects and/or a wiring structure in an integrated circuit according to the teachings of the present invention. The novel methodology includes the novel formation of a barrier/adhesion layer and a seed layer in an integrated circuit using a low energy ion implantation. The novel methodology also encompasses a novel method of making copper, silver, aluminum, or gold interconnect for an integrated circuit.

FIG. 1A illustrates a portion of an integrated circuit structure, namely an integrated circuit having a number of semiconductor devices formed in a substrate. FIG. 1 illustrates the structure after a device structure is formed in the substrate and the contact structure to the device structure is in place. One of ordinary skill in the art will understand upon reading this disclosure the manner in which a number of semiconductor structures, e.g. transistors, can be formed in a substrate. One of ordinary skill in the art will also understand upon reading this disclosure the manner in which a contact structure can be formed connecting to a given semiconductor device in a substrate. For example, FIG. 1A illustrates the structure after a number of device structures, e.g. transistor 101A and 101B are formed in the substrate 100. An insulator layer 102 is deposited over the number of semiconductors 101A and 101B. The deposition of the insulator layer 102 can include depositing a layer of $Si_3N_4$ having a thickness in the range of 100 to 500 Angstroms (Å). This insulator layer will also serve as an additional barrier to impurities coming from subsequent processing steps. Contact holes 105A and 105B are opened to the number of device structures 101A and 101B using a photolithography technique. One of ordinary skill in the are will understand, upon reading this disclosure, the manner in which a photolithography technique can be used to create contact holes 105A and 105B. In one embodiment of the present invention a titanium silicide liner 106A and 106B is placed in the contact holes 105A and 105B, such a through a process such as chemical vapor deposition (CVD). Next, tungsten vias 107A and 107B can be deposited in the contact holes 105A and 105B. The tungsten vias 107A and 107B can be deposited in the contact holes using any suitable technique such as using a CVD process. The excess tungsten is then removed from the wafer surface by chemical mechanical planarization (CMP) or other suitable processes to form a planarized surface 109.

Figure 1B:
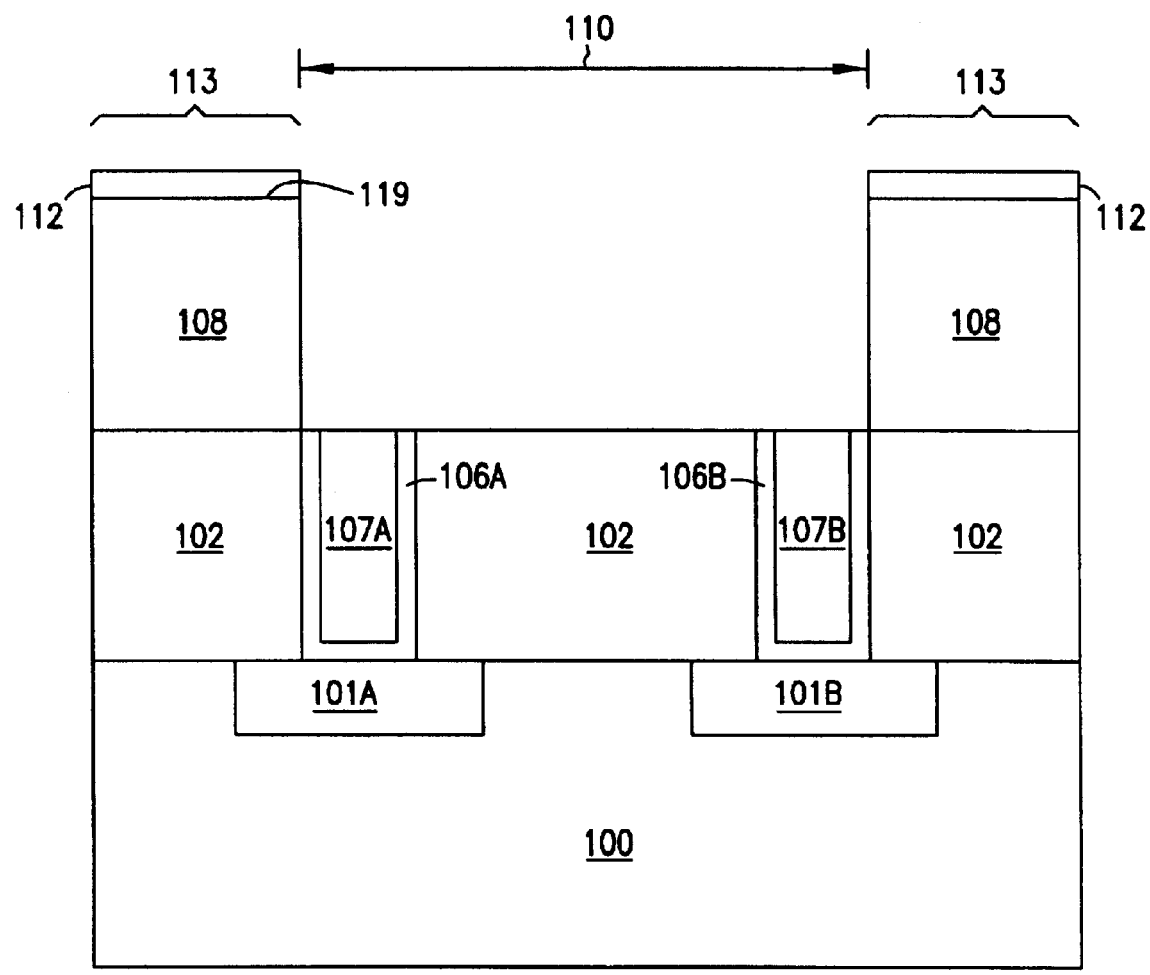

As shown in FIG. 1B, a first polymer layer 108, or first layer of polyimide 108, is deposited over the wafer surface. The first polymer layer 108 may be deposited using, for example, the process and material described in co-pending and commonly assigned application U.S. Ser. No. 09/128,859, entitled "Copper Metallurgy in Integrated Circuits," which is hereby incorporated by reference. In one embodiment, depositing a first polymer layer 108 includes depositing a foamed polymer layer 108. In one embodiment, the first layer of polyimide 108 is deposited and cured, forming a 5000 Å thick layer of polymer 108 after curing.

As one of ordinary skill in the art will understand, upon reading this disclosure, other suitable thickness for the first layer of polyimide 108, or insulator layer/material 108, may also be deposited as suited for forming a first level metal pattern, the invention is not so limited. The first layer of polyimide 108, or first insulator layer/material 108 is patterned to define a number of trenches 110 in the first insulator layer 108 opening to a number of first level vias, e.g. tungsten vias 107A and 107B in planarized surface 109. In other words, a first level metal pattern 110 is defined in a mask layer of photoresist 112 and then the first layer of polyimide 108 is etched, using any suitable process, e.g. reactive ion etching (RIE), such that the first level metal pattern 110 is defined in the polyimide. According to the teachings of the present invention, a residual photoresist layer 112 is left in place on the first insulator layer 108 in a number of region 113 outside of the number trenches 110. The structure is now as appears in FIG. 1B.

Figure 1C:
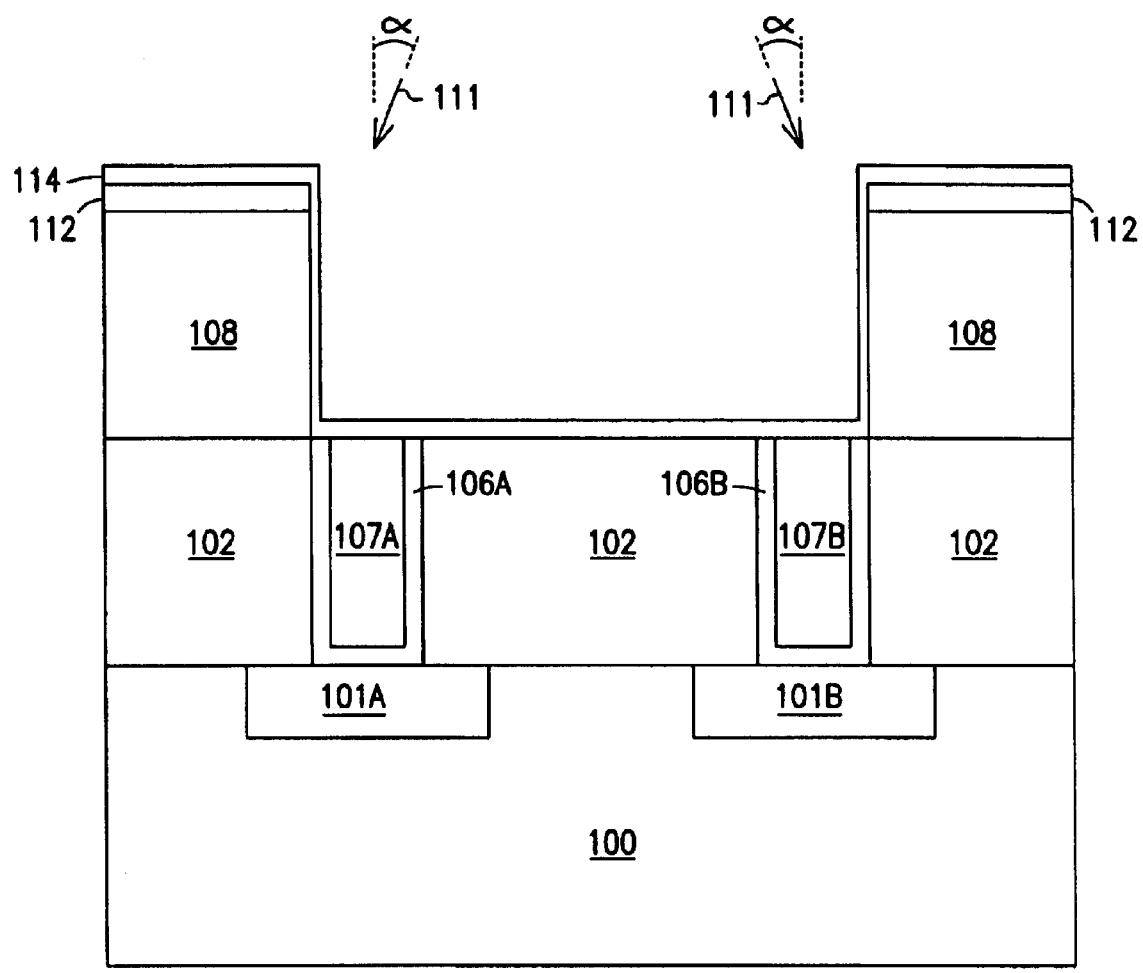

As shown in FIG. 1C, a first barrier/adhesion layer 114 is deposited in the number of trenches 110 using a low energy ion implantation. In one embodiment according to the teachings of the present invention, depositing the barrier/adhesion layer 114 includes depositing a layer of zirconium 114 having a thickness of approximately 5 to 100 Å. In alternate embodiments, depositing the barrier/adhesion layer 114 includes depositing a barrier/adhesion layer 114 of titanium and/or hafnium. In one embodiment, depositing the depositing a layer of zirconium 114 includes depositing a layer of zirconium 114 having a thickness of approximately 50 Å. This can be achieved using a $10^7$ ion implant of zirconium, i.e. $10^{17}$ ions of zirconium per square centimeter ($cm^2$). According to the teachings of the present invention, the layer of zirconium 114 is implanted at 100 electron volts (eV) into the surface of the trenches 110 in the polymer layer 108 using a varying angle implant ($\propto$), as represented by arrows 111, where the angle of implantation is changed from normal to the wafer surface to 15 degrees off normal. As one of ordinary skill in the art will understand upon reading this disclosure, using a varying angle implant, where an angle of implantation is changed from normal to the planarized surface 109 to approximately 15 degrees off normal deposits the barrier/adhesion layer 114 on all surfaces in the number of trenches 110. The structure is now as appears in FIG. 1C.

Figure 1D:
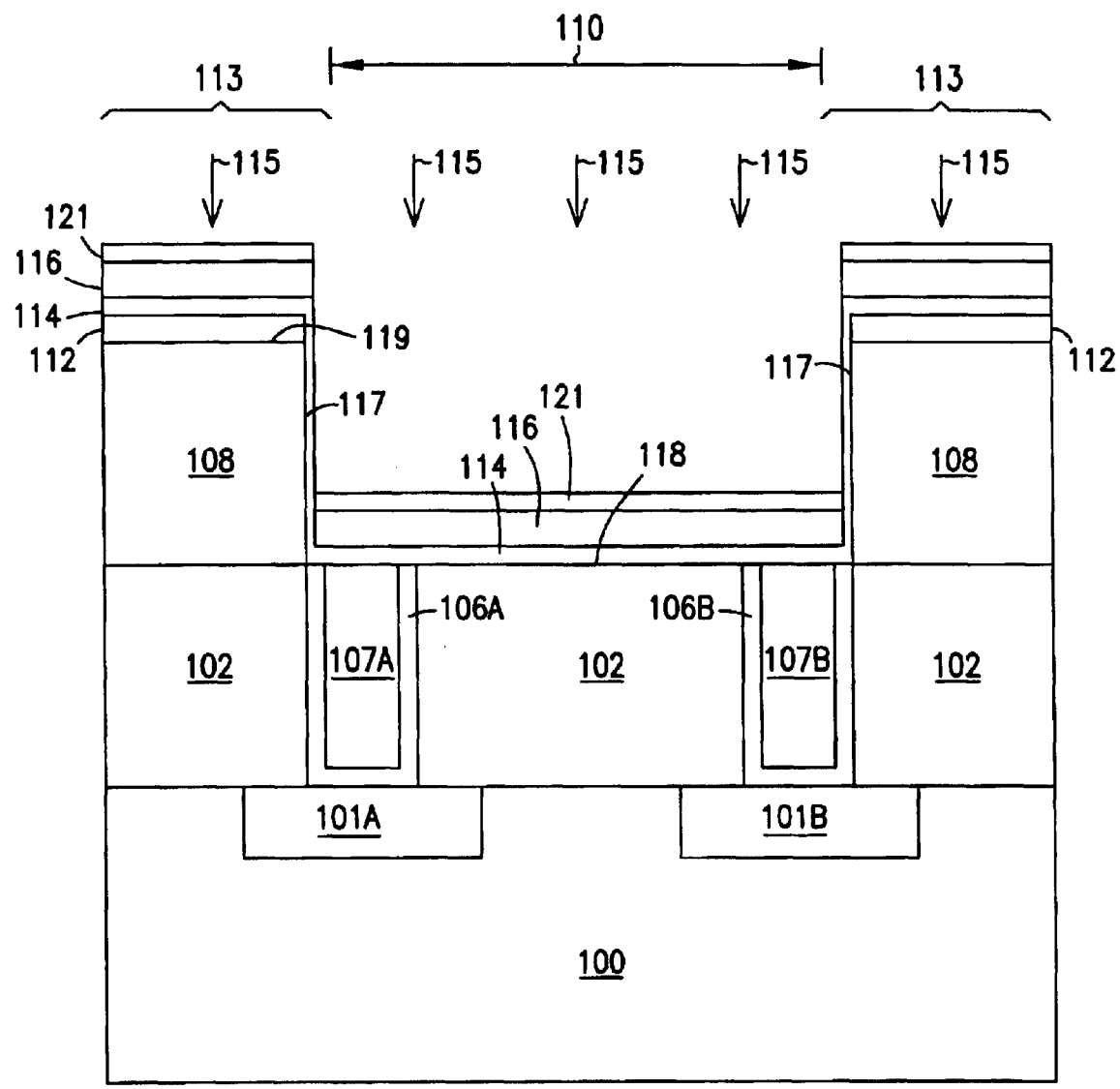

In FIG. 1D, a first seed layer 116 is deposited on the first barrier/adhesion layer 114 using a low energy ion implantation. According to the broader teachings of the present invention, depositing the seed layer 116 on the barrier/adhesion layer 114 includes depositing a seed layer 116 selected from the group consisting of aluminum, copper, silver, and gold. However, according to the teachings of the present embodiment, depositing the seed layer 116 includes depositing a layer of copper 116 having a thickness of approximately a 100 Å. This can be achieved using an $8 \times 10^{16}$ ion implant of copper. According to the teachings of the present invention, using a low energy ion implantation includes implanting the layer of copper 116 at 100 electron volts (eV) into the surface of the trenches 110 in the polymer layer. Also the layer of copper 116 is implanted at an angle normal to the wafer's surface, as shown by arrows 115. As one of ordinary skill in the art will understand upon reading this disclosure, implanting the layer of copper 116 at an angle normal to the planarized surface results in the seed layer of copper 116 remaining on a bottom surface 118 in the number of trenches 110 and to a much lesser extent on the side surfaces 117 of the number of trenches 110. In one embodiment, an optional layer of aluminum 121 is deposited over the copper seed layer 116 again using a low energy ion implantation of 100 electron volts (eV). The optional layer of aluminum 121 is deposited to have a thickness of approximately a 50 Å. This can be achieved using a $3 \times 10^6$ ion implant of aluminum normal to the wafer surface. As one of ordinary skill in the art will understand upon reading this disclosure, the layer of aluminum 121 is used to protect the copper seed layer 116 from oxidation prior to subsequent processing steps. The structure is now as shown in FIG. 1D.

Figure 1E:
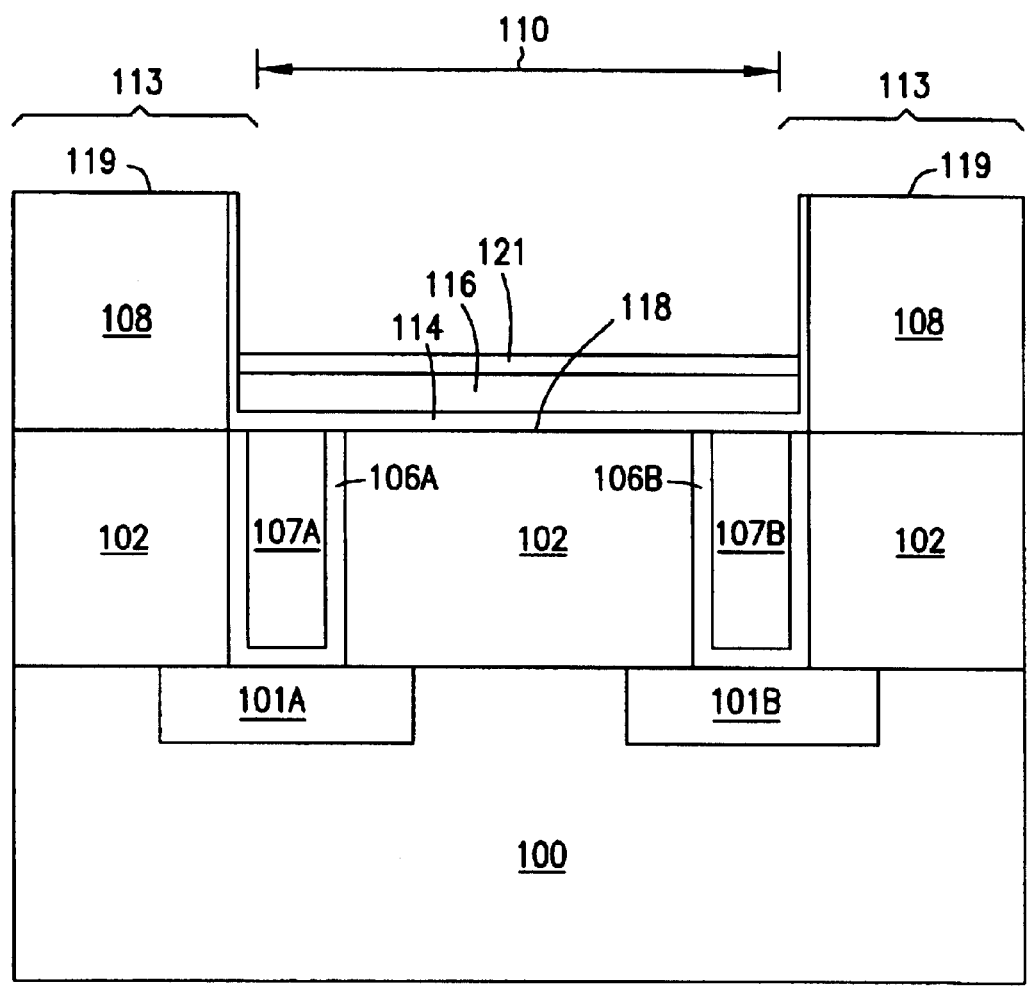

FIG. 1E illustrates the structure after the next sequence of process steps. As one of ordinary skill in the art will understand upon reading this disclosure, the residual photoresist layer 112 has served as a blocking layer to define the implant areas for the barrier/adhesion layer 114, the seed layer 116, and the layer of aluminum 121. The residual photoresist layer 112 is now removed using a wet strip process, as the same will be understood by one of ordinary skill in the art upon reading this disclosure. According to the teachings of the present invention, removing the residual photoresist layer 112 includes removing the unwanted aluminum layer 121, the unwanted seed layer 116, and the unwanted barrier/adhesion layer 114 from other areas of the wafer's surface, e.g., from over a number of regions 113 outside of the trenches 110 on a top surface 119 of the first insulator layer 108. The structure is now as shown in FIG. 1E.

Figure 1F:
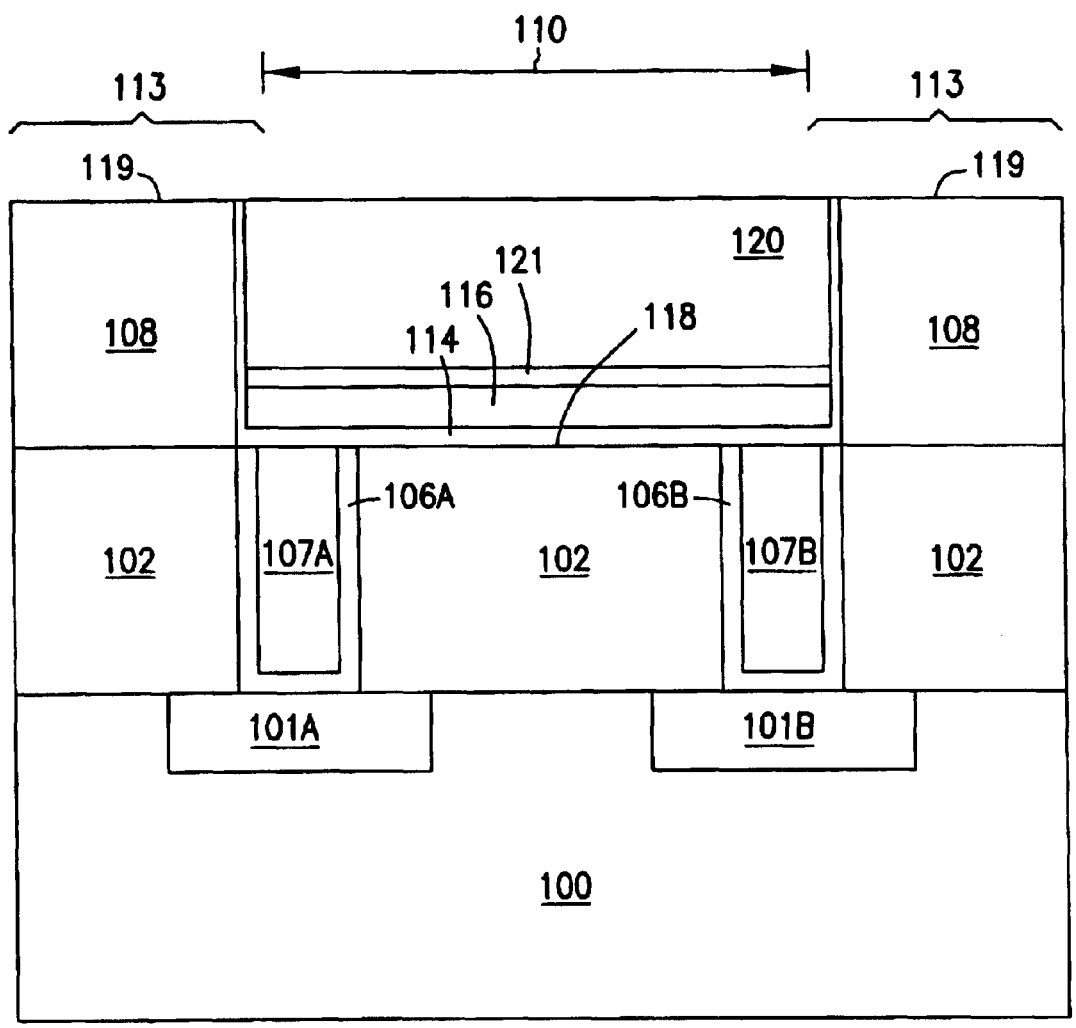
Figure 1G:
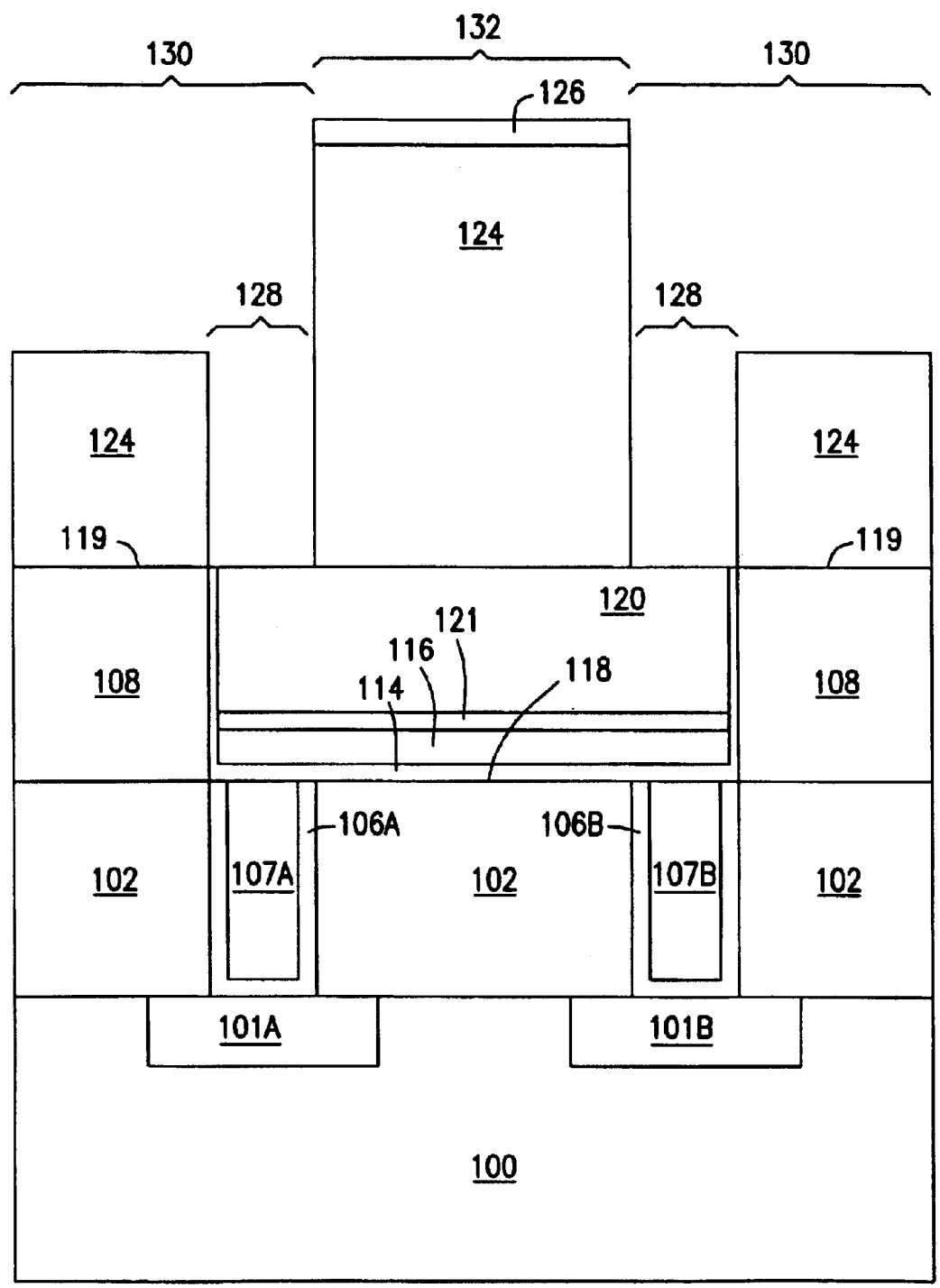

In FIG. 1F, a metallic conductor 120, or number of first level metal lines 120, is deposited over the seed layer 116 in the number of trenches 110. According to teachings of the present invention, metallic conductor 120, or number of first level metal lines 120, is selected from the group consisting of aluminum, copper, silver, and gold depending on the type of seed layer 116 which was deposited. According to this embodiment, the metallic conductor 120, or number of first level metal lines 120 are selectively formed on the copper seed layer 116 such that the number of copper metal lines 120, or first level copper metal lines 120 are not formed on the top surface 119 of the first insulator layer 108. In one embodiment, the metallic conductor 120, or number of first level metal lines 120, is deposited using a selective CVD process. In another embodiment, depositing a metallic conductor 120, or number of first level metal lines 120, over the seed layer 116 includes depositing a metallic conductor 120 using electroless plating. Electroless copper plating is used to deposit sufficient copper to fill the number of trenches 110 to the top surface 119 of the first insulator layer 108. As shown in FIG. 1G, the process sequence may be continued to form any number of subsequent metal layers in a multilayer wiring structure. FIG. 1G illustrates the structure after the next sequence of processing steps. In FIG. 1G, a dual damascene process is used to define and fill a first to a second level of vias and a second level metallurgy. To do so, a second polymer layer 124, or second layer of polyimide 124, is deposited over the wafer surface, e.g. the metallic conductor 120, or number of first level metal lines 120, and the first polymer layer 108. The second polymer layer 124 may similarly be deposited using, for example, the process and material described in co-pending and commonly assigned application U.S. Ser. No. 09/128,859, entitled "Copper Metallurgy in Integrated Circuits," which is hereby incorporated by reference. In one embodiment, depositing a second polymer layer 124 includes depositing a foamed second polymer layer 124. In one embodiment, the second polymer layer 124 is deposited and cured, forming a 10,000 Å thick second polymer layer 124 after curing. As one of ordinary skill in the art will understand, upon reading this disclosure, other suitable thickness for the second polymer layer 124, or second insulator layer/material 124, may also be deposited as suited for forming a first to a second level of vias, e.g. second level vias, and a number of second level metal lines, the invention is not so limited. The second polymer layer 124, or second insulator layer/material 124 is patterned to define a second level of vias and a number of second level metal lines in the second insulator layer/material 124 opening to the metallic conductor 120, or number of first level metal lines 120. In other words, a second level of vias is defined in a second mask layer of photoresist 126 and then the second polymer layer 124 is etched, using any suitable process, e.g. reactive ion etching (RIE), such that a second level of via openings 128 are defined in the polyimide. Using the dual damascene process, a number of second level metal lines are also defined in a second mask layer of photoresist 126 and the second polymer layer 124 is again etched, using any suitable process, e.g. reactive ion etching (RIE), such that a second level of metal line trenches 130 are defined in the polyimide. One of ordinary skill in the art will understand upon reading this disclosure, the manner in which a photoresist layer 126 can be mask, exposed, and developed using a dual damascene process to pattern a second level of via openings 128 and a second level of metal line trenches 130 in the second insulator layer/material 124.

As described previously, and according to the teachings of the present invention, a residual photoresist layer 126 is left in place on the second insulator layer/material 124 in a number of regions 132 outside of the second level of metal line trenches 130. A suitable plasma and/or wet cleaning process is used to remove any contaminates from the second level of via openings 128 and a second level of metal line trenches 130, as the same will be understood by one of ordinary skill in the art upon reading this disclosure. The structure is now as appears in FIG. 1G.

Figure 1H:
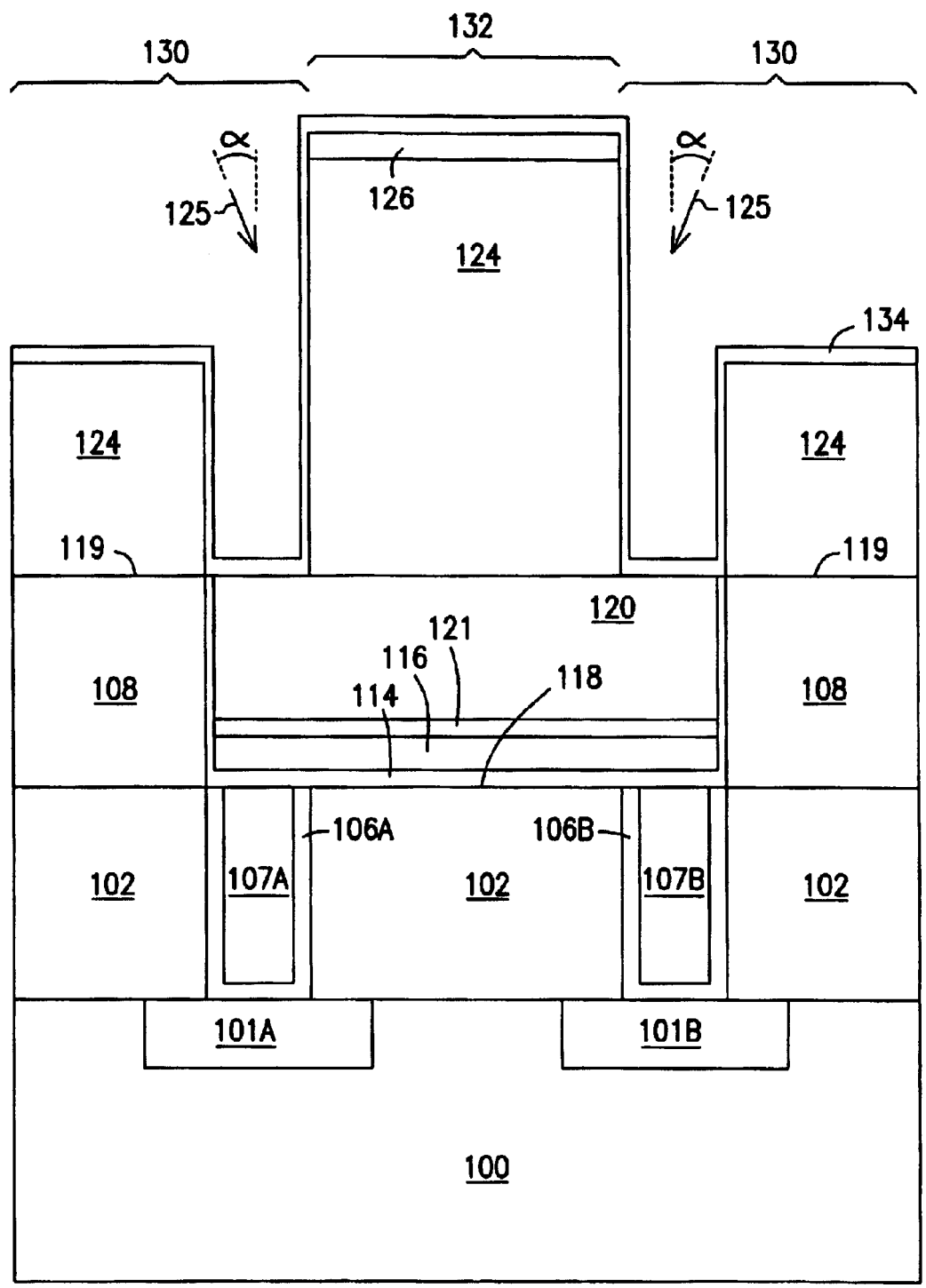
Figure 1I:
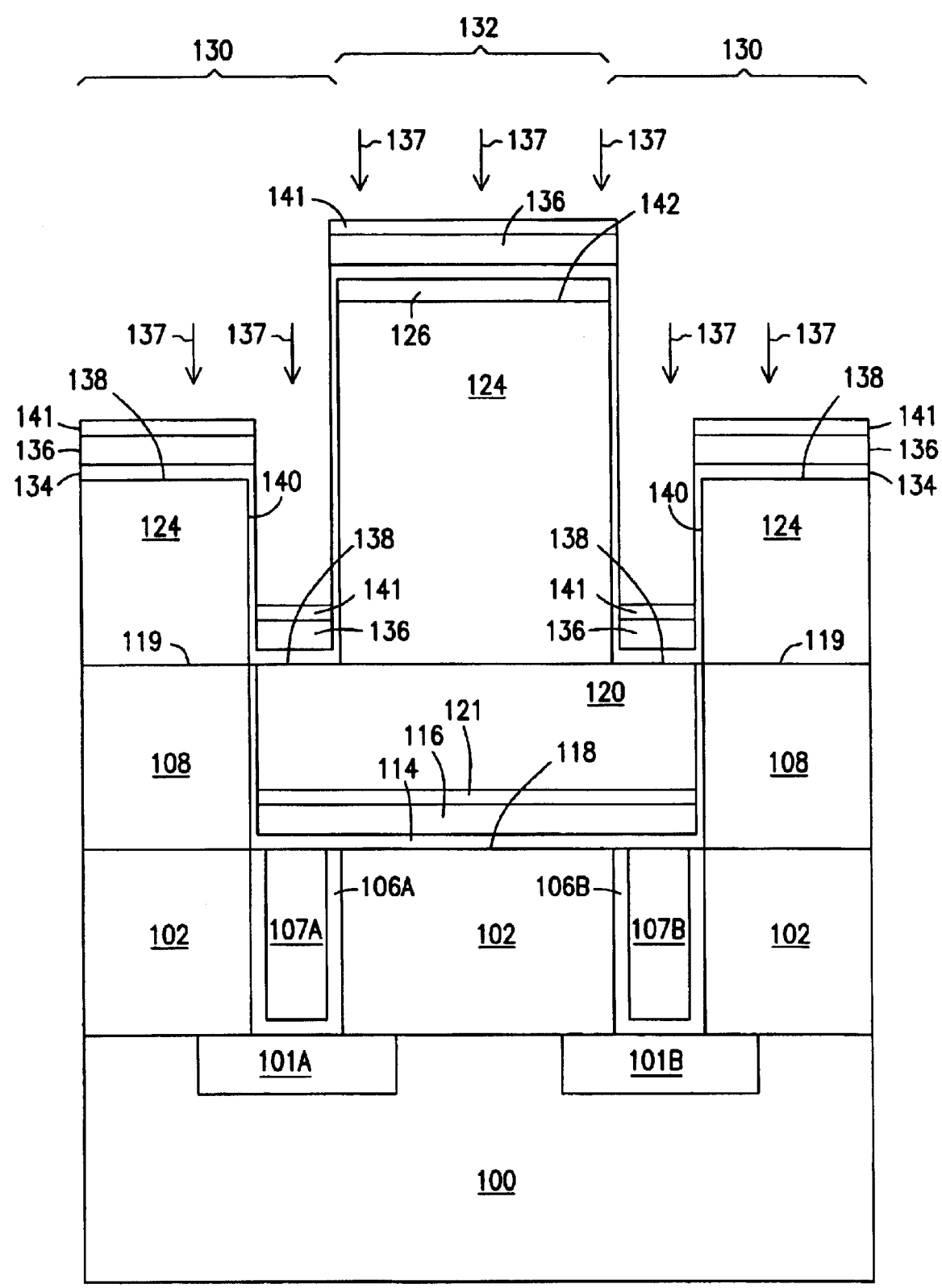

FIG. 1H illustrates the structure 100 after the next sequence of processing steps. In FIG. 1H, a second barrier/adhesion layer 134 is deposited in the second level of via openings 128 and a second level of metal line trenches 130 using a low energy ion implantation. As described above, in one embodiment according to the teachings of the present invention, depositing the second barrier/adhesion layer 134 includes depositing a layer of zirconium 134 having a thickness of approximately 5 to 100 Å. In alternate embodiments, depositing the second barrier/adhesion layer 134 includes depositing a barrier/adhesion layer 134 of titanium and/or hafnium. In one embodiment, depositing the layer of zirconium 134 includes depositing a layer of zirconium 134 having a thickness of approximately 50 Å. In one embodiment, this is achieved using a $10^{17}$ ion implant of zirconium. According to the teachings of the present invention, the layer of zirconium 134 is implanted at 100 electron volts (eV) into the surface of the second level of via openings 128 and a second level of metal line trenches 130 in the second polymer layer 124 using a varying angle, as shown by arrows 125, implant where the angle of implantation is changed from normal to the wafer surface to 15 degrees off normal. As one of ordinary skill in the art will understand upon reading this disclosure, using a varying angle implant, where an angle of implantation is changed from normal to the wafer surface to approximately 15 degrees off normal deposits the barrier/adhesion layer 134 on all surfaces in the second level of via openings 128 and a second level of metal line trenches 130. The structure is now as appears in FIG. 1H.

FIG. 1H illustrates the structure 100 after the next sequence of processing steps. In FIG. 1H, a second seed layer 136 is deposited on the second barrier/adhesion layer 134 using a low energy ion implantation. According to the broader teachings of the present invention, depositing the second seed layer 136 on the second barrier/adhesion layer 114 includes depositing a second seed layer 136 selected from the group consisting of aluminum, copper, silver, and gold. However, according to the teachings of the present embodiment, depositing the second seed layer 136 includes depositing a second layer of copper 136 having a thickness of approximately a 100 Å. In one embodiment, this is achieved using an $8 \times 10^{16}$ ion implant of copper. According to the teachings of the present invention, using a low energy ion implantation includes implanting the layer of copper 136 at 100 electron volts (eV) into the surfaces of the second level of via openings 128 and the polymer layer. Also the layer of copper 136 is implanted at an angle normal to the wafer's surface as shown by arrows 137. As one of ordinary skill in the art will understand upon reading this disclosure, implanting the layer of copper 136 at an angle normal to the planarized surface results in the second seed layer of copper 136 remaining on a bottom surface 138 in the second level of via openings 128 and second level of metal line trenches 130 and to a much lesser extent on the side surfaces 140 of the second level of via openings 128 and a second level of metal line trenches 130. In one embodiment, an optional layer of aluminum 141 is deposited over the second copper seed layer 136 again using a low energy ion implantation of 100 electron volts (eV). The optional layer of aluminum is deposited to have a thickness of approximately a 50 Å. In one embodiment, this is achieved using a $3 \times 10^{16}$ ion implant of aluminum normal to the wafer surface. As one of ordinary skill in the art will understand upon reading this disclosure, the layer of aluminum 141 is used to protect the second copper seed layer 136 from oxidation prior to subsequent processing steps.

Figure 1J:
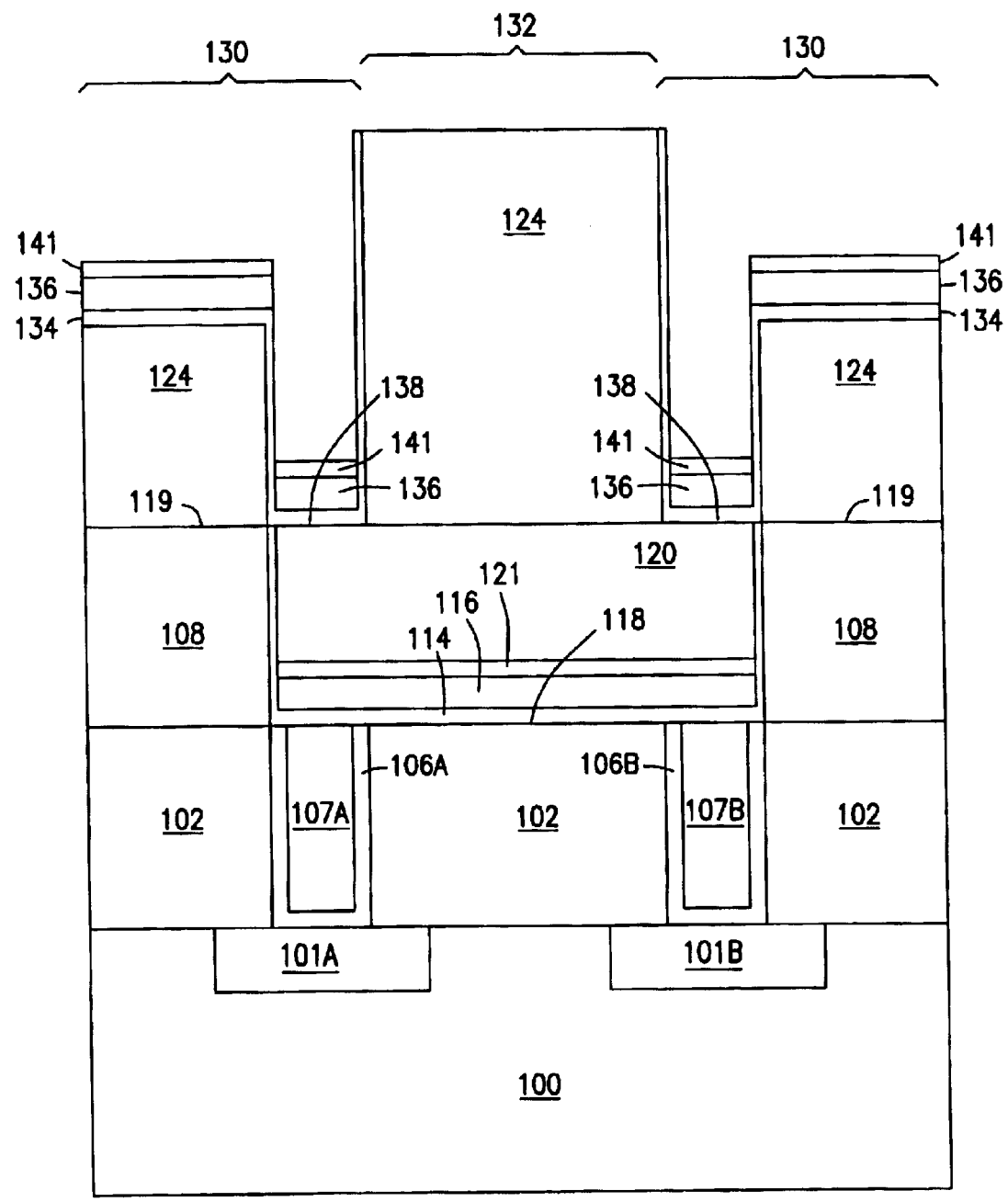

FIG. 1J illustrates the structure after the next sequence of processing steps. As one of ordinary skill in the art will understand upon reading this disclosure, the residual photoresist layer 126 has served as a blocking layer to define the implant areas for the second barrier/adhesion layer 134, the second seed layer 136, and the aluminum layer 141. The residual photoresist layer 126 is now removed using a wet strip process, as the same will be understood by one of ordinary skill in the art upon reading this disclosure. According to the teachings of the present invention, removing the residual photoresist layer 126 includes removing the unwanted aluminum layer 141, the unwanted seed layer 136, and the unwanted barrier/adhesion layer 134 from other areas of the wafer's surface, e.g. from over a number of regions 132 outside of second level of metal line trenches 130 on a top surface 142 of the second insulator layer 124. The structure is now as shown in FIG. 1J.

Figure 1K:
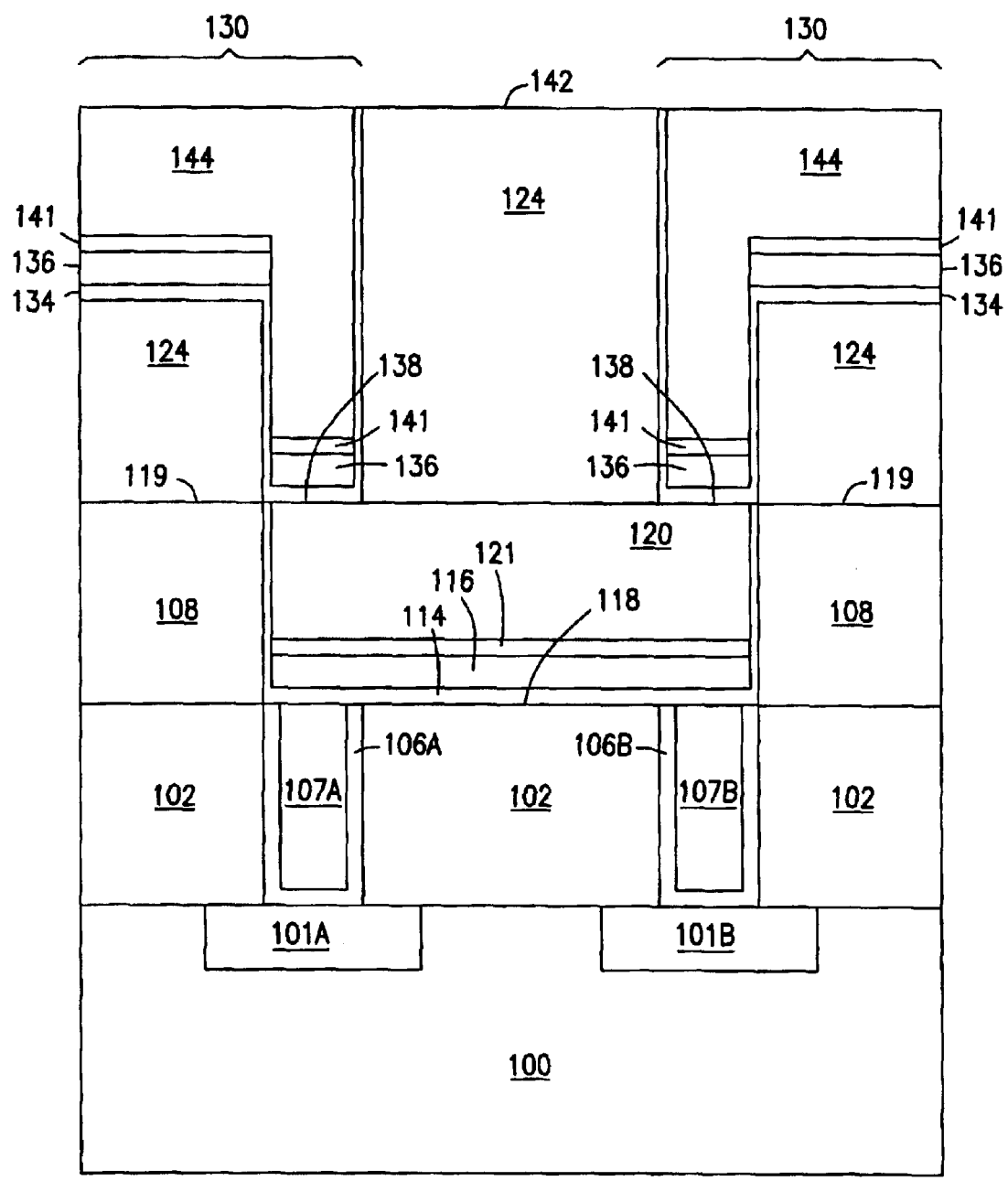

In FIG. 1K, a second metallic conductor 144, or second core conductor 144, is deposited over or formed on the second seed layer 136 and within the second barrier/adhesion layer 134 in the second level of via openings 128 and the second level of metal line trenches 130 in the polymer layer. In this embodiment the second metallic conductor 144, or second core conductor 144, is copper, but in other embodiments of the present invention can be selected from the group consisting of aluminum, silver, and gold. In one embodiment, the second metallic conductor 144, or second core conductor 144, is deposited using a selective CVD process such that the second metallic conductor 144, or second core conductor 144, is not formed on a top surface 142 of the second insulator layer 124. In another embodiment, depositing a second metallic conductor 144, or second core conductor 144, over on the second seed layer 136 and within the second barrier/adhesion layer 134 includes depositing a second metallic conductor 144, or second core conductor 144, using electroless plating. Electroless copper plating is used to deposit sufficient copper to fill the second level of via openings 128 and the second level of metal line trenches 130 to the top surface 142 of the second insulator layer 124. Thus, the second barrier/adhesion layer 134, the second seed layer 136, and the second metallic conductor 144, or second core conductor 144, constitute a second number of conductive structures which includes a number of second level vias and a number of second level metal lines which are formed over and connect to a first number of conductive structures, e.g. the first level metal lines 120.

Embodiment of a Metal Interconnect Using Aluminum Metal Lines and Oxide Insulators FIGS. 2A–2K illustrate a novel methodology for the formation of metal interconnects and/or a wiring structure in an integrated circuit according to the teachings of the present invention. The novel methodology includes the novel formation of a barrier/adhesion layer and a seed layer in an integrated circuit using a low energy ion implantation. The novel methodology also encompasses a novel method of making copper, silver, aluminum, or gold interconnect for an integrated circuit.

Figure 2A:
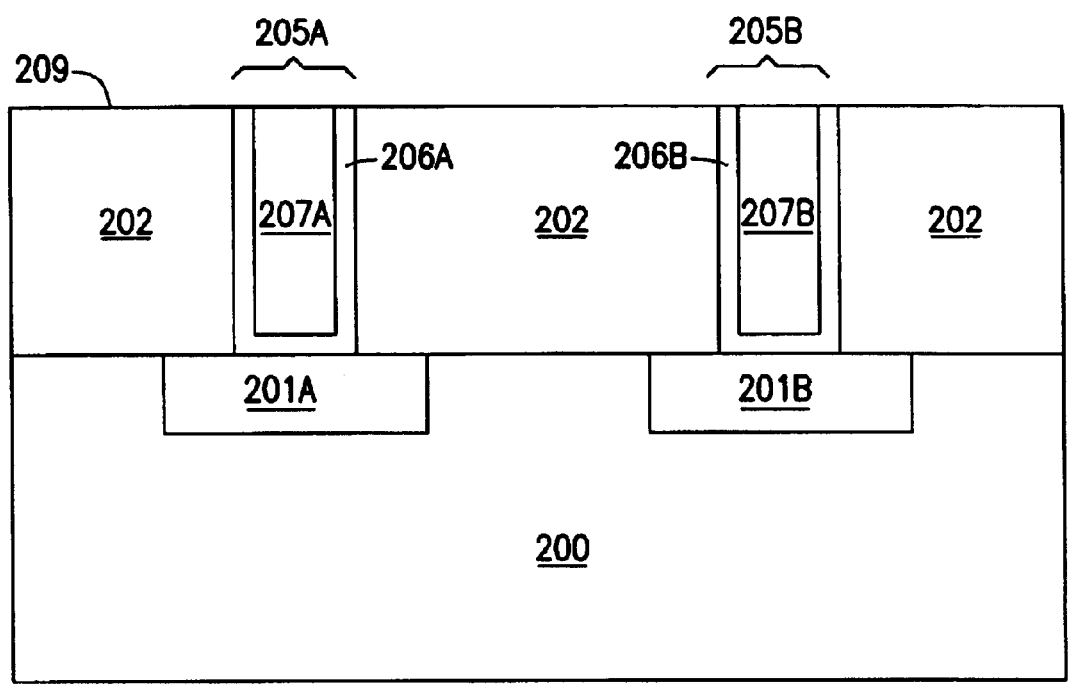

FIG. 2A illustrates a portion of an integrated circuit structure, namely an integrated circuit having a number of semiconductor devices formed in a substrate as described above in connection with FIG. 1A. That is, FIG. 2A illustrates the structure after a device structure is formed in the substrate and the contact structure to the device structure is in place. Like FIG. 1A, FIG. 2A illustrates the structure after a number of device structures, e.g. transistor 201A and 201B are formed in the substrate 200. An insulator layer 202 is deposited over the number of semiconductors 201A and 201B. The deposition of the insulator layer 202 can include depositing a layer of $Si_3N_4$ having a thickness in the range of 100 to 500 Angstroms (Å). This insulator layer will also serve as an additional barrier to impurities coming from subsequent processing steps. Contact holes 205A and 205B are opened to the number of device structures 201A and 201B using a photolithography technique. One of ordinary skill in the are will understand, upon reading this disclosure, the manner in which a photolithography technique can be used to create contact holes 205A and 205B. In one embodiment of the present invention a titanium silicide liner 206A and 206B is placed in the contact holes 205A and 205B, such a through a process such as chemical vapor deposition (CVD). Next, tungsten vias 207A and 207B can be deposited in the contact holes 205A and 205B. The tungsten vias 207A and 207B can be deposited in the contact holes using any suitable technique such as using a CVD process. The excess tungsten is then removed from the wafer surface by chemical mechanical planarization (CMP) or other suitable processes to form a planarized surface 209.

Figure 2B:
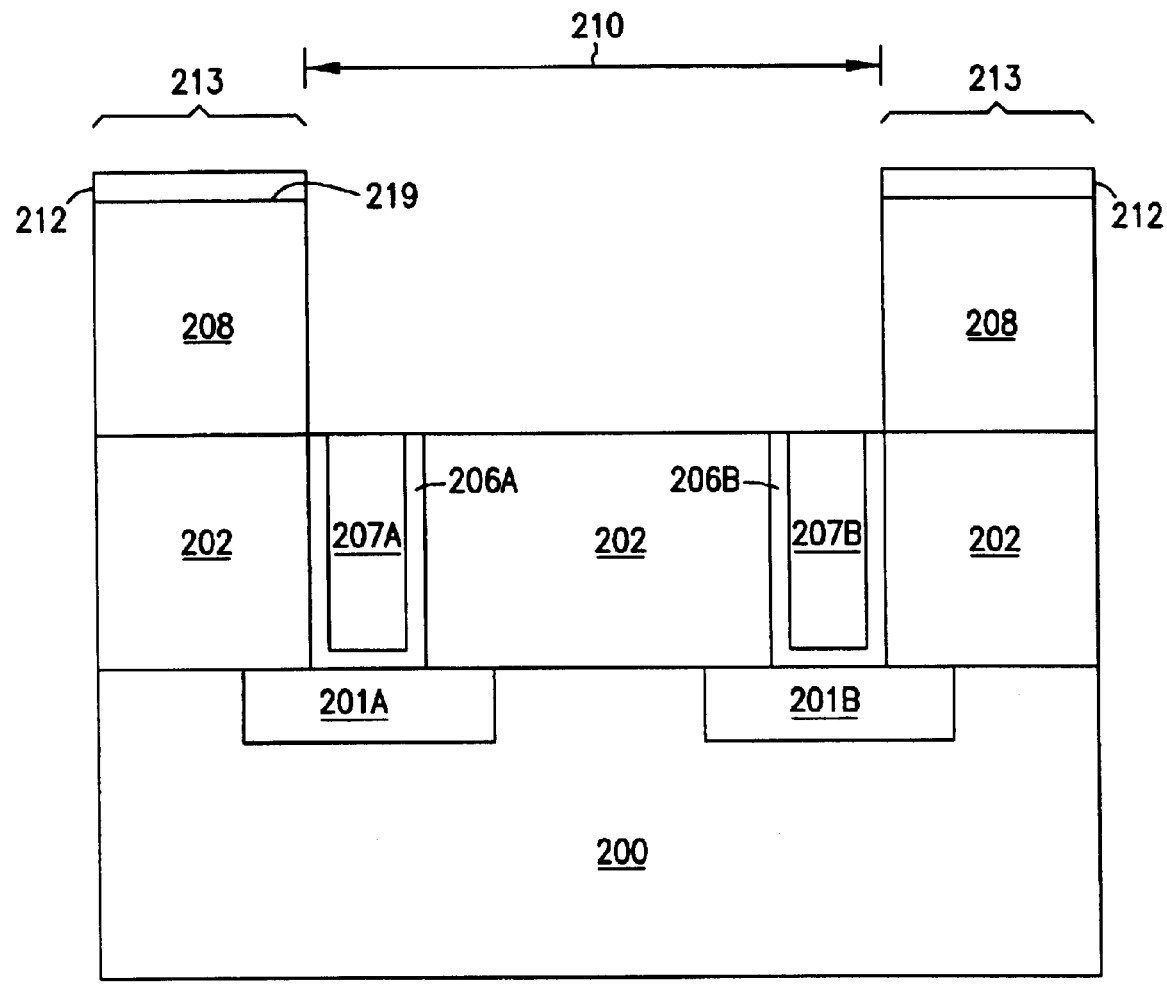

As shown in FIG. 2B, a first oxide layer 208, e.g. a silicon dioxide layer ($SiO_2$), is deposited over the wafer surface. In one embodiment, depositing a first oxide layer 208 includes depositing a fluorinated silicon oxide layer 208. The first oxide layer 208 may be deposited using any suitable technique, such as, for example, using a CVD process. In one embodiment, depositing a first oxide layer 208 having a thickness of approximately 5000 Å. As one of ordinary skill in the art will understand, upon reading this disclosure, other suitable thicknesses for the first oxide layer 208 may also be deposited as suited for forming a first level metal pattern, the invention is not so limited. The first oxide layer 208 is patterned to define a number of trenches 210 in the first oxide layer 208 opening to a number of first level vias, e.g. tungsten vias 207A and 207B in planarized surface 209. In other words, a first level metal pattern 210 is defined in a mask layer of photoresist 212 and then the first oxide layer 208 is etched, using any suitable process, e.g. reactive ion etching (RIE), such that the first level metal pattern 210 is defined in the first oxide layer 208. One of ordinary skill in the art will understand upon reading this disclosure that any desired first level metal pattern 210 can be created using a photolithography technique. According to the teachings of the present invention, a residual photoresist layer 212 is left in place on the first oxide layer 208 in a number of region 213 outside of the number trenches 210. The structure is now as appears in FIG. 2B.

Figure 2C:
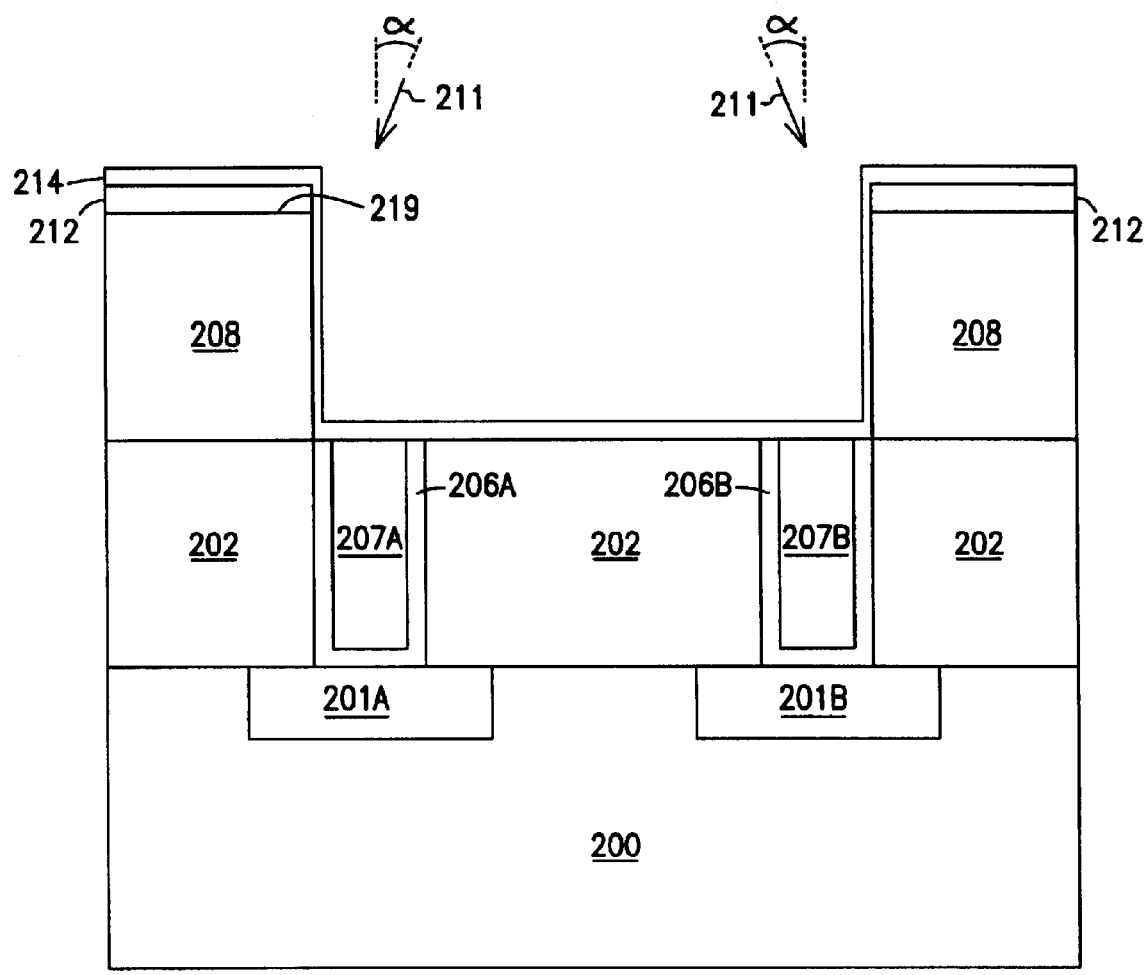

As shown in FIG. 2C, a first barrier/adhesion layer 214 is deposited in the number of trenches 210 using a low energy ion implantation. In one embodiment according to the teachings of the present invention, depositing the barrier/adhesion layer 214 includes depositing a layer of zirconium 214 having a thickness of approximately 5 to 100 Å. In alternate embodiments, depositing the barrier/adhesion layer 214 includes depositing a barrier/adhesion layer 214 of titanium and/or hafnium. In one embodiment, depositing the depositing a layer of zirconium 214 includes depositing a layer of zirconium 214 having a thickness of approximately 50 Å. This can be achieved using a $10^{17}$ ion implant of zirconium. According to the teachings of the present invention, the layer of zirconium 214 is implanted at 100 electron volts (eV) into the surface of the trenches 210 in the first oxide layer 208 using a varying angle implant ($\propto$), as represented by arrows 211, where the angle of implantation is changed from normal to the wafer surface to 15 degrees off normal. As one of ordinary skill in the art will understand upon reading this disclosure, using a varying angle implant, where an angle of implantation ($\propto$) is changed from normal to the wafer's surface to approximately 15 degrees off normal deposits the barrier/adhesion layer 214 on all surfaces in the number of trenches 210. The structure is now as appears in FIG. 2C.

Figure 2D:
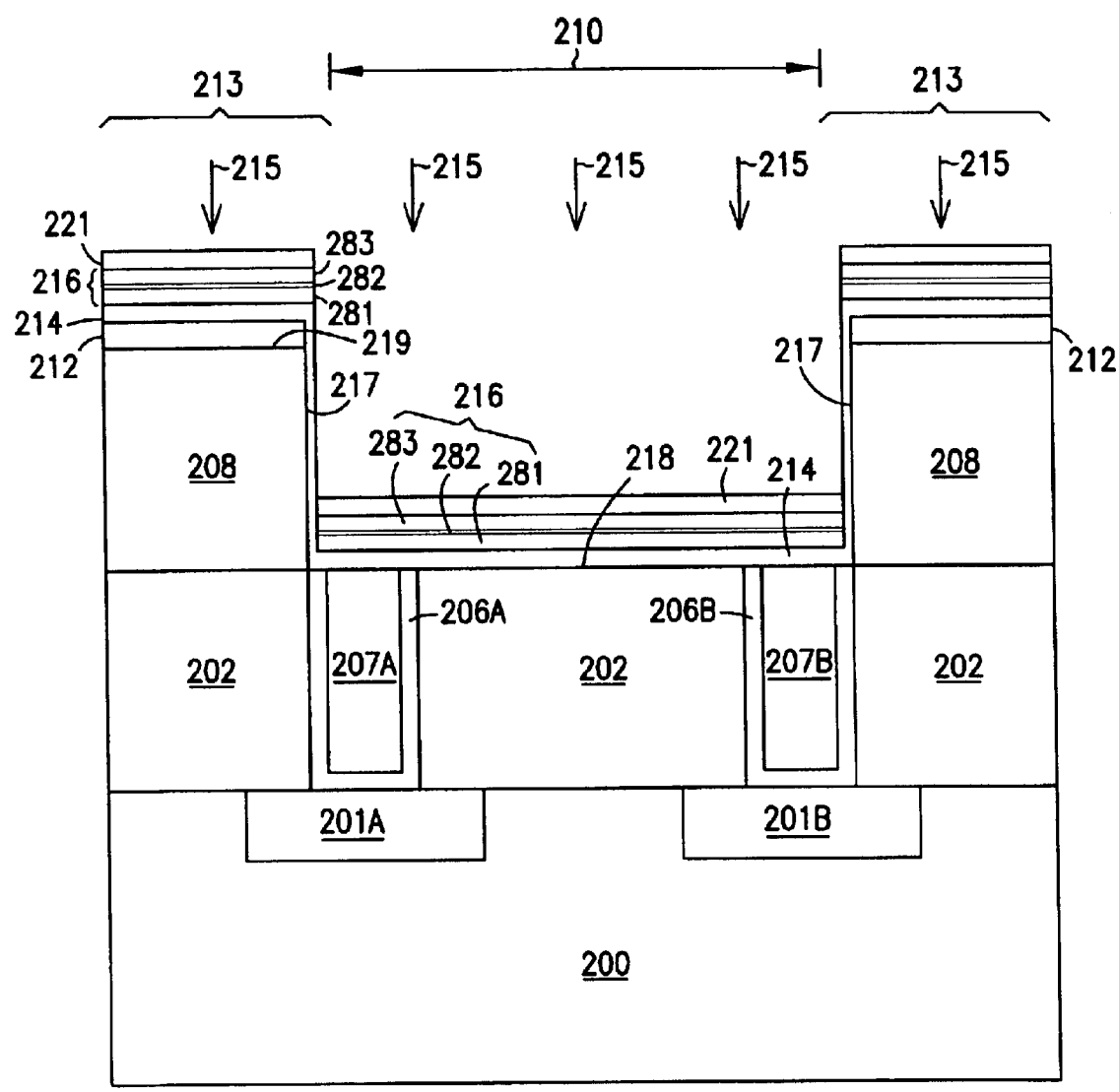

In FIG. 2D, a first seed layer 216 is deposited on the first barrier/adhesion layer 214 using a low energy ion implantation. According to the broader teachings of the present invention, depositing the seed layer 216 on the barrier/adhesion layer 214 includes depositing a first seed layer 216 selected from the group consisting of aluminum, copper, silver, and gold. However, according to the teachings of the present embodiment, depositing the seed layer 216 includes depositing a layer of an aluminum copper alloy 216 having a thickness of approximately 110 Å. This can be achieved by depositing a first layer of aluminum 281 on the barrier/adhesion layer 214 to a thickness of approximately 50 Å using a low energy ion implantation of approximately 100 electron volts (eV). A layer of copper 282 is then deposited on the first layer of aluminum 281 to a thickness of approximately 10 Å using a low energy ion implantation of approximately 100 eV. A second layer of aluminum 283 is then deposited on the layer of copper 282 to a thickness of approximately 50 Å using a low energy ion implantation of approximately 100 eV. Also the first seed layer 216 is implanted at an angle normal to the planarized surface, as shown by arrows 215. As one of ordinary skill in the art will understand upon reading this disclosure, implanting the first seed layer 216 at an angle normal to the planarized surface results in the first seed layer 216 remaining on a bottom surface 218 in the number of trenches 210 and to a much lesser extent on the side surfaces 217 of the number of trenches 210. In one embodiment, an optional metal layer 221 is deposited over the seed layer 216.

Figure 2E:
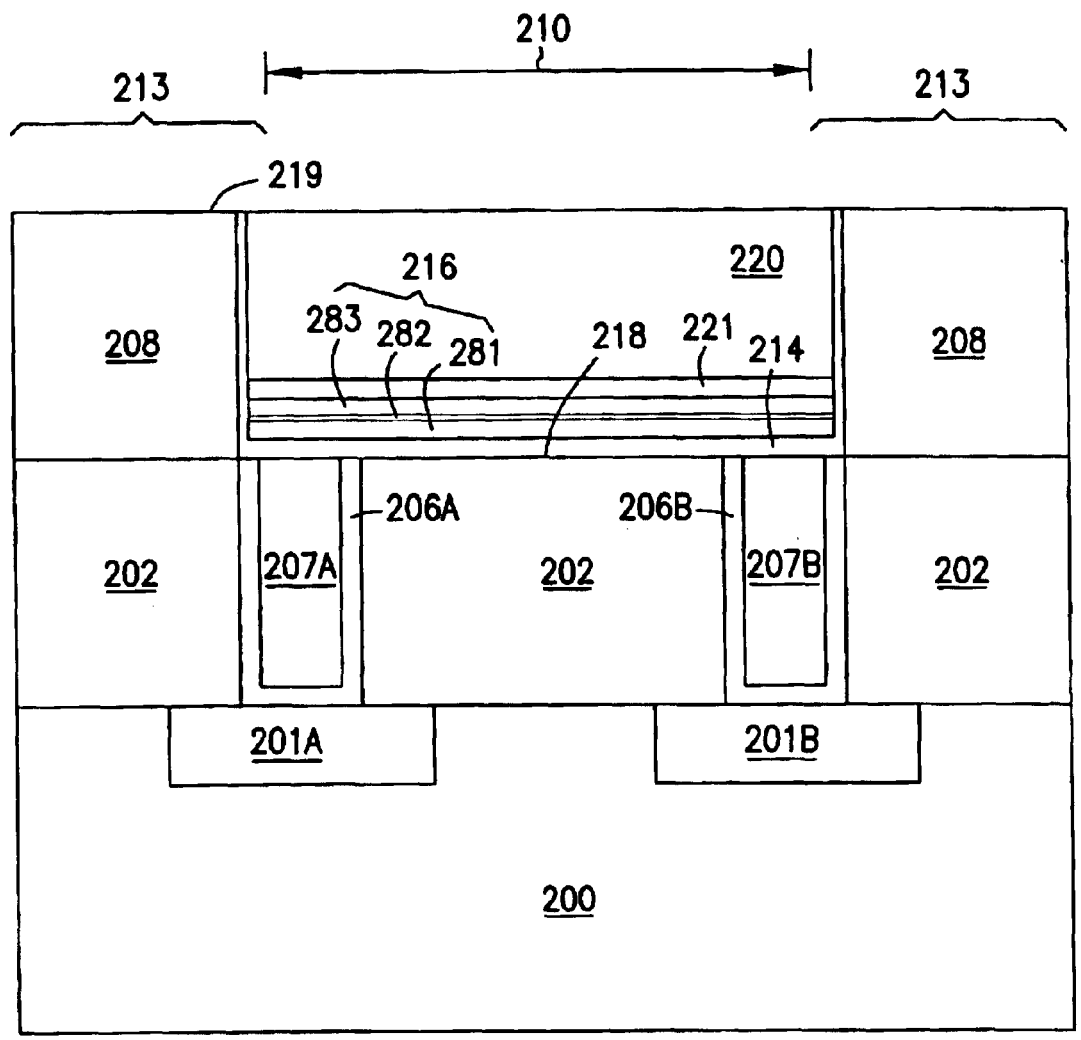

FIG. 2E illustrates the structure after the next sequence of processing steps. As one of ordinary skill in the art will understand upon reading this disclosure, the residual photoresist layer 212 has served as a blocking layer to define the implant areas for the barrier/adhesion layer 214 and the seed layer 216. The residual photoresist layer 212 is now removed using a wet strip process, as the same will be understood by one of ordinary skill in the art upon reading this disclosure. According to the teachings of the present invention, removing the residual photoresist layer 212 includes removing the unwanted seed layer 216 and the unwanted barrier/adhesion layer 214 from other areas of the wafer's surface, e.g. from over a number of regions 213 outside of the trenches 210 on a top surface 219 of the first insulator layer 208. The structure is now as shown in FIG. 2E.

Figure 2F:
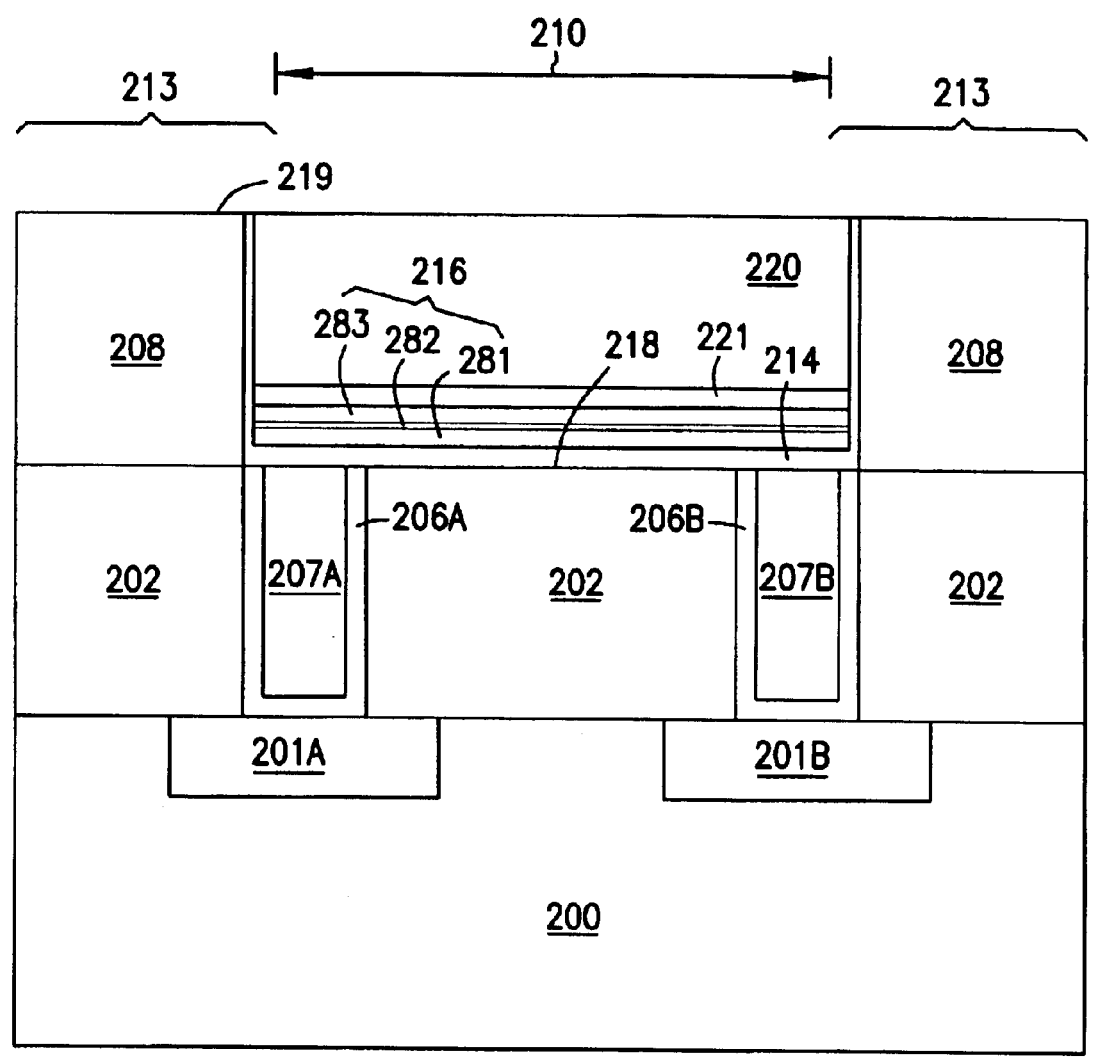

In FIG. 2F, a metallic conductor 220, or number of first level metal lines 220, is deposited over the first seed layer 216 and within the first barrier/adhesion layer 214 in the number of trenches 210. In this embodiment, the metallic conductor 220, or number of first level metal lines 220, is aluminum, but in other embodiments of the present invention the metallic conductor 220, or number of first level metal lines 220, is selected from the group consisting of copper, silver, and gold depending on the type of seed layer 216 which was deposited. In one embodiment, the metallic conductor 220, or number of first level metal lines 220, is deposited using a selective CVD process. In another embodiment, depositing a metallic conductor 220, or number of first level metal lines 220, over the seed layer 216 includes depositing a metallic conductor 220 using electroless plating. According to the teachings of the present invention the number of first level aluminum metal lines 220, is deposited to fill the number of trenches 210 to the top surface 219 of the first oxide layer 208. Thus, the first level aluminum metal lines 220, the first seed layer 216, and the first barrier/adhesion layer 214 in the number of trenches 210 constitute a first number of conductive structures. The copper composition of the first seed layer 216 can be adjusted to give the appropriate percentage of copper in the completed first number of conductive structures. For example, in the above described embodiment the layer thicknesses of the aluminum copper sandwich was designed to give a 0.7 weight percent of copper in the first number of conductive structures.

Figure 2G:
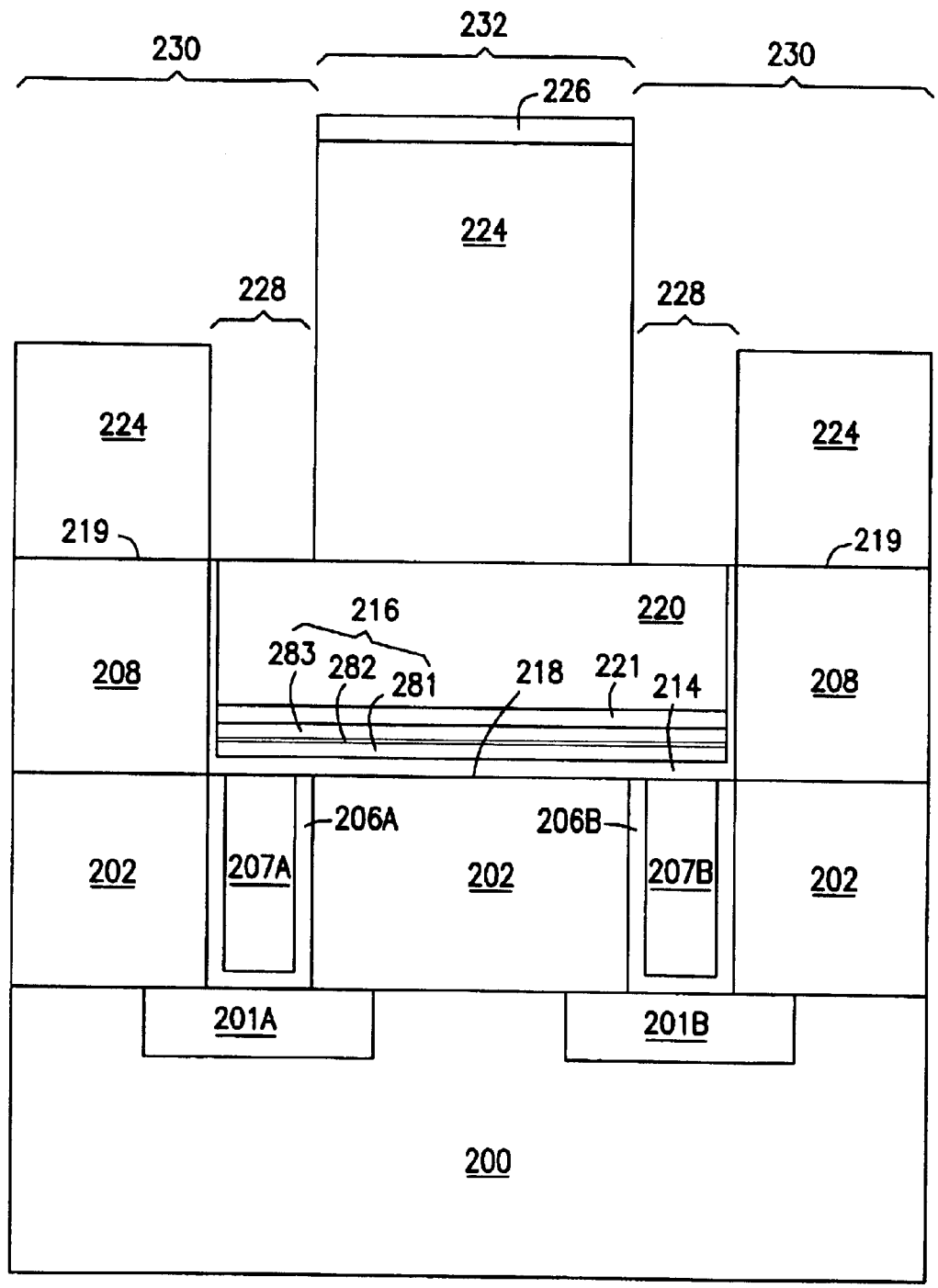

As shown in FIG. 2G, the process sequence may be continued to form any number of subsequent metal layers in a multilayer wiring structure. FIG. 2G illustrates the structure after the next sequence of processing steps. In FIG. 2G, a dual damascene process is used to define and fill a first to a second level of vias and a second level metallurgy. To do so, a second oxide layer 224 is deposited over the wafer surface, e.g. the metallic conductor 220, or number of first level metal lines 220, and the first oxide layer 208. In one embodiment, depositing a second oxide layer 224 includes depositing a second fluorinated silicon oxide layer 224. In one embodiment, the second oxide layer 224 is formed to have a thickness of approximately 10,000 Å. As one of ordinary skill in the art will understand, upon reading this disclosure, other suitable thickness for the second oxide layer 224 may also be deposited as suited for forming a first to a second level of vias, e.g. second level vias, and a number of second level metal lines, the invention is not so limited. The second oxide layer 224 is patterned to define a second level of vias and a number of second level metal lines in the second oxide layer 224 opening to the metallic conductor 220, or number of first level metal lines 220. In other words, a second level of vias is defined in a second mask layer of photoresist 226 and then the second oxide layer 224 is etched, using any suitable process, e.g. reactive ion etching (RIE), such that a second level of via openings 228 are defined in the polyimide. Using the dual damascene process, a number of second level metal lines are also defined in a second mask layer of photoresist 226 and the second oxide layer 224 is again etched, using any suitable process, e.g. reactive ion etching (RIE), such that a second level of metal line trenches 230 are defined in the second oxide layer 224. One of ordinary skill in the art will understand upon reading this disclosure, the manner in which a photoresist layer 226 can be mask, exposed, and developed using a dual damascene process to pattern a second level of via openings 228 and a second level of metal line trenches 230 in the second oxide layer 224.

As described previously, and according to the teachings of the present invention, a residual photoresist layer 226 is left in place on the second oxide layer 224 in a number of regions 232 outside of the second level of metal line trenches 230. A suitable plasma and/or wet cleaning process is used to remove any contaminates from the second level of via openings 228 and a second level of metal line trenches 230, as the same will be understood by one of ordinary skill in the art upon reading this disclosure. The structure is now as appears in FIG. 2G.

Figure 2H:
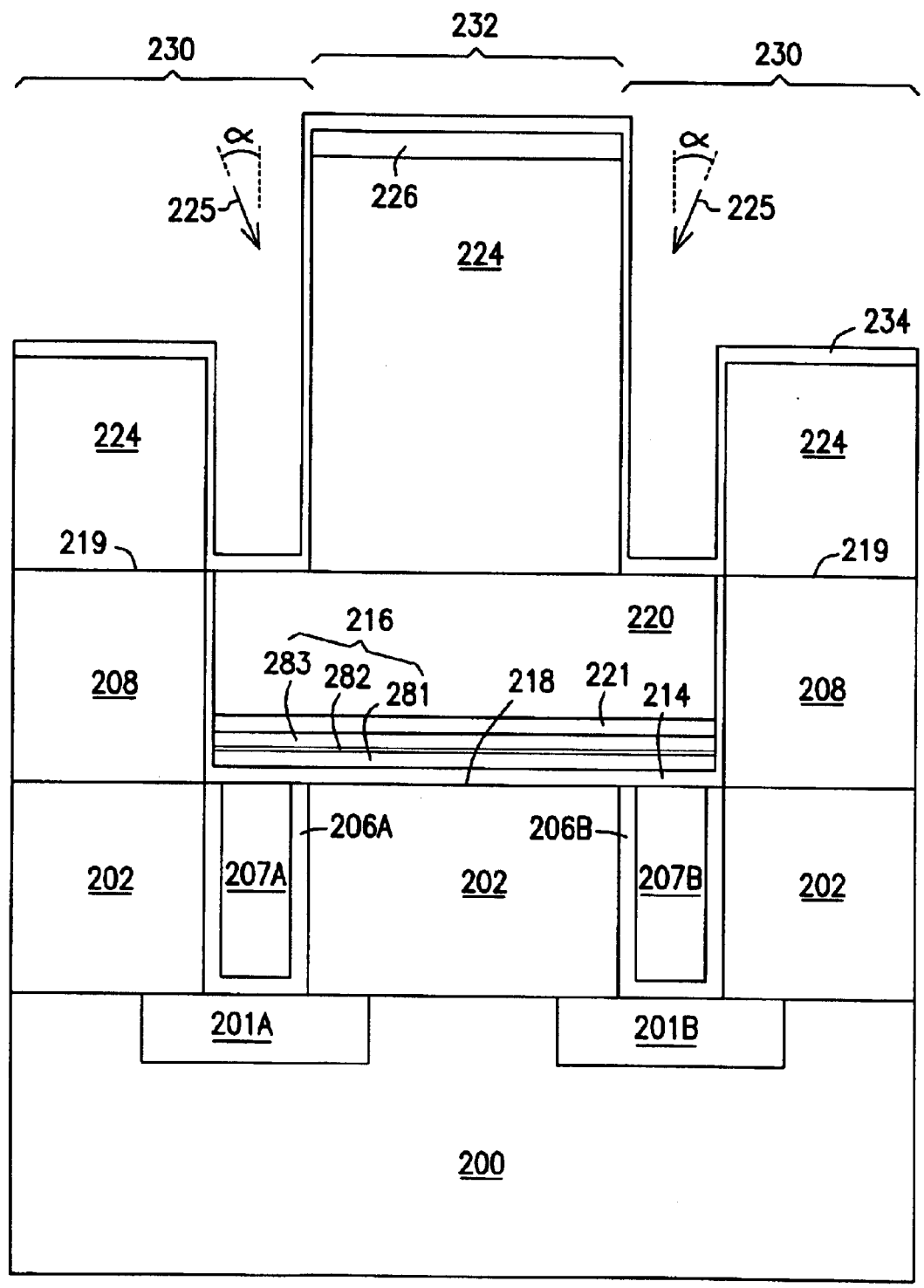
Figure 21:
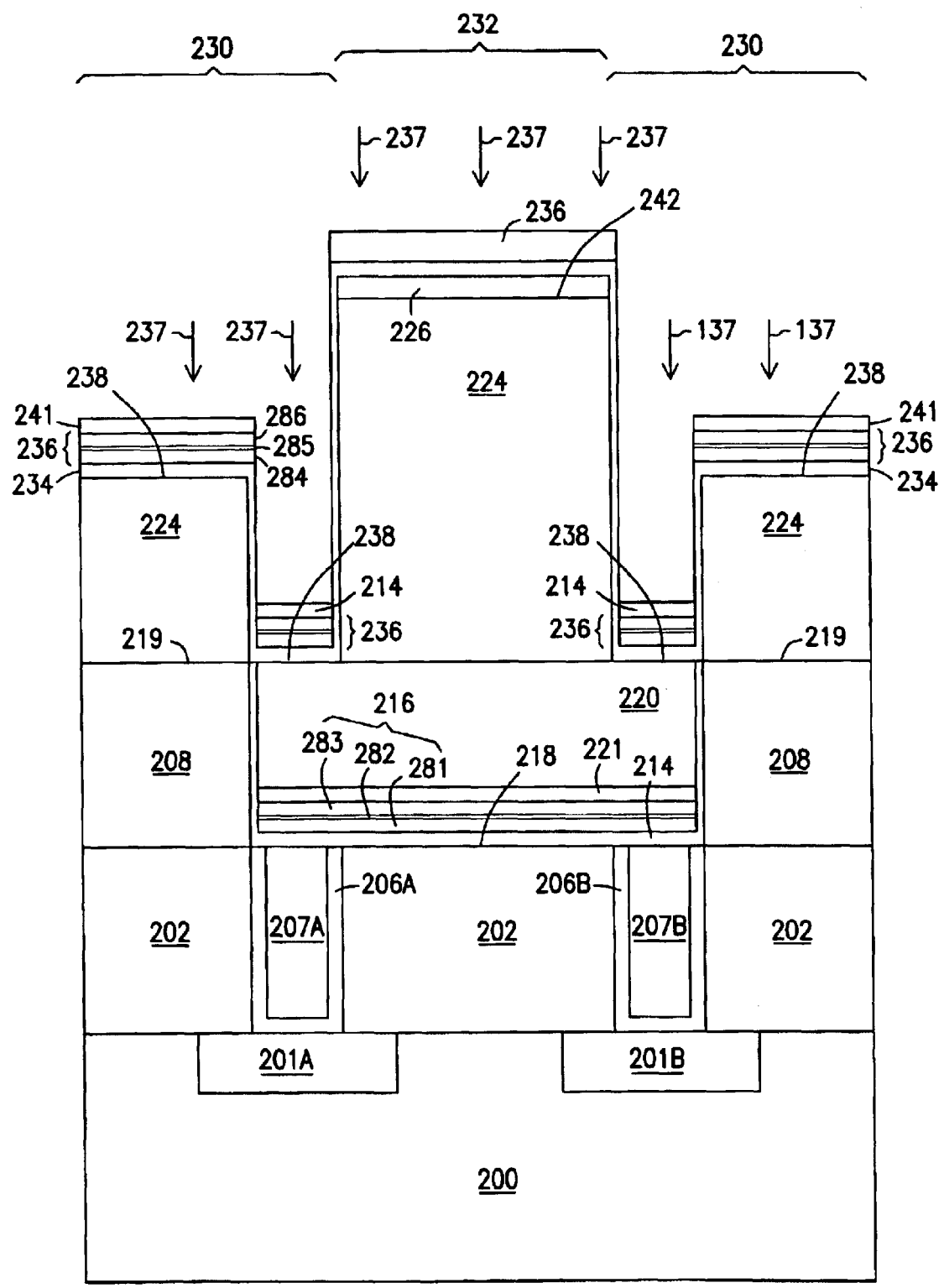

FIG. 2H illustrates the structure after the next sequence of processing steps. In FIG. 2H, a second barrier/adhesion layer 234 is deposited in the second level of via openings 228 and a second level of metal line trenches 230 using a low energy ion implantation. As described above, in one embodiment according to the teachings of the present invention, depositing the second barrier/adhesion layer 234 includes depositing a layer of zirconium 234 having a thickness of approximately 5 to 100 Å. In alternate embodiments, depositing the second barrier/adhesion layer 234 includes depositing a barrier/adhesion layer 234 of titanium and/or hafnium. In one embodiment, depositing the layer of zirconium 234 includes depositing a layer of zirconium 234 having a thickness of approximately 50 Å. In one embodiment, this is achieved using a $10^{17}$ ion implant of zirconium (that is $10^{17}$ ions per square centimeter). According to the teachings of the present invention, the layer of zirconium 234 is implanted at 100 electron volts (eV) into the surface of the second level of via openings 228 and a second level of metal line trenches 230 in the second polymer layer 224 using a varying angle implant ($\propto$), as shown by arrows 225 where the angle of implantation is changed from normal to the wafer surface to 15 degrees off normal. As one of ordinary skill in the art will understand upon reading this disclosure, using a varying angle implant, where an angle of implantation, $\propto$, is changed from normal to the wafer surface to approximately 15 degrees off normal deposits the barrier/adhesion layer 234 on all surfaces in the second level of via openings 228 and a second level of metal line trenches 230. The structure is now as appears in FIG. 2H.

FIG. 2I illustrates the structure after the next sequence of processing steps. In FIG. 2I, a second seed layer 236 is deposited on the second barrier/adhesion layer 234 using a low energy ion implantation. According to the broader teachings of the present invention, depositing the second seed layer 236 on the second barrier/adhesion layer 214 includes depositing a second seed layer 236 selected from the group consisting of aluminum, copper, silver, and gold. However, according to the teachings of the present embodiment, depositing the seed layer 216 includes depositing a layer of an aluminum copper alloy 216 having a thickness of approximately 110 Å. This can be achieved by depositing a first layer of aluminum 284 on the barrier/adhesion layer 214 to a thickness of approximately 50 Å using a low energy ion implantation of approximately 100 electron volts (eV). A layer of copper 285 is then deposited on the first layer of aluminum 284 to a thickness of approximately 10 Å using a low energy ion implantation of approximately 100 eV. A second layer of aluminum 286 is then deposited on the layer of copper 285 to a thickness of approximately 50 Å using a low energy ion implantation of approximately 100 eV. Also the first seed layer 216 is implanted at an angle normal to the wafer's surface as shown by arrows 237. As one of ordinary skill in the art will understand upon reading this disclosure, implanting the layer of copper 236 at an angle normal to the planarized surface results in the second seed layer of copper 236 remaining on a bottom surface 238 in the second level of via openings 228 and to a much lesser extent on the side surfaces 240 of the second level of via openings 228 and a second level of metal line trenches 230.

Figure 2J:
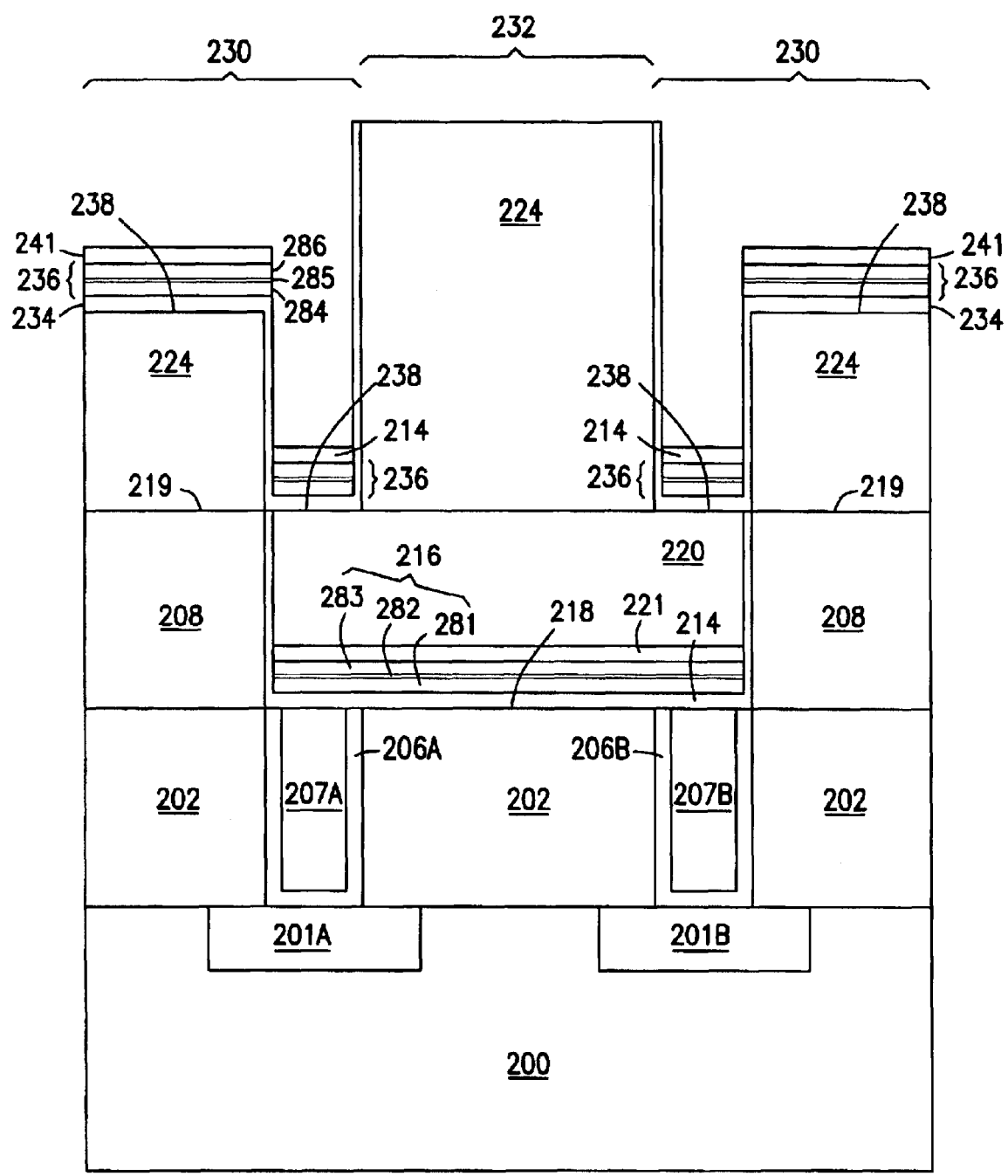

FIG. 2J illustrates the structure following the next sequence of process steps. As one of ordinary skill in the art will understand upon reading this disclosure, the residual photoresist layer 226 has served as a blocking layer to define the implant areas for the second barrier/adhesion layer 234 and the second seed layer 236. The residual photoresist layer 226 is now removed using a wet strip process, as the same will be understood by one of ordinary skill in the art upon reading this disclosure. According to the teachings of the present invention, removing the residual photoresist layer 226 includes removing the unwanted barrier/adhesion layer 234 and the unwanted second seed layer 236, from other areas of the wafer's surface, e.g. from over a number of regions 232 outside of second level of metal line trenches 230 on a top surface 242 of the second oxide layer 224. The structure is now as shown in FIG. 2J.

Figure 2K:
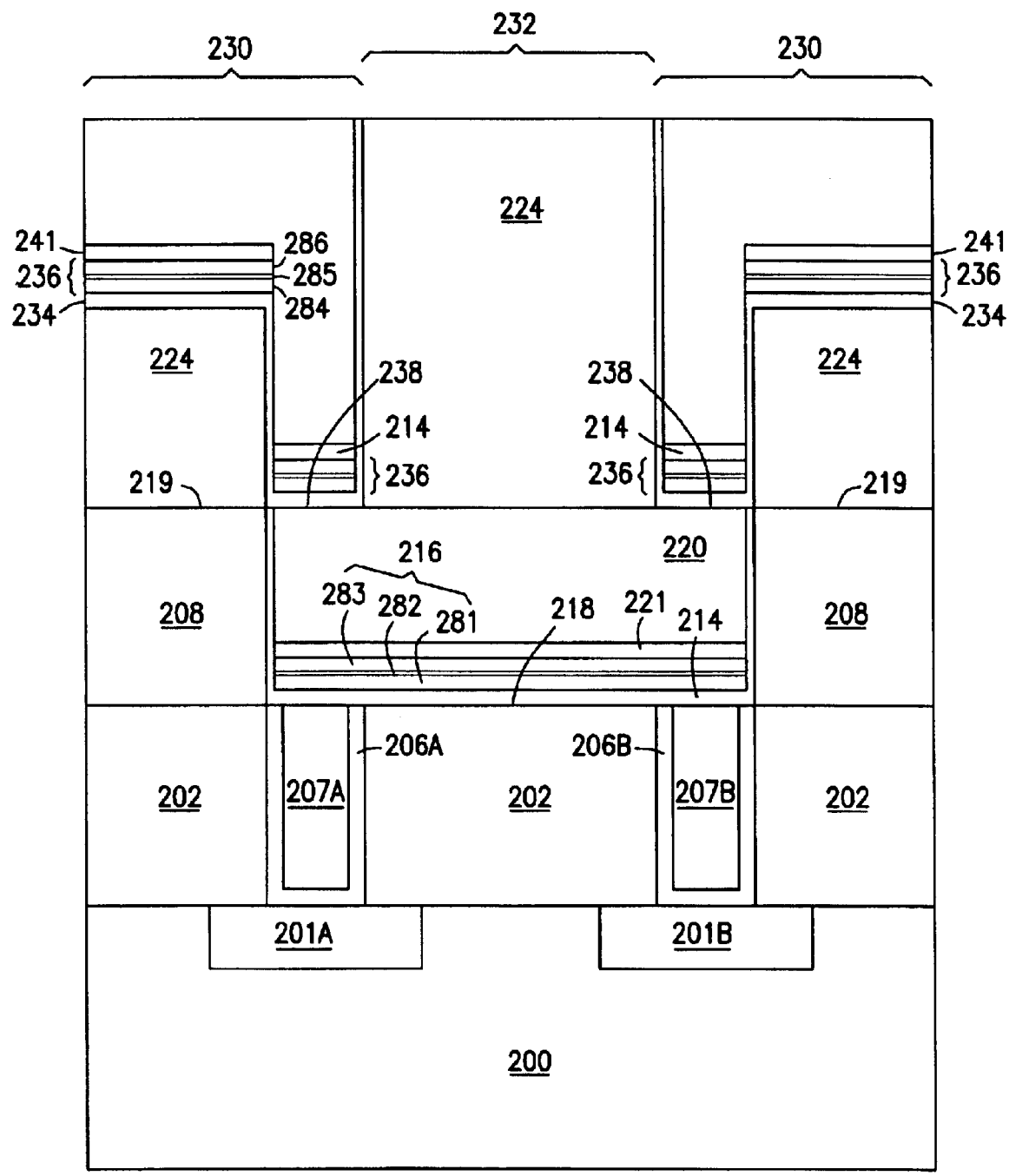

In FIG. 2K, a second metallic conductor 244, or second core conductor 244, is deposited over or formed on the second seed layer 236 and within the second barrier/adhesion layer 234 in the second level of via openings 228 and the second level of metal line trenches 230 in the polymer layer. In this embodiment the second metallic conductor 244, or second core conductor 244, is aluminum, but in other embodiments of the present invention the second metallic conductor 244, or second core conductor 244, can be selected from the group consisting of copper, silver, and gold. In one embodiment, the second metallic conductor 244, or second core conductor 244, is deposited using a selective CVD process. In another embodiment, depositing a second metallic conductor 244, or second core conductor 244, over on the second seed layer 236 and within the second barrier/adhesion layer 234 includes depositing a second metallic conductor 244, or second core conductor 244, using electroless plating. The second aluminum conductor 244, or second core conductor 244 is deposited to fill the second level of via openings 228 and the second level of metal line trenches 230 to the top surface 242 of the second insulator layer 224. Thus, the second barrier/adhesion layer 234, the second seed layer 236, and the second metallic conductor 244, or second core conductor 244, constitute a second number of conductive structures which includes a number of second level vias and a number of second level metal lines which are formed over and connect to a first number of conductive structures, e.g. the first level of vias 207A and 207B.

Embodiment of a Metal Interconnect Using Copper Metal Lines and Oxide Insulators FIGS. 3A–3K illustrate a novel methodology for the formation of metal interconnects and/or a wiring structure in an integrated circuit according to the teachings of the present invention. The novel methodology includes the novel formation of a barrier/adhesion layer and a seed layer in an integrated circuit using a low energy ion implantation. The novel methodology also encompasses a novel method of making copper, silver, aluminum, or gold interconnect for an integrated circuit.

Figure 3A:
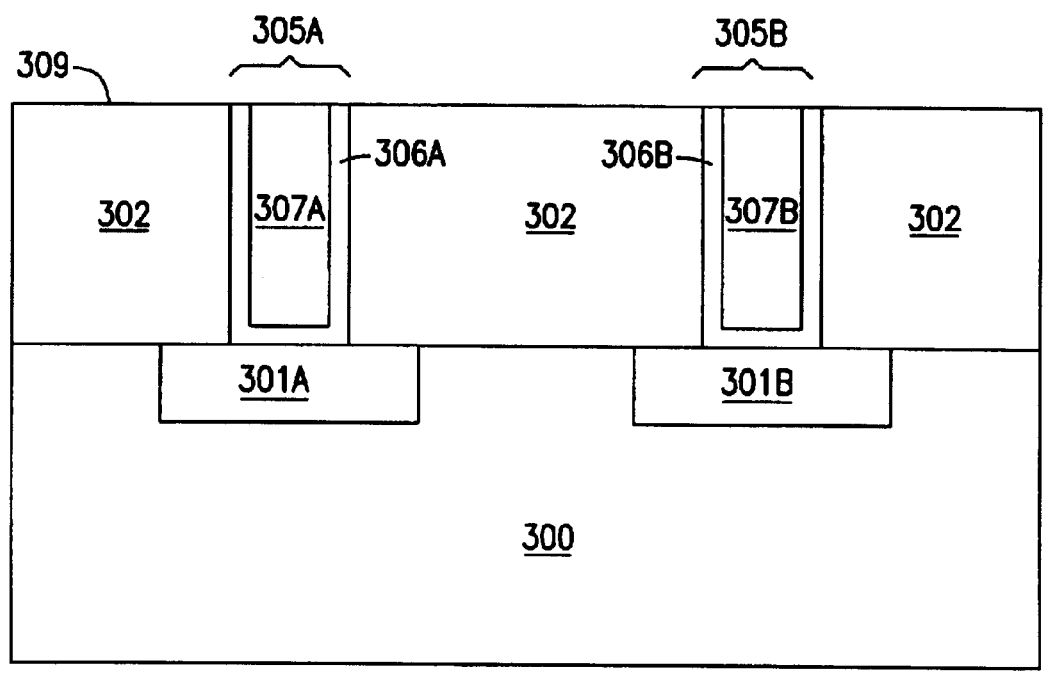

FIG. 3A illustrates a portion of an integrated circuit structure, namely an integrated circuit having a number of semiconductor devices formed in a substrate. FIG. 3 illustrates the structure after a device structure is formed in the substrate and the contact structure to the device structure is in place. One of ordinary skill in the art will understand upon reading this disclosure the manner in which a number of semiconductor structures, e.g. transistors, can be formed in a substrate. One of ordinary skill in the art will also understand upon reading this disclosure the manner in which a contact structure can be formed connecting to a given semiconductor device in a substrate, such as explained in connection with FIG. 1A. For example, FIG. 3A illustrates the structure after a number of device structures, e.g. transistor 301A and 301B are formed in the substrate 300. An insulator layer 302 is deposited over the number of semiconductors 301A and 301B. The deposition of the insulator layer 302 can include depositing a layer of $Si_3N_4$ having a thickness in the range of 100 to 500 Angstroms (Å). This insulator layer will also serve as an additional barrier to impurities coming from subsequent processing steps. Contact holes 305A and 305B are opened to the number of device structures 301A and 301B using a photolithography technique. One of ordinary skill in the are will understand, upon reading this disclosure, the manner in which a photolithography technique can be used to create contact holes 305A and 305B. In one embodiment of the present invention a titanium silicide liner 306A and 306B is placed in the contact holes 305A and 305B, such a through a process such as chemical vapor deposition (CVD). Next, tungsten vias 307A and 307B can be deposited in the contact holes 305A and 305B. The tungsten vias 307A and 307B can be deposited in the contact holes using any suitable technique such as using a CVD process. The excess tungsten is then removed from the wafer surface by chemical mechanical planarization (CMP) or other suitable processes to form a planarized surface 309.

Figure 3B:
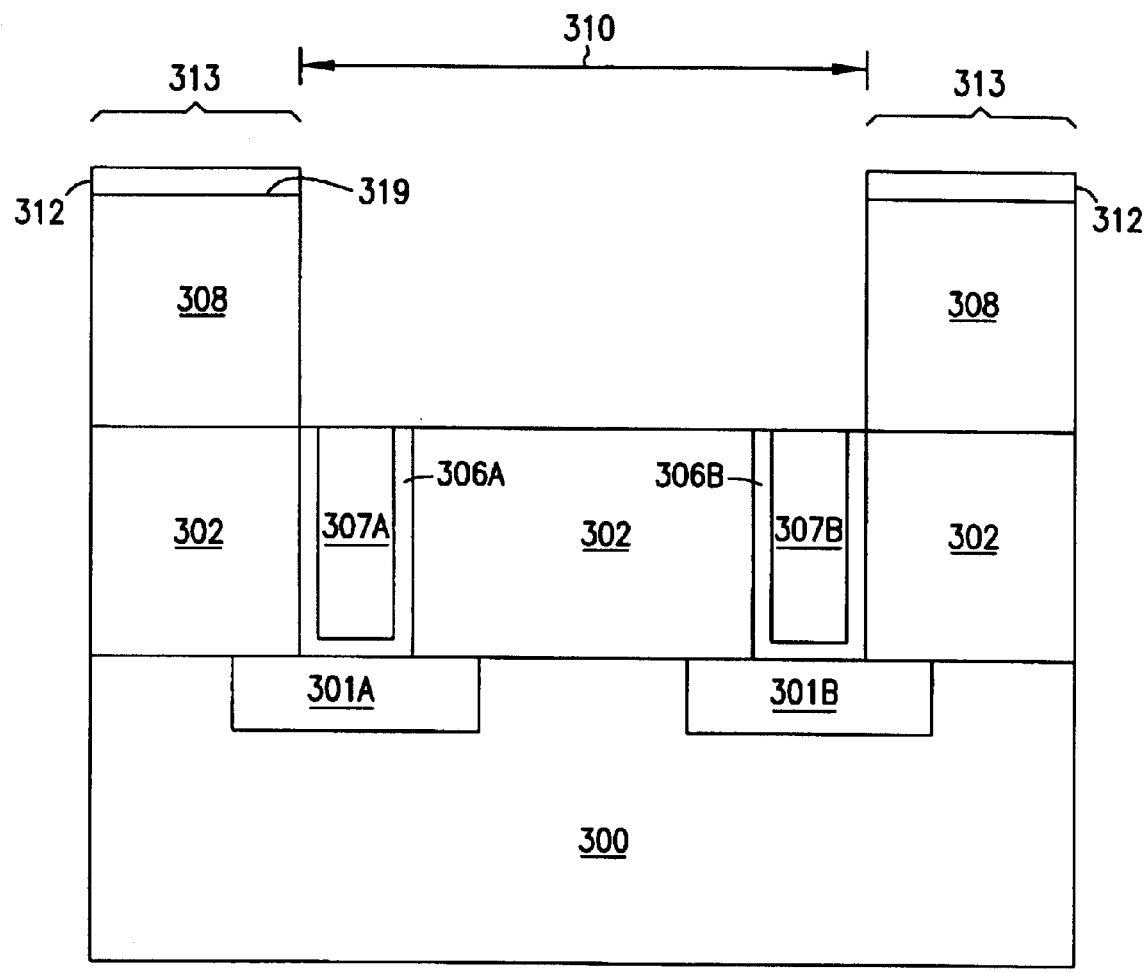

As shown in FIG. 3B, a first polymer layer 308, or first layer of polyimide 308, is deposited over the wafer surface. The first oxide layer 308 may be deposited using any suitable technique such as, for example, a CVD process. In one embodiment, depositing a first oxide layer 308 includes depositing a fluorinated silicon oxide layer 308. In one embodiment, the first oxide layer 308 is deposited to have a thickness of approximately 5000 Å. As one of ordinary skill in the art will understand, upon reading this disclosure, other suitable thickness for the first oxide layer 308 may also be deposited as suited for forming a first level metal pattern, the invention is not so limited. The first oxide layer 308 is patterned to define a number of trenches 310 in the first oxide layer 308 opening to a number of first level vias, e.g. tungsten vias 307A and 307B in planarized surface 309. In other words, a first level metal pattern 310 is defined in a mask layer of photoresist 312 and then the first oxide layer 308 is etched, using any suitable process, e.g. reactive ion etching (RIE), such that the first level metal pattern 310 is defined in the first oxide layer 308. According to the teachings of the present invention, a residual photoresist layer 312 is left in place on the first oxide layer 308 in a number of region 313 outside of the number trenches 310. The structure is now as appears in FIG. 3B.

Figure 3C:
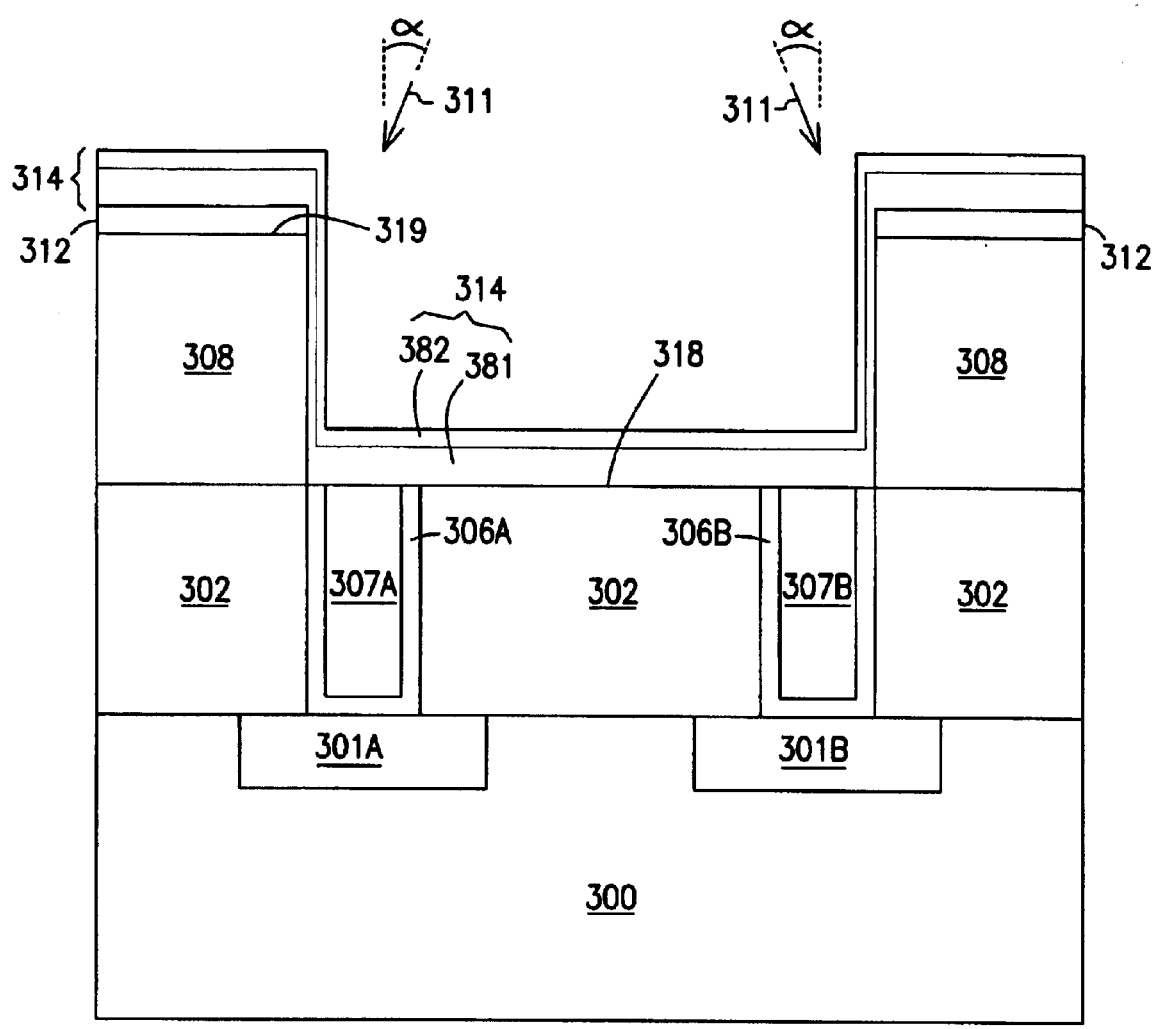

As shown in FIG. 3C, a first barrier/adhesion layer 314 is deposited in the number of trenches 310 using a low energy ion implantation. In one embodiment according to the teachings of the present invention, depositing the barrier/adhesion layer 314 includes depositing a tantalum nitride layer 314 having a thickness of approximately 5 to 100 Å. In alternate embodiments, depositing the barrier/adhesion layer 314 includes depositing a barrier/adhesion layer 314 of tantalum and/or CuTi. In one embodiment, depositing the tantalum nitride layer 314 includes first depositing a layer of tantalum 381 to have a thickness of approximately 100 Å using a low energy ion implantation of approximately 100 electron volts (eV) at a varying angle implant ($\propto$), e.g. the angle of implantation ($\propto$) is changed from normal to the planarized surface 309 to approximately 15 degrees off normal as shown by arrows 311. In one embodiment, this is achieved using a $10^{17}$ ion implant of tantalum. Next, according to the teachings of the present invention, a layer of nitrogen 382 is implanted at 700 electron volts (eV) into the layer of tantalum 381. In one embodiment, this is achieved using an $8 \times 10^{16}$ ion implant of nitrogen. As one of ordinary skill in the art will understand upon reading this disclosure, using a varying angle implant, where an angle of implantation is changed from normal to the planarized surface 309 to approximately 15 degrees off normal deposits the barrier/adhesion layer 314 on all surfaces in the number of trenches 310. The structure is now as appears in FIG. 3C.

Figure 3D:
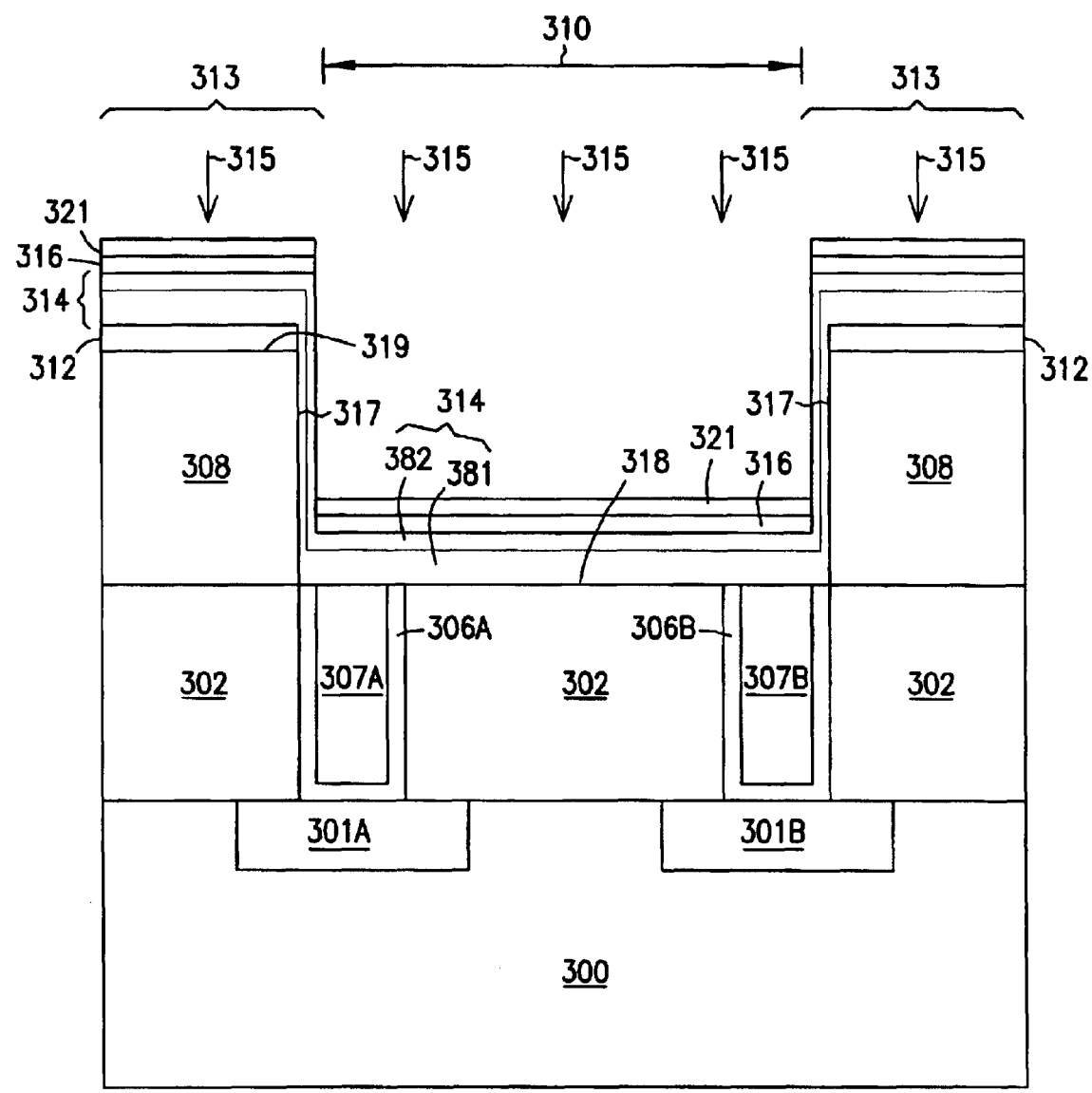

In FIG. 3D, a first seed layer 316 is deposited on the first barrier/adhesion layer 314 using a low energy ion implantation. According to the broader teachings of the present invention, depositing the seed layer 316 on the barrier/adhesion layer 314 includes depositing a seed layer 316 selected from the group consisting of aluminum, copper, silver, and gold. However, according to the teachings of the present embodiment, depositing the seed layer 316 includes depositing a layer of copper 316 having a thickness of approximately 50 Å. This can be achieved using an $8 \times 10^{16}$ ion implant of copper. According to the teachings of the present invention, using a low energy ion implantation includes implanting the layer of copper 316 at 100 electron volts (eV) into the first barrier/adhesion layer 314. Also the layer of copper 316 is implanted at an angle normal to the planarized surface 309 as shown by arrows 315. As one of ordinary skill in the art will understand upon reading this disclosure, implanting the layer of copper 316 at an angle normal to the planarized surface results in the seed layer of copper 316 remaining on a bottom surface 318 in the number of trenches 310 and to a much lesser extent on the side surfaces 317 of the number of trenches 310. In one embodiment, an optional layer of aluminum 321 is deposited over the copper seed layer 316 again using a low energy ion implantation of 100 electron volts (eV). The optional layer of aluminum 321 is deposited to have a thickness of approximately a 50 Å. This can be achieved using a $3 \times 10^{16}$ ion implant of aluminum normal to the wafer surface. As one of ordinary skill in the art will understand upon reading this disclosure, the layer of aluminum 321 is used to protect the copper seed layer 316 from oxidation prior to subsequent processing steps. The structure is now as appears in FIG. 3D.

Figure 3E:
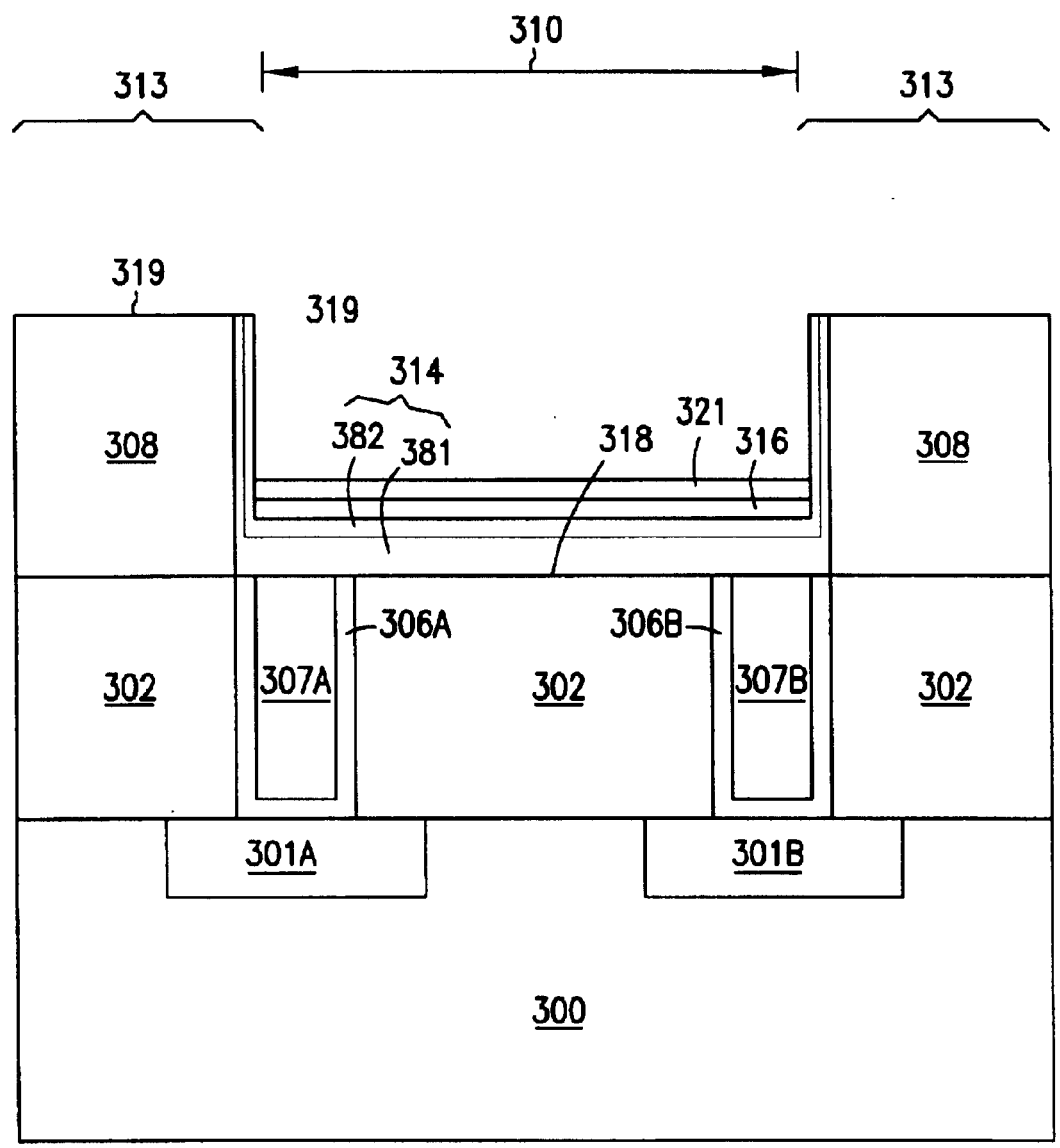

FIG. 3E illustrates the structure after the next sequence of processing steps. As one of ordinary skill in the art will understand upon reading this disclosure, the residual photoresist layer 312 has served as a blocking layer to define the implant areas for the barrier/adhesion layer 314, the seed layer 316, and the layer of aluminum 321. The residual photoresist layer 312 is now removed using a wet strip process, as the same will be understood by one of ordinary skill in the art upon reading this disclosure. According to the teachings of the present invention, removing the residual photoresist layer 312 includes removing the unwanted aluminum layer 321, the unwanted seed layer 316, and the unwanted barrier/adhesion layer 314 from other areas of the wafer's surface, e.g. from over a number of regions outside of the trenches 310 on a top surface 319 of the first insulator layer 308. The structure is now as shown in FIG. 3E.

Figure 3F:
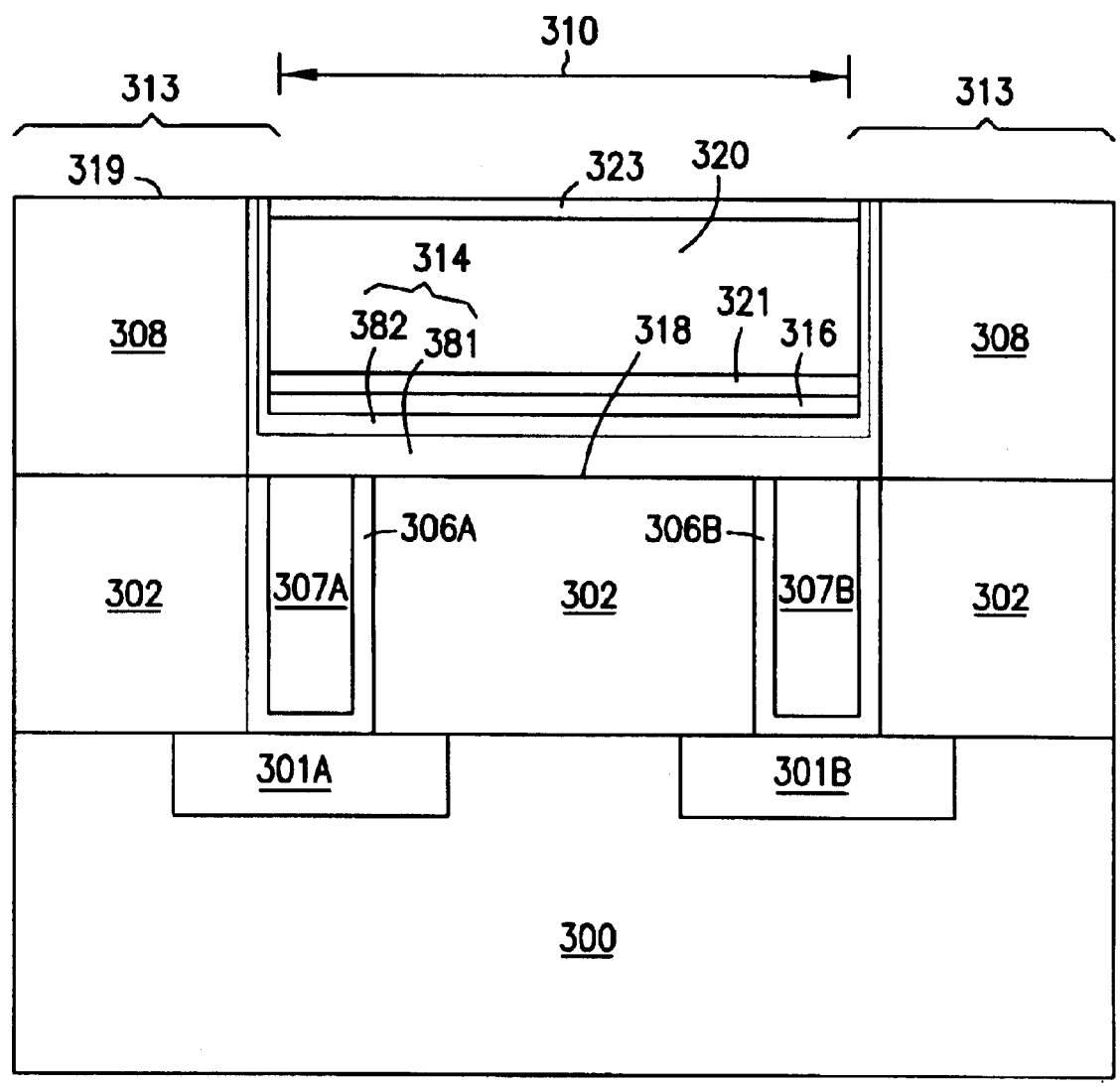

In FIG. 3F, a metallic conductor 320, or number of first level metal lines 320, is deposited over the seed layer 316 in the number of trenches 310. According to teachings of the present embodiment, the metallic conductor 320, or number of first level metal lines 320, is copper. In one embodiment, the metallic conductor 320, or number of first level metal lines 320, is deposited using a selective CVD process. In another embodiment, depositing a metallic conductor 320, or number of first level metal lines 320, over the seed layer 316 includes depositing a metallic conductor 320 using electroless plating. Electroless copper plating is used to deposit sufficient copper to fill the number of trenches 310 to a level approximately 100 Å below the top surface 319 of the first oxide layer 308. At this point, a second layer of tantalum nitride 323 is deposited to a thickness of approximately 100 Å on the copper metallic conductor 320, or number of first level copper lines 320. A chemical mechanical planarization (CMP) cleanup process is then used to remove the tantalum nitride from the top surface 319 of the first oxide layer 308.

Figure 3G:
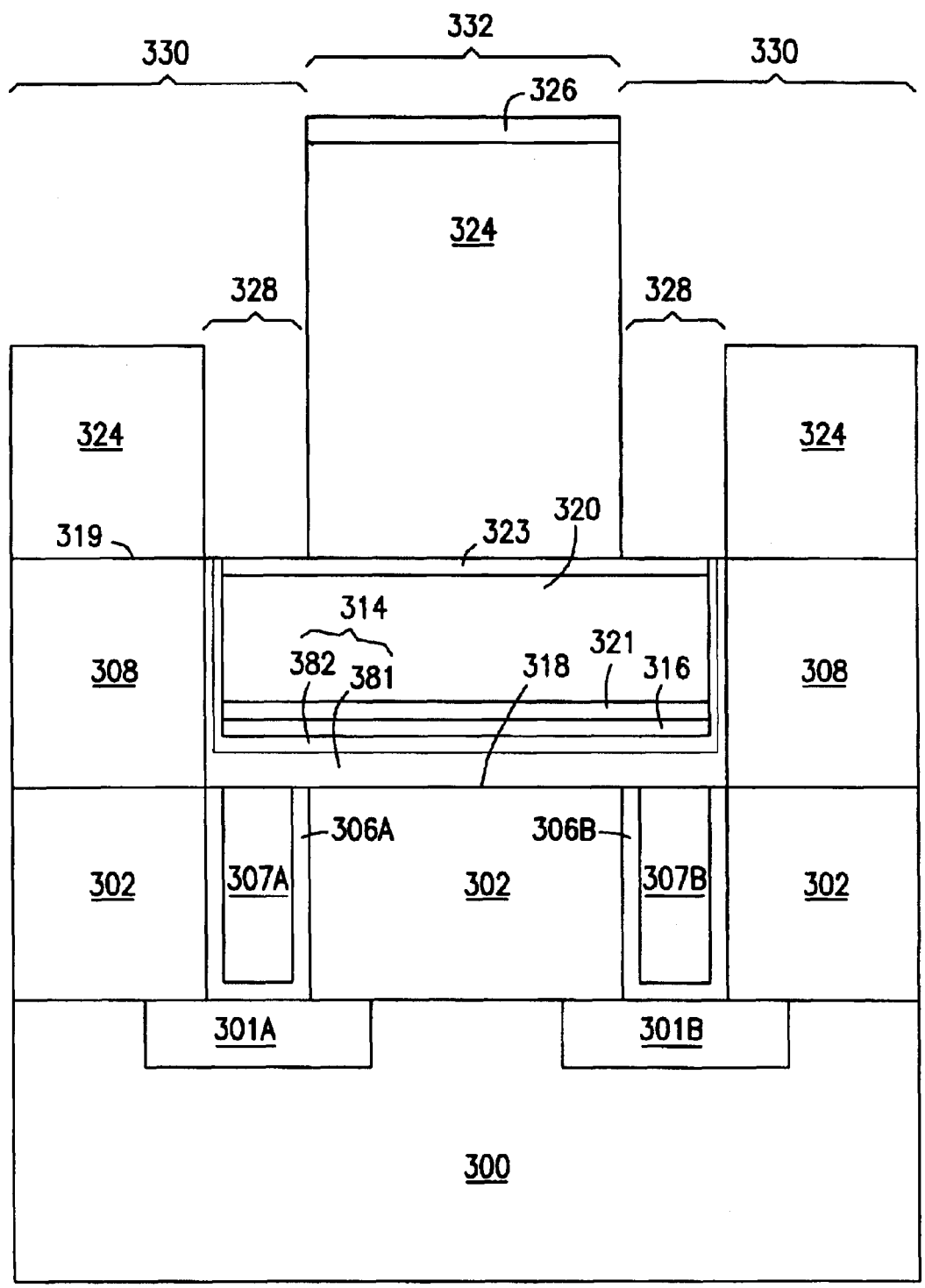

As shown in FIG. 3G, the process sequence may be continued to form any number of subsequent metal layers in a multilayer wiring structure. FIG. 3G illustrates the structure after the next sequence of processing steps. In FIG. 3G, a dual damascene process is used to define and fill a first to a second level of vias and a second level metallurgy. To do so, a second oxide layer 324 is deposited over the wafer surface, e.g. the metallic conductor 320, or number of first level metal lines 320, and the first oxide layer 308. The second oxide layer 324 is again deposited using any suitable technique. In one embodiment, depositing a second oxide layer 324 includes depositing a fluorinated silicon oxide layer 324. In one embodiment, the second oxide layer 324 is deposited to have a thickness of approximately 10,000 Å. As one of ordinary skill in the art will understand, upon reading this disclosure, other suitable thickness for the second oxide layer 324 may also be deposited as suited for forming a first to a second level of vias, e.g. second level vias, and a number of second level metal lines, the invention is not so limited. The second oxide layer 324 is patterned to define a second level of vias and a number of second level metal lines in the second oxide layer 324 opening to the metallic conductor 320, or number of first level metal lines 320. In other words, a second level of vias is defined in a second mask layer of photoresist 326 and then the second oxide layer 324 is etched, using any suitable process, e.g. reactive ion etching (RIE), such that a second level of via openings 328 are defined in the second oxide layer 324. Using the dual damascene process, a number of second level metal lines are also defined in a second mask layer of photoresist 326 and the second oxide layer 324 is again etched, using any suitable process, e.g. reactive ion etching (RIE), such that a second level of metal line trenches 330 are defined in the oxide. One of ordinary skill in the art will understand upon reading this disclosure, the manner in which a photoresist layer 326 can be mask, exposed, and developed using a dual damascene process to pattern a second level of via openings 328 and a second level of metal line trenches 330 in the second oxide layer 324.

As described previously, and according to the teachings of the present invention, a residual photoresist layer 326 is left in place on the second oxide layer 324 in a number of regions 332 outside of the second level of metal line trenches 330. A suitable plasma and/or wet cleaning process is used to remove any contaminates from the second level of via openings 328 and a second level of metal line trenches 330, as the same will be understood by one of ordinary skill in the art upon reading this disclosure. The structure is now as appears in FIG. 3G.

Figure 3H:
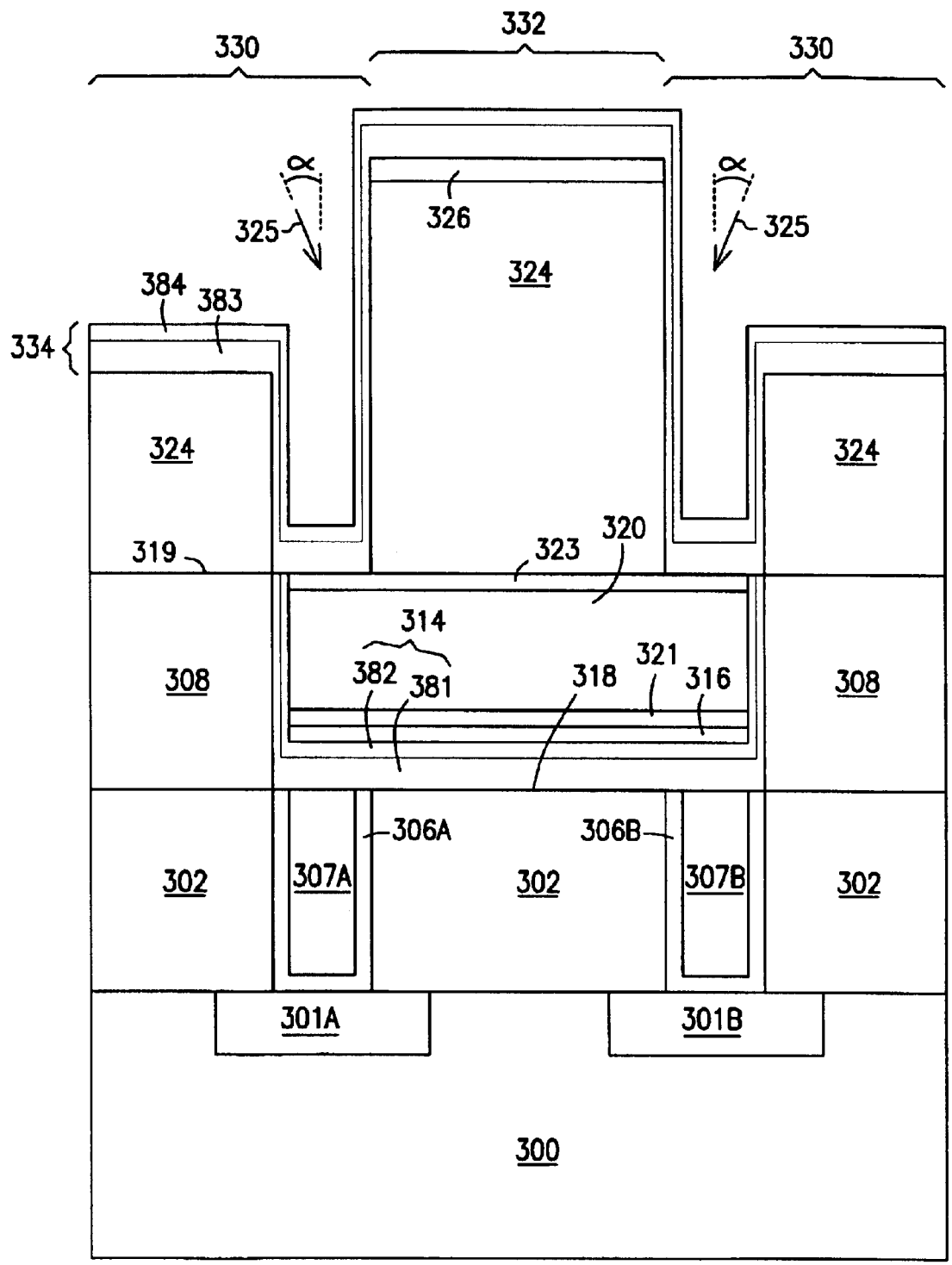
Figure 31:
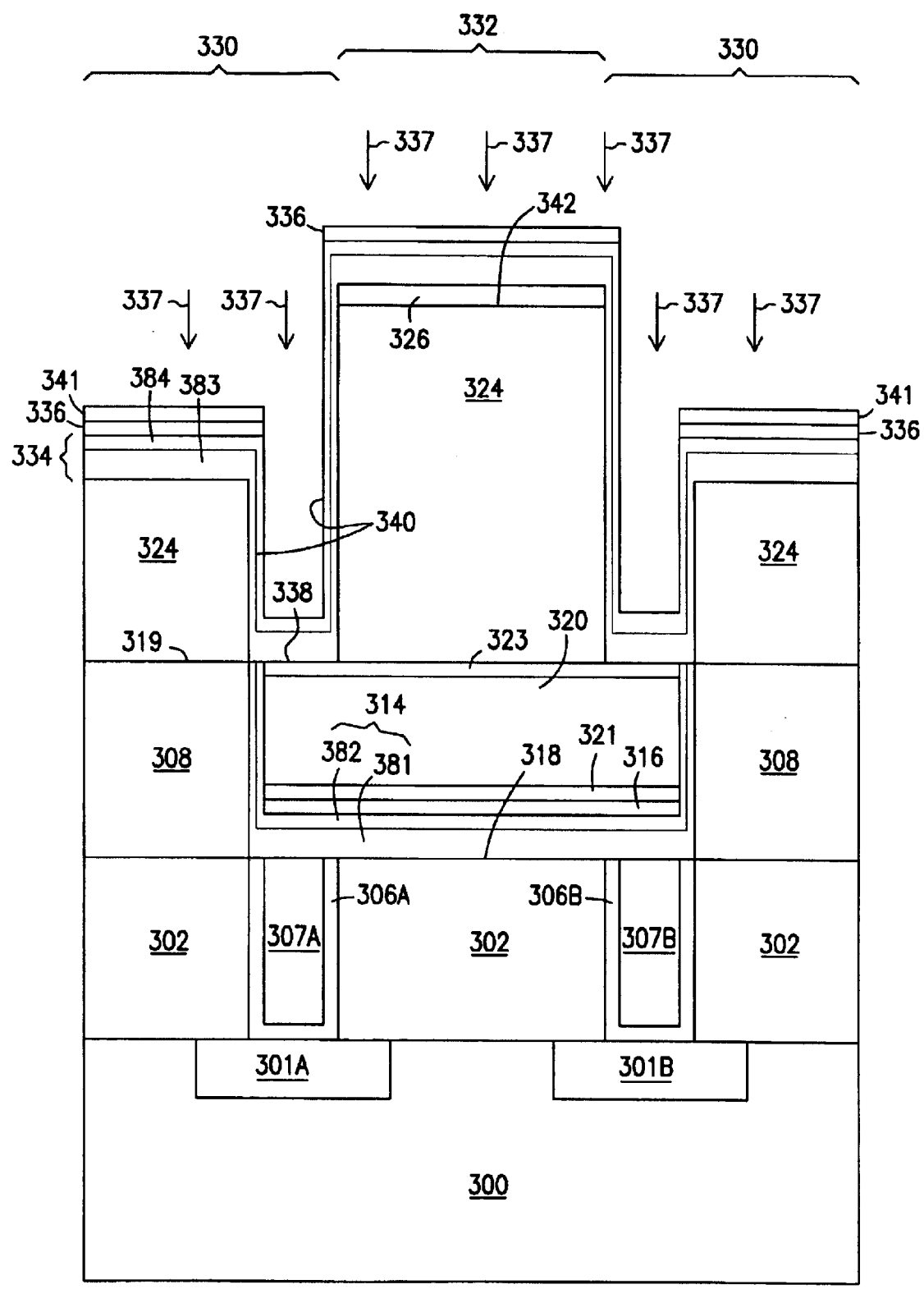

FIG. 3H illustrates the structure after the next sequence of processing steps. In FIG. 3H, a second barrier/adhesion layer 334 is deposited in the second level of via openings 328 and a second level of metal line trenches 330 using a low energy ion implantation. As described above, in one embodiment according to the teachings of the present invention, depositing the second barrier/adhesion layer 334 includes depositing a tantalum nitride layer 334 having a thickness of approximately 5 to 100 Å. In alternate embodiments, depositing the second barrier/adhesion layer 334 includes depositing a second barrier/adhesion layer 334 of tantalum and/or CuTi. In one embodiment, depositing the tantalum nitride layer 334 includes first depositing a layer of tantalum 383 to have a thickness of approximately 100 Å using a low energy ion implantation of approximately 100 electron volts (eV) at a varying angle implant ($\propto$), e.g. the angle of implantation ($\propto$) is changed from normal to the wafer's surface to approximately 15 degrees off normal as shown by arrows 325. In one embodiment, this is achieved using a $10^{17}$ ion implant of tantalum. Next, according to the teachings of the present invention, a layer of nitrogen 384 is implanted at 700 electron volts (eV) into the layer of tantalum 383. In one embodiment, this is achieved using an $8 \times 10^{16}$ ion implant of nitrogen. As one of ordinary skill in the art will understand upon reading this disclosure, using a varying angle implant ($\propto$), where an angle of implantation is changed from normal to the wafer's surface to approximately 15 degrees off normal deposits the second barrier/adhesion layer 334 on all surfaces in the second level of via openings 328 and in the second level of metal line trenches 330 formed in the second oxide layer 324. The structure is now as appears in FIG. 3H.

FIG. 3I illustrates the structure after the next sequence of processing steps. In FIG. 3I, a second seed layer 336 is deposited on the second barrier/adhesion layer 334 using a low energy ion implantation. According to the broader teachings of the present invention, depositing the second seed layer 336 on the second barrier/adhesion layer 314 includes depositing a second seed layer 336 selected from the group consisting of aluminum, copper, silver, and gold. However, according to the teachings of the present embodiment, depositing the second seed layer 336 includes depositing a second layer of copper 336 having a thickness of approximately 50 Å. In one embodiment, this is achieved using an $8 \times 10^{16}$ ion implant of copper. According to the teachings of the present invention, using a low energy ion implantation includes implanting the layer of copper 336 at 100 electron volts (eV) into the surfaces of the second level of via openings 328 and the second level of metal line trenches 330 in the polymer layer. Also the layer of copper 336 is implanted at an angle normal to the wafer's surface as shown by arrows 337. As one of ordinary skill in the art will understand upon reading this disclosure, implanting the layer of copper 336 at an angle normal to the wafer's surface results in the second seed layer of copper 336 remaining on a bottom surface 338 in the second level of via openings 328 and to a much lesser extent on the side surfaces 340 of the second level of via openings 328 and a second level of metal line trenches 330. In one embodiment, an optional layer of aluminum 341 is deposited over the second copper seed layer 336 again using a low energy ion implantation of 100 electron volts (eV). The optional layer of aluminum is deposited to have a thickness of approximately a 50 Å. In one embodiment, this is achieved using a $3\times10^{16}$ ion implant of aluminum normal to the wafer surface. As one of ordinary skill in the art will understand upon reading this disclosure, the layer of aluminum 341 is used to protect the second copper seed layer 336 from oxidation prior to subsequent processing steps. The structure is now as shown in FIG. 3I.

Figure 3J:
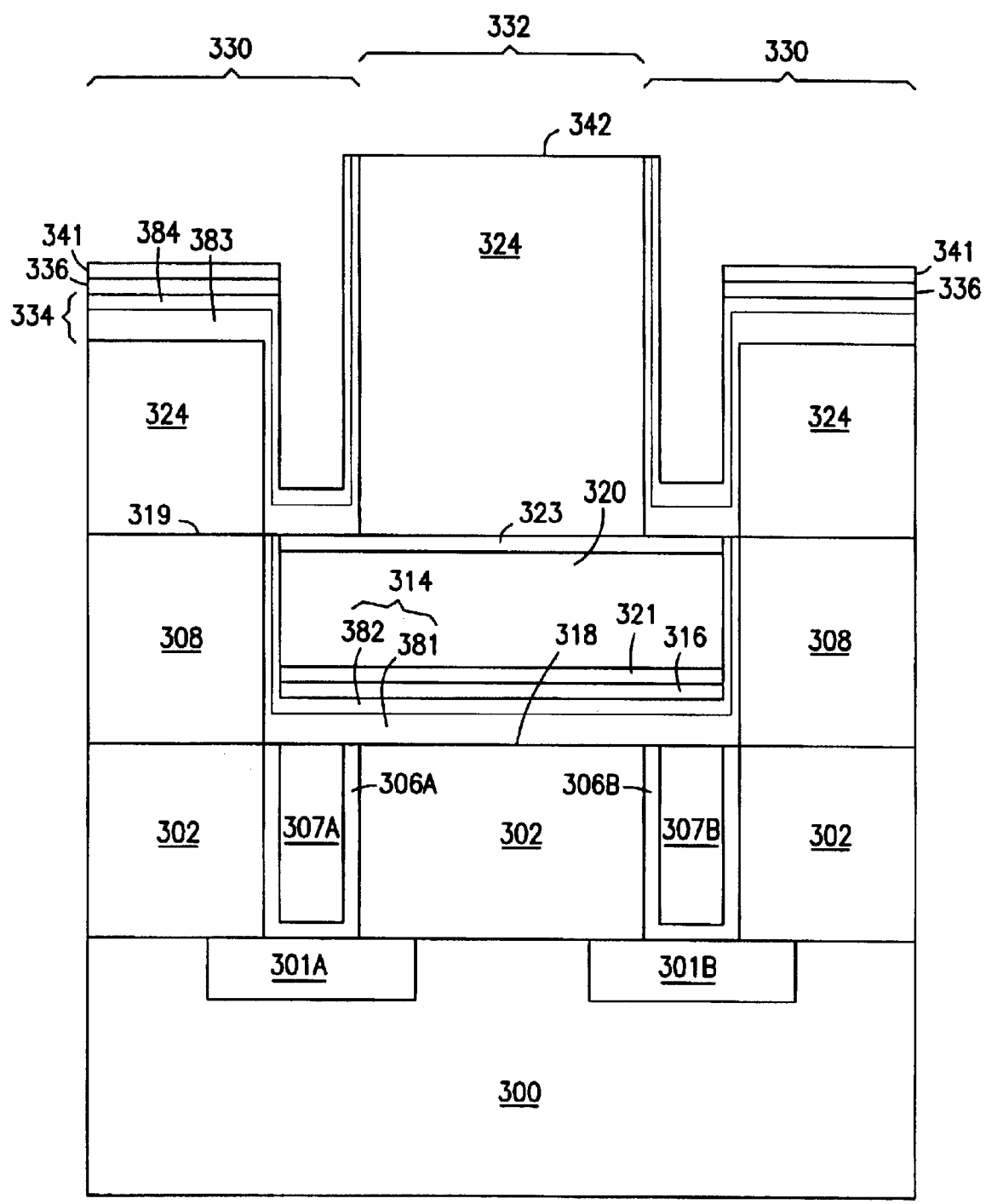

FIG. 3J illustrates the structure after the next sequence of processing steps. As one of ordinary skill in the art will understand upon reading this disclosure, the residual photoresist layer 326 has served as a blocking layer to define the implant areas for the second barrier/adhesion layer 334, the second seed layer 336, and the aluminum layer 341. The residual photoresist layer 326 is now removed using a wet strip process, as the same will be understood by one of ordinary skill in the art upon reading this disclosure. According to the teachings of the present invention, removing the residual photoresist layer 326 includes removing the unwanted aluminum layer 341, the unwanted seed layer 336, and the unwanted barrier/adhesion layer 334 from other areas of the wafer's surface, e.g. from over a number of regions 332 outside of second level of metal line trenches 330 on a top surface 342 of the second insulator layer 324. The structure is now as shown in FIG. 3J.

Figure 3K:
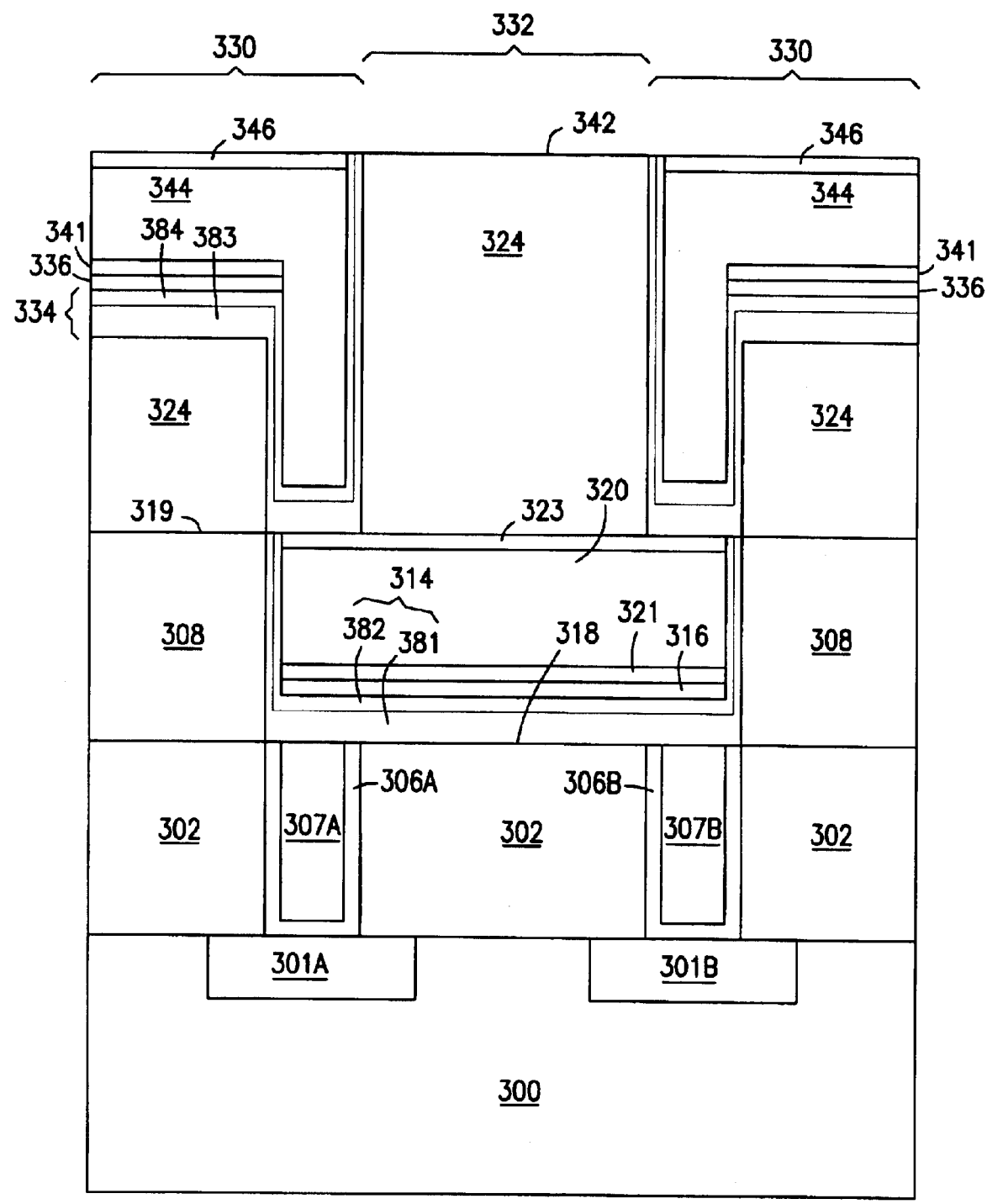

In FIG. 3K, a second metallic conductor 344, or second core conductor 344, is deposited over or formed on the second seed layer 336 and within the second barrier/adhesion layer 334 in the second level of via openings 328 and the second level of metal line trenches 330 in the polymer layer. In this embodiment the second metallic conductor 344, or second core conductor 344, is copper, but in other embodiments of the present invention the second metallic conductor 344, or second core conductor 344, can be selected from the group consisting of aluminum, silver, and gold. In one embodiment, the second metallic conductor 344, or second core conductor 344, is deposited using a selective CVD process. In another embodiment, depositing a second metallic conductor 344, or second core conductor 344, over on the second seed layer 336 and within the second barrier/adhesion layer 334 includes depositing a second metallic conductor 344, or second core conductor 344, using electroless plating. Electroless copper plating is used to deposit sufficient copper to fill the second level of via openings 328 and the second level of metal line trenches 330 to level approximately 100 Å below the top surface 342 of the second insulator layer 324. At this point, a second layer of tantalum nitride 346 is deposited to a thickness of approximately 100 Å on the second metallic conductor 344, or second core conductor 344. A chemical mechanical planarization (CMP) cleanup process is then used to remove the tantalum nitride from the top surface 342 of the second insulator layer 324. Thus, the second barrier/adhesion layer 334, the second seed layer 336, and the second metallic conductor 344, or second core conductor 344, constitute a second number of conductive structures which includes a number of second level vias and a number of second level metal lines which are formed over and connect to a first number of conductive structures, e.g. the metallic conductor 320, or number of first level metal lines 320.

Another Embodiment of a Metal Interconnect Using Copper

FIGS. 4A–4L illustrate a novel methodology for the formation of metal interconnects and/or a wiring structure in an integrated circuit according to the teachings of the present invention. The novel methodology includes the novel formation of a barrier/adhesion layer and a seed layer in an integrated circuit using a low energy ion implantation. The novel methodology also encompasses a novel method of making copper, silver, aluminum, or gold interconnect for an integrated circuit.

Figure 4A:
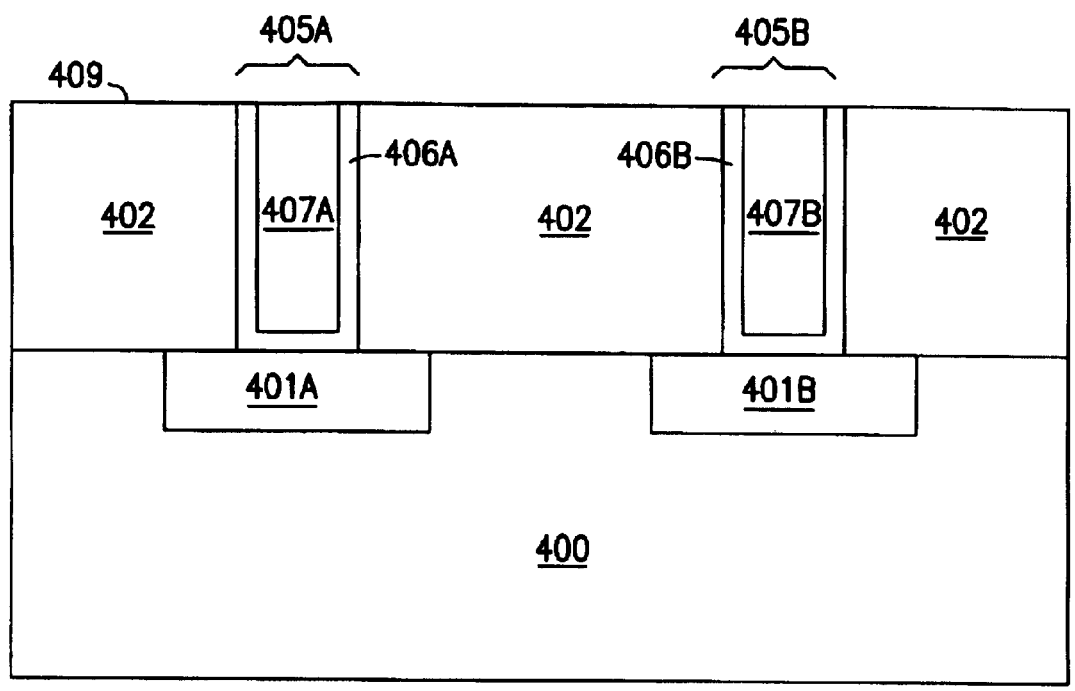

FIG. 4A illustrates a portion of an integrated circuit structure, namely an integrated circuit having a number of semiconductor devices formed in a substrate. FIG. 4A illustrates the structure after a device structure is formed in the substrate and the contact structure to the device structure is in place. One of ordinary skill in the art will understand upon reading this disclosure the manner in which a number of semiconductor structures, e.g. transistors, can be formed in a substrate. One of ordinary skill in the art will also understand upon reading this disclosure the manner in which a contact structure can be formed connecting to a given semiconductor device in a substrate, such as described in connection with FIG. 1A. For example, FIG. 4A illustrates the structure after a number of device structures, e.g. transistor 401A and 401B are formed in the substrate 400. An insulator layer 402 is deposited over the number of semiconductors 401A and 401B. The deposition of the insulator layer 402 can include depositing a layer of $Si_3N_4$ having a thickness in the range of 100 to 500 Angstroms (Å). This insulator layer will also serve as an additional barrier to impurities coming from subsequent processing steps. Contact holes 405A and 405B are opened to the number of device structures 401A and 401B using a photolithography technique. One of ordinary skill in the are will understand, upon reading this disclosure, the manner in which a photolithography technique can be used to create contact holes 405A and 405B. In one embodiment of the present invention a titanium silicide liner 406A and 406B is placed in the contact holes 405A and 405B, such a through a process such as chemical vapor deposition (CVD). Next, tungsten vias 407A and 407B can be deposited in the contact holes 405A and 405B. The tungsten vias 407A and 407B can be deposited in the contact holes using any suitable technique such as using a CVD process. The excess tungsten is then removed from the wafer surface by chemical mechanical planarization (CMP) or other suitable processes to form a planarized surface 409.

Figure 4B:
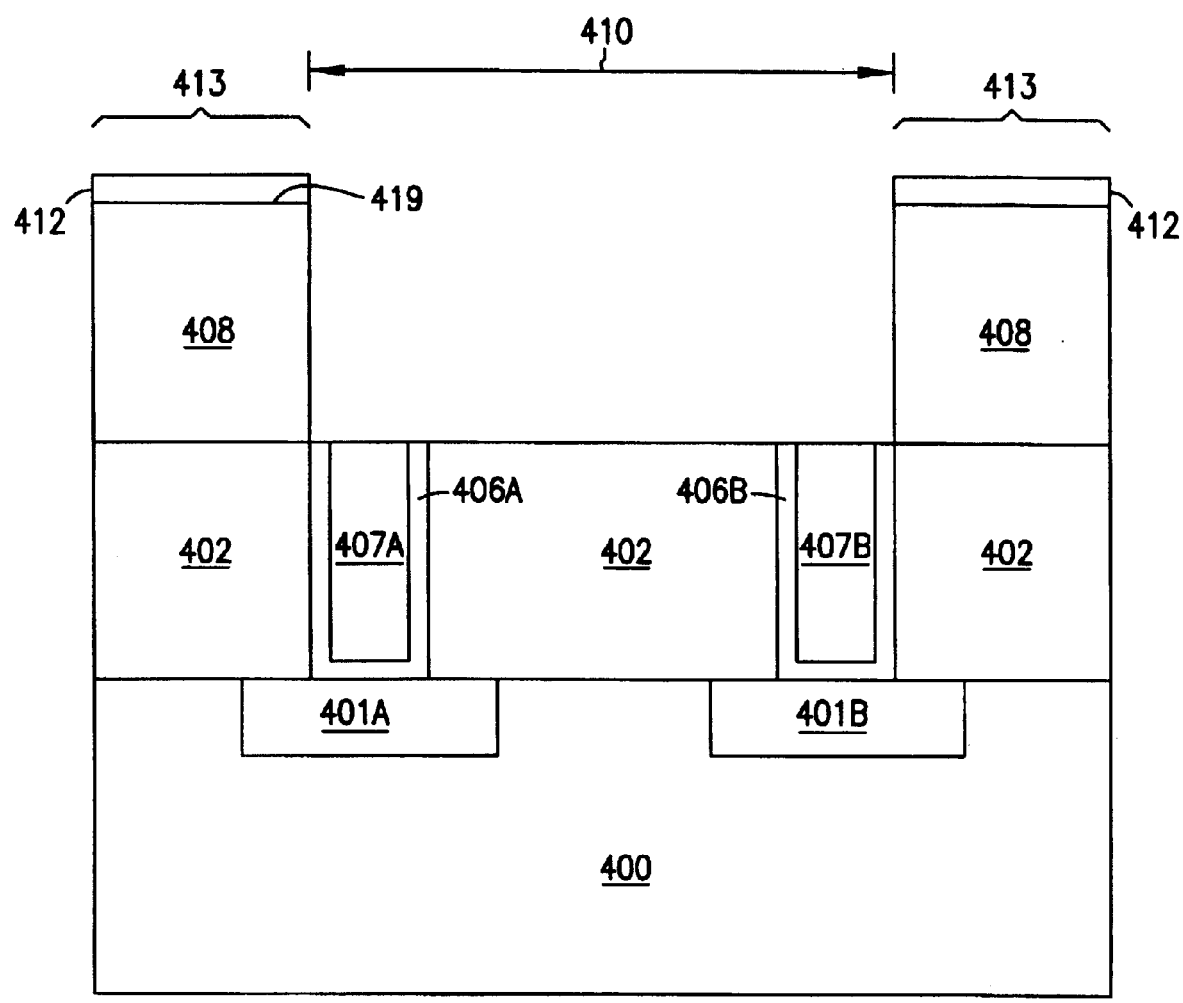

As shown in FIG. 4B, a first polymer layer 408, or first layer of polyimide 408, is deposited over the wafer surface. The first polymer layer 408 may be deposited using, for example, the process and material described in co-pending and commonly assigned application U.S. Ser. No. 09/128, 859, entitled "Copper Metallurgy in Integrated Circuits," which is hereby incorporated by reference. In one embodiment, depositing a first polymer layer 408 includes depositing a foamed polymer layer 408. In one embodiment, the first layer of polyimide 408 is deposited and cured, forming a 5000 Å thick layer of polymer 408 after curing. As one of ordinary skill in the art will understand, upon reading this disclosure, other suitable thickness for the first layer of polyimide 408, or insulator layer/material 408, may also be deposited as suited for forming a first level metal pattern, the invention is not so limited. The first layer of polyimide 408, or first insulator layer/material 408 is patterned to define a number of trenches 410 in the first insulator layer 408 opening to a number of first level vias, e.g. tungsten vias 407A and 407B in planarized surface 409.

In other words, a first level metal pattern 410 is defined in a mask layer of photoresist 412 and then the first layer of polyimide 408 is etched, using any suitable process, e.g. reactive ion etching (RIE), such that the first level metal pattern 410 is defined in the polyimide. According to the teachings of the present invention, a residual photoresist layer 412 is left in place on the first insulator layer 408 in a number of region 413 outside of the number trenches 410. The structure is now as appears in FIG. 4B.

Figure 4C:
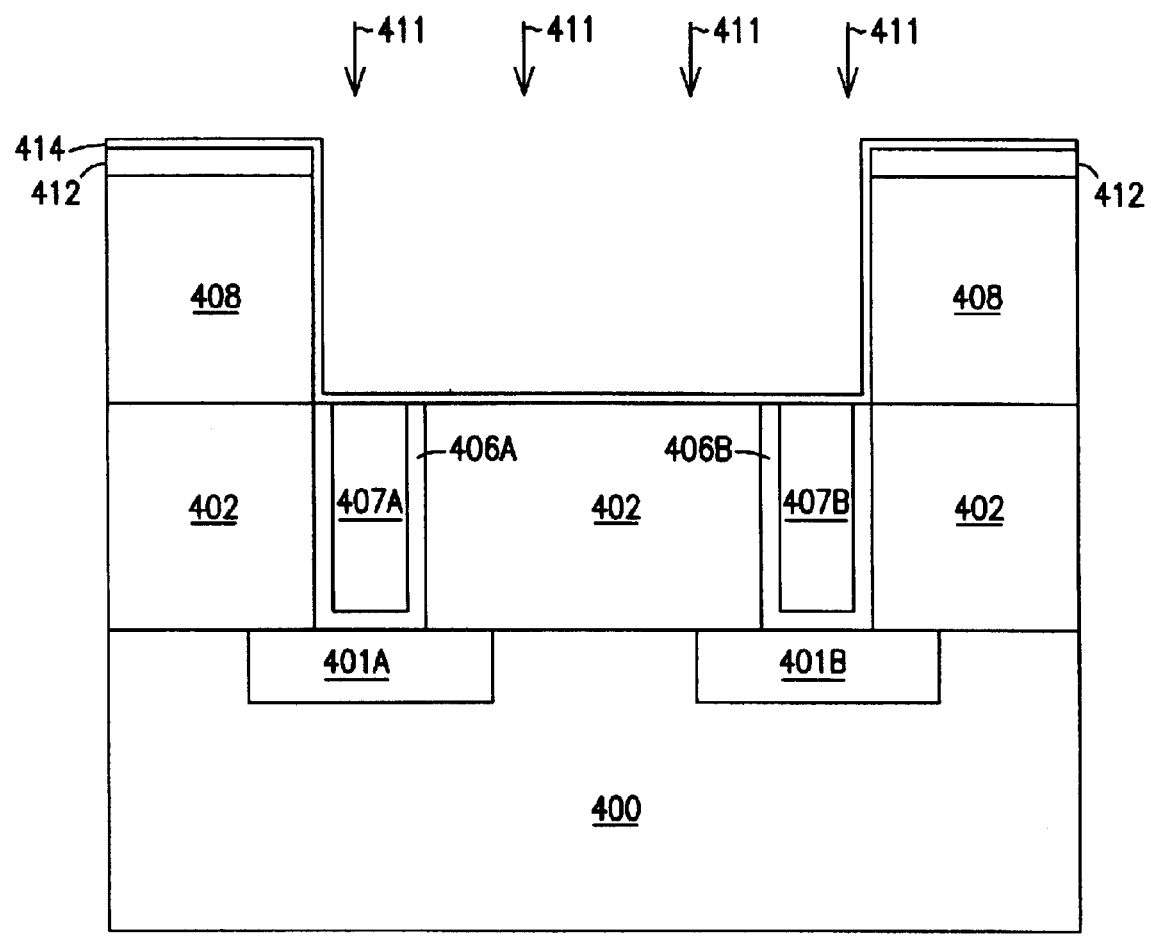

As shown in FIG. 4C, a first barrier/adhesion layer 414 is deposited in the number of trenches 410 using a low energy ion implantation. In one embodiment according to the teachings of the present invention, depositing the barrier/adhesion layer 414 includes depositing a layer of zirconium 414 having a thickness of approximately 5 to 100 Å. In alternate embodiments, depositing the barrier/adhesion layer 414 includes depositing a barrier/adhesion layer 414 of titanium and/or hafnium. In one embodiment, depositing the depositing a layer of zirconium 414 includes depositing a layer of zirconium 414 having a thickness of approximately 15 Å. This can be achieved using a $10^{17}$ ion implant of zirconium. According to the teachings of the present invention, the layer of zirconium 414 is implanted at 100 electron volts (eV) into the surface of the trenches 410 in the polymer layer 408 using an angle of implant normal to the wafer's surface as shown by arrows 411. The structure is now as appears in FIG. 4C.

Figure 4D:
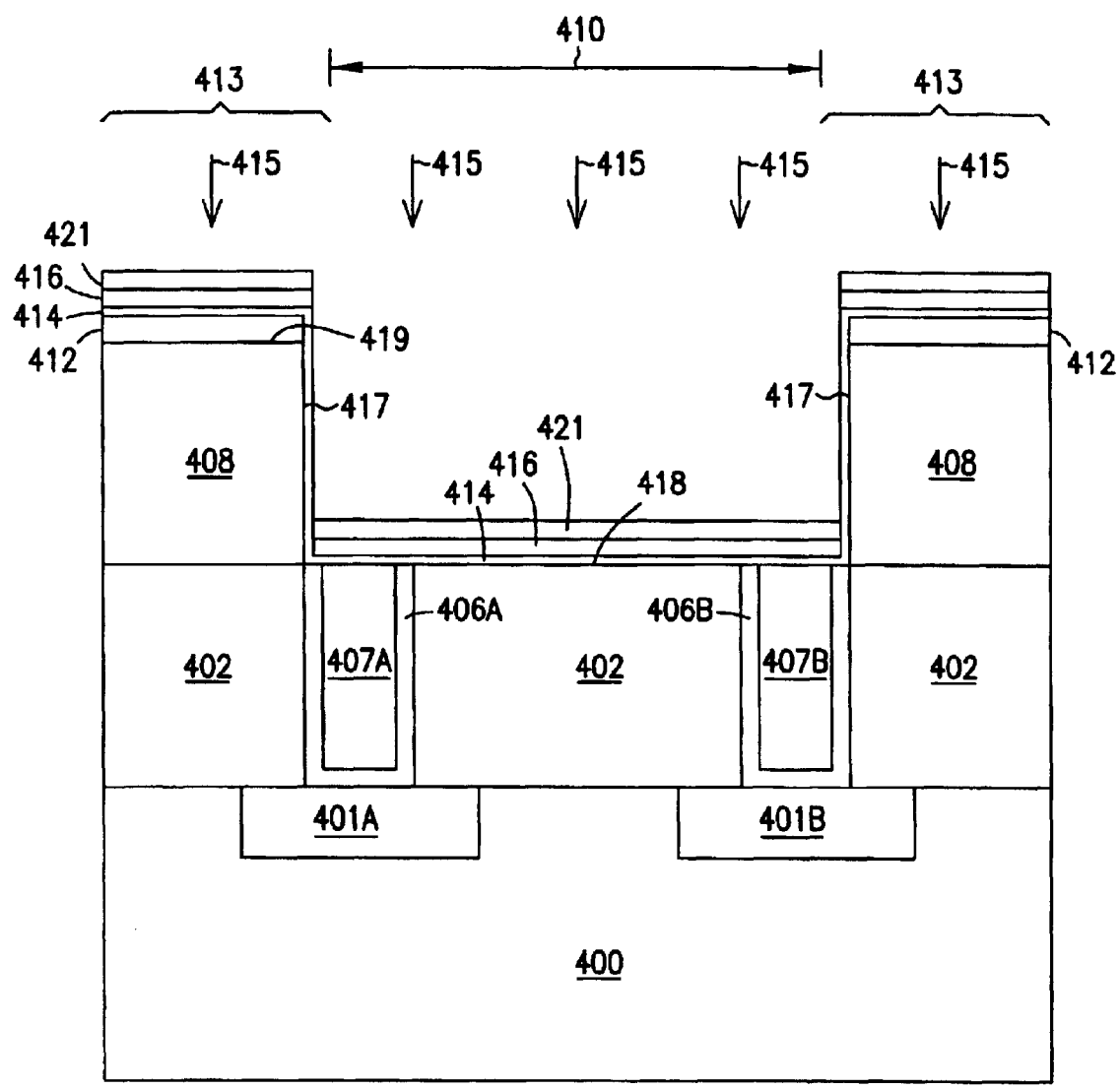

In FIG. 4D, a first seed layer 416 is deposited on the first barrier/adhesion layer 414 using a low energy ion implantation. According to the broader teachings of the present invention, depositing the seed layer 416 on the barrier/adhesion layer 414 includes depositing a seed layer 416 selected from the group consisting of aluminum, copper, silver, and gold. However, according to the teachings of the present embodiment, depositing the seed layer 416 includes depositing a layer of copper 416 having a thickness of approximately a 50 Å. This can be achieved using an $8\times10^{16}$ ion implant of copper. According to the teachings of the present invention, using a low energy ion implantation includes implanting the layer of copper 416 at 100 electron volts (eV) into the surface of the trenches 410 in the polymer layer. Also the layer of copper 416 is implanted at an angle normal to the wafer's surface as shown by arrows 415. As one of ordinary skill in the art will understand upon reading this disclosure, implanting the layer of copper 416 at an angle normal to the wafer's surface results in the seed layer of copper 416 remaining on a bottom surface 418 in the number of trenches 410 and to a much lesser extent on the side surfaces 417 of the number of trenches 410. In one embodiment, an optional layer of aluminum 421 is deposited over the copper seed layer 416 again using a low energy ion implantation of 100 electron volts (eV). The optional layer of aluminum 421 is deposited to have a thickness of approximately a 50 Å. This can be achieved using a $3\times10^{16}$ ion implant of aluminum normal to the wafer surface as shown by arrows 415. As one of ordinary skill in the art will understand upon reading this disclosure, the layer of aluminum 421 is used to protect the copper seed layer 416 from oxidation prior to subsequent processing steps. The structure is now as appears in FIG. 4D.

Figure 4E:
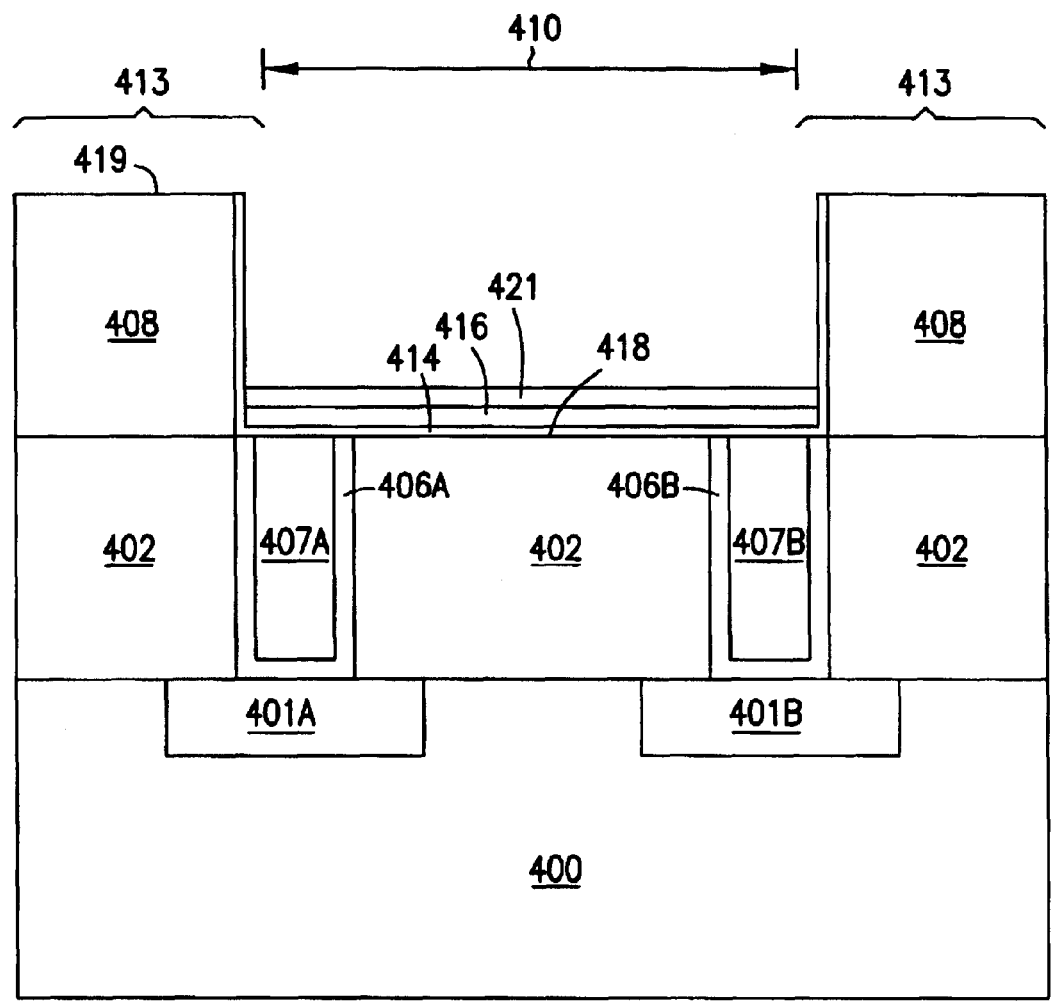

FIG. 4E illustrates the structure after the next sequence of processing steps. As one of ordinary skill in the art will understand upon reading this disclosure, the residual photoresist layer 412 has served as a blocking layer to define the implant areas for the barrier/adhesion layer 414, the seed layer 416, and the layer of aluminum 421. The residual photoresist layer 412 is now removed using a wet strip process, as the same will be understood by one of ordinary skill in the art upon reading this disclosure. According to the teachings of the present invention, removing the residual photoresist layer 412 includes removing the unwanted aluminum layer 421, the unwanted seed layer 416, and the unwanted barrier/adhesion layer 414 from other areas of the wafer's surface, e.g. from over a number of regions 413 outside of the trenches 410 on a top surface 419 of the first insulator layer 408. The structure is now as shown in FIG. 4E.

Figure 4F:
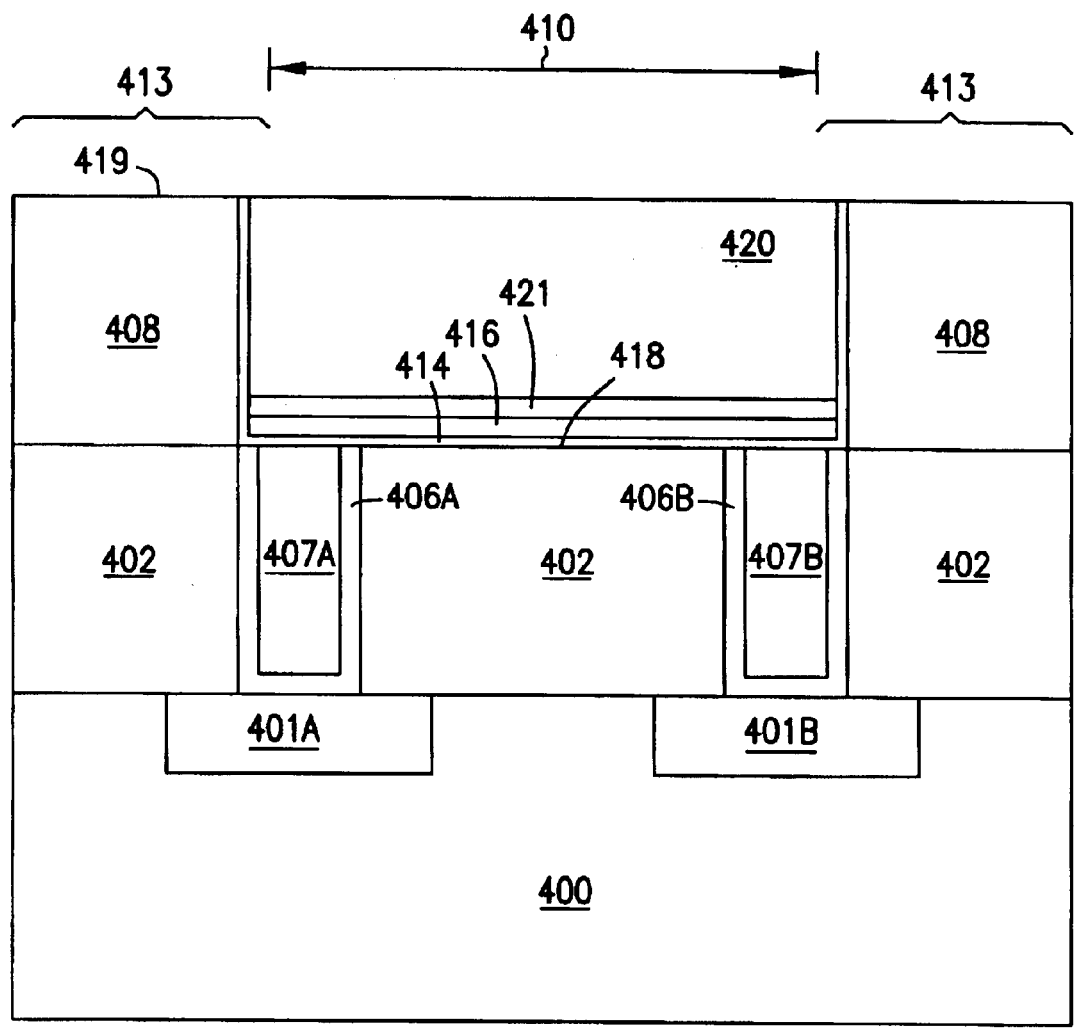

In FIG. 4F, a metallic conductor 420, or number of first level metal lines 420, is deposited over the seed layer 416 in the number of trenches 410. According to teachings of the metallic conductor 420, or number of first level metal lines 420, is selected from the group consisting of aluminum, copper, silver, and gold depending on the type of seed layer 416 which was deposited. According to this embodiment, a number of copper metal lines 420, or first level copper metal lines 420 are selectively formed on the copper seed layer 416. In one embodiment, the metallic conductor 420, or number of first level metal lines 420, is deposited using a selective CVD process. In another embodiment, depositing a metallic conductor 420, or number of first level metal lines 420, over the seed layer 416 includes depositing a metallic conductor 420 using electroless plating. Electroless copper plating is used to deposit sufficient copper to fill the number of trenches 410 to the top surface 419 of the first insulator layer 408.

Figure 4G:
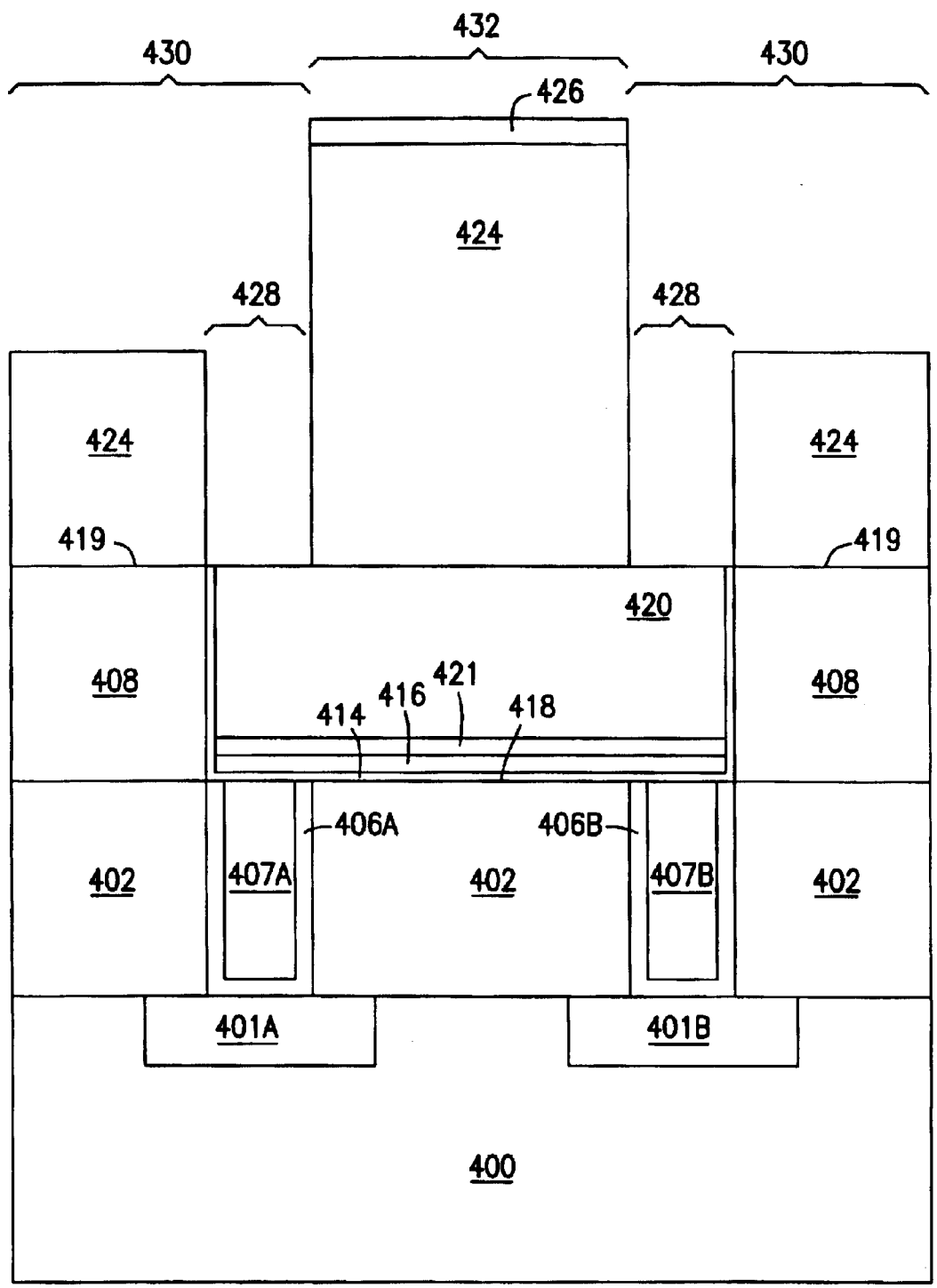

As shown in FIG. 4G, the process sequence may be continued to form any number of subsequent metal layers in a multilayer wiring structure. FIG. 4G illustrates the structure after the next sequence of processing steps. In FIG. 4G, a dual damascene process is used to define and fill a first to a second level of vias and a second level metallurgy. To do so, a second polymer layer 424, or second layer of polyimide 424, is deposited over the wafer surface, e.g. the metallic conductor 420, or number of first level metal lines 420, and the first polymer layer 408. The second polymer layer 424 may similarly be deposited using, for example, the process and material described in co-pending and commonly assigned application U.S. Ser. No. 09/128,859, entitled "Copper Metallurgy in Integrated Circuits," which is hereby incorporated by reference. In one embodiment, depositing a second polymer layer 424 includes depositing a foamed second polymer layer 424. In one embodiment, the second polymer layer 424 is deposited and cured, forming a 10,000 Å thick second polymer layer 424 after curing. As one of ordinary skill in the art will understand, upon reading this disclosure, other suitable thickness for the second polymer layer 424, or second insulator layer/material 424, may also be deposited as suited for forming a first to a second level of vias, e.g. second level vias, and a number of second level metal lines, the invention is not so limited. The second polymer layer 424, or second insulator layer/material 424 is patterned to define a second level of vias and a number of second level metal lines in the second insulator layer/material 424 opening to the metallic conductor 420, or number of first level metal lines 420. In other words, a second level of vias is defined in a second mask layer of photoresist 426 and then the second polymer layer 424 is etched, using any suitable process, e.g. reactive ion etching (RIE), such that a second level of via openings 428 are defined in the polyimide. Using the dual damascene process, a number of second level metal lines are also defined in a second mask layer of photoresist 426 and the second polymer layer 424 is again etched, using any suitable process, e.g. reactive ion etching (RIE), such that a second level of metal line trenches 430 are defined in the polyimide. One of ordinary skill in the art will understand upon reading this disclosure, the manner in which a photoresist layer 426 can be mask, exposed, and developed using a dual damascene process to pattern a second level of via openings 428 and a second level of metal line trenches 430 in the second insulator layer/material 424.

As described previously, and according to the teachings of the present invention, a residual photoresist layer 426 is left in place on the second insulator layer/material 424 in a number of regions 432 outside of the second level of metal line trenches 430. A suitable plasma and/or wet cleaning process is used to remove any contaminates from the second level of via openings 428 and a second level of metal line trenches 430, as the same will be understood by one of ordinary skill in the art upon reading this disclosure. The structure is now as appears in FIG. 4G.

Figure 4H:
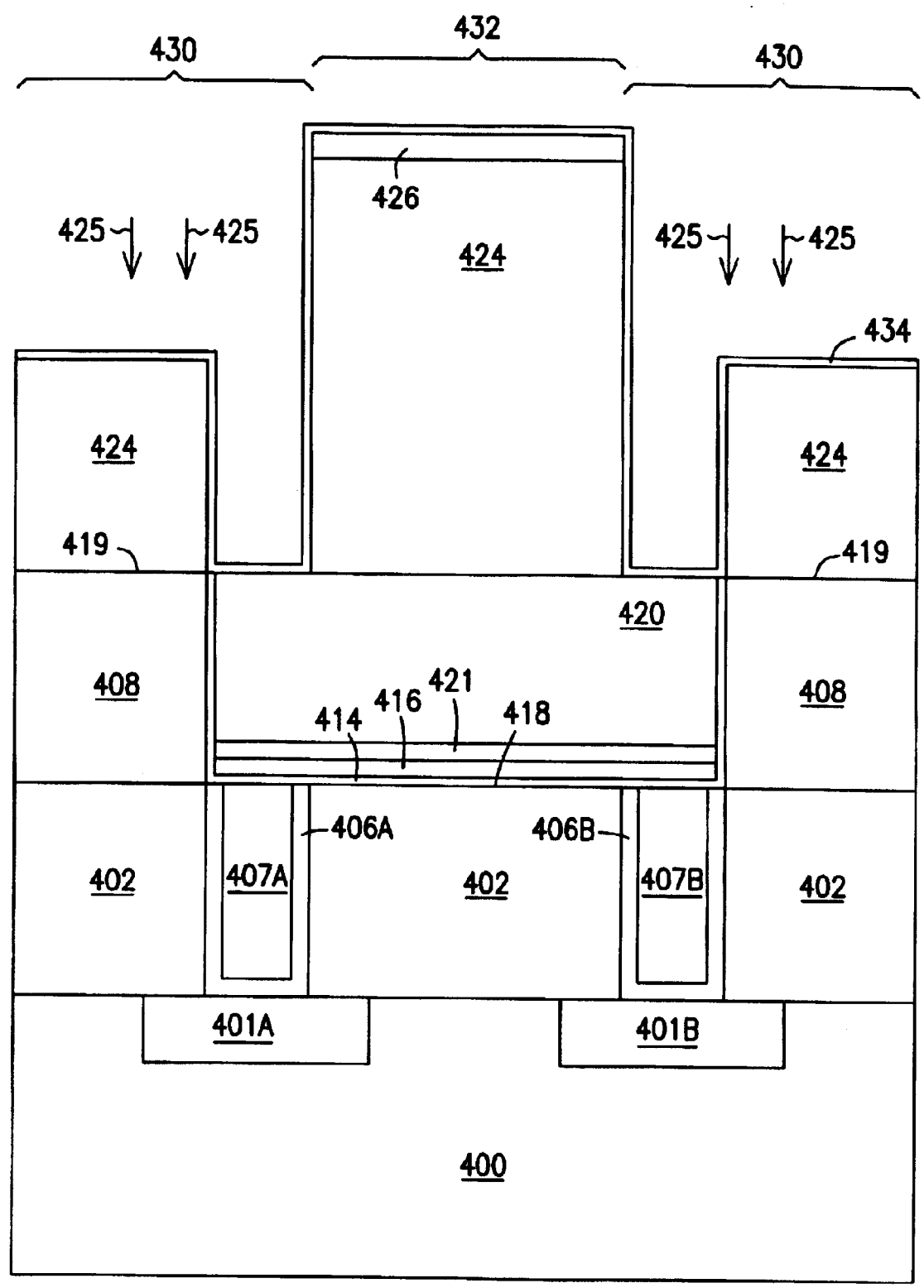
Figure 41:
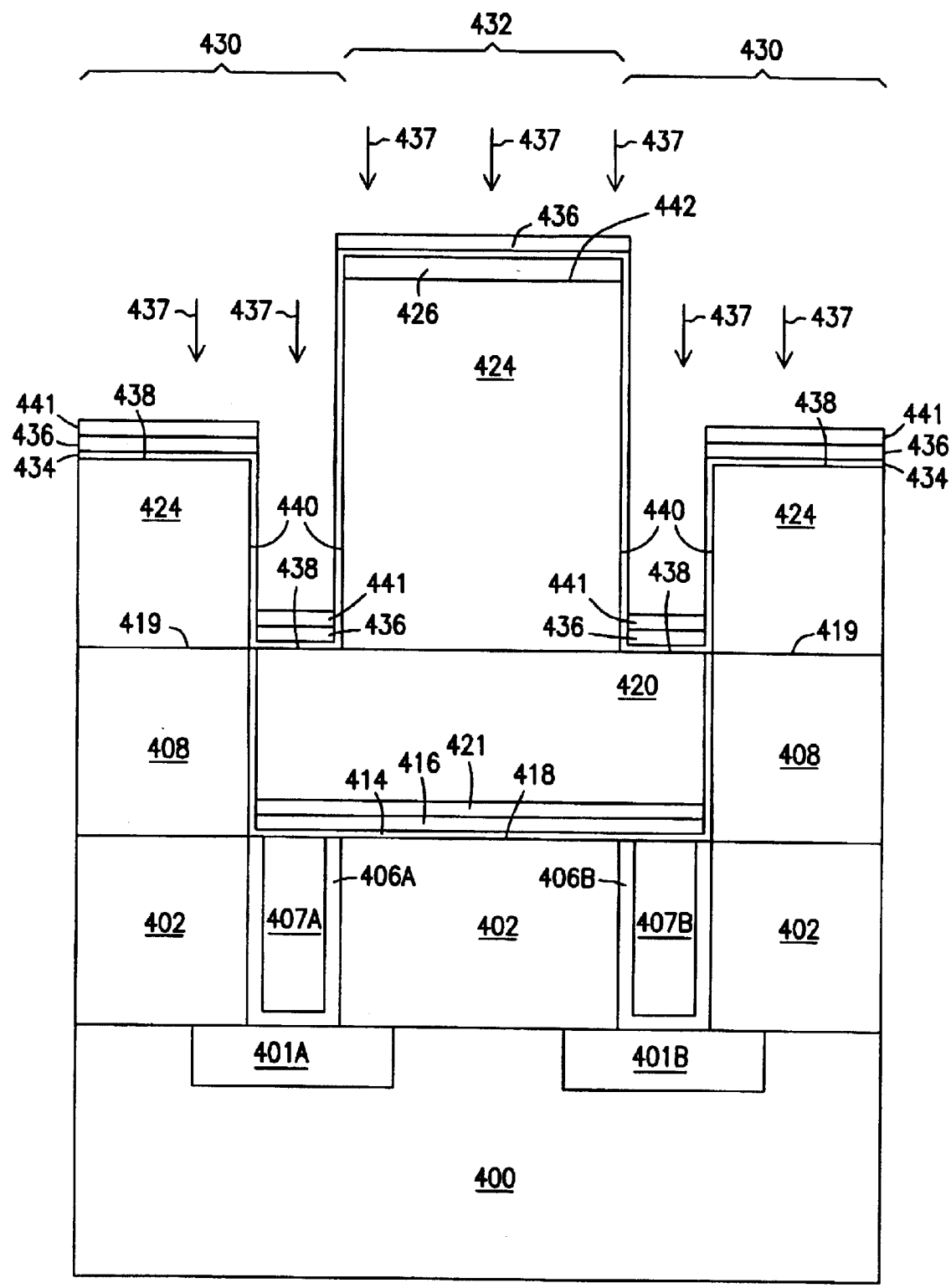

FIG. 4H illustrates the structure after the next sequence of processing steps. In FIG. 4H, a second barrier/adhesion layer 434 is deposited in the second level of via openings 428 and a second level of metal line trenches 430 using a low energy ion implantation. As described above, in one embodiment according to the teachings of the present invention, depositing the second barrier/adhesion layer 434 includes depositing a layer of zirconium 434 having a thickness of approximately 5 to 100 Å. In alternate embodiments, depositing the second barrier/adhesion layer 434 includes depositing a barrier/adhesion layer 434 of titanium and/or hafnium. In one embodiment, depositing the layer of zirconium 434 includes depositing a layer of zirconium 434 having a thickness of approximately 15 Å. In one embodiment, this is achieved using a $10^{17}$ ion implant of zirconium. According to the teachings of the present invention, the layer of zirconium 434 is implanted at 100 electron volts (eV) into the surface of the second level of via openings 428 and a second level of metal line trenches 430 in the second polymer layer 424 using an implant angle normal to the wafer's surface as shown by arrows 425. The structure is now as appears in FIG. 4H.

FIG. 4I illustrates the structure after the next sequence of processing steps. In FIG. 4I, a second seed layer 436 is deposited on the second barrier/adhesion layer 434 using a low energy ion implantation. According to the broader teachings of the present invention, depositing the second seed layer 436 on the second barrier/adhesion layer 414 includes depositing a second seed layer 436 selected from the group consisting of aluminum, copper, silver, and gold. However, according to the teachings of the present embodiment, depositing the second seed layer 436 includes depositing a second layer of copper 436 having a thickness of approximately a 50 Å. In one embodiment, this is achieved using an $8 \times 10^{16}$ ion implant of copper. According to the teachings of the present invention, using a low energy ion implantation includes implanting the layer of copper 436 at 100 electron volts (eV) into the second level of via openings 428 and the second level of metal line trenches 430 in the polymer layer. Also the layer of copper 436 is implanted at an angle normal to the wafer's surface as shown by arrows 437. As one of ordinary skill in the art will understand upon reading this disclosure, implanting the layer of copper 436 at an angle normal to the wafer's surface results in the second seed layer of copper 436 remaining on a bottom surface 438 in the second level of via openings 428 and to a much lesser extent on the side surfaces 440 of the second level of via openings 428 and a second level of metal line trenches 430. In one embodiment, an optional layer of aluminum 441 is deposited over the second copper seed layer 436 again using a low energy ion implantation of 100 electron volts (eV). The optional layer of aluminum is deposited to have a thickness of approximately a 50 Å. In one embodiment, this is achieved using a $3 \times 10^{16}$ ion implant of aluminum normal to the wafer surface. As one of ordinary skill in the art will understand upon reading this disclosure, the layer of aluminum 441 is used to protect the second copper seed layer 436 from oxidation prior to subsequent processing steps. The structure is now as appears in FIG. 4I.

Figure 4J:
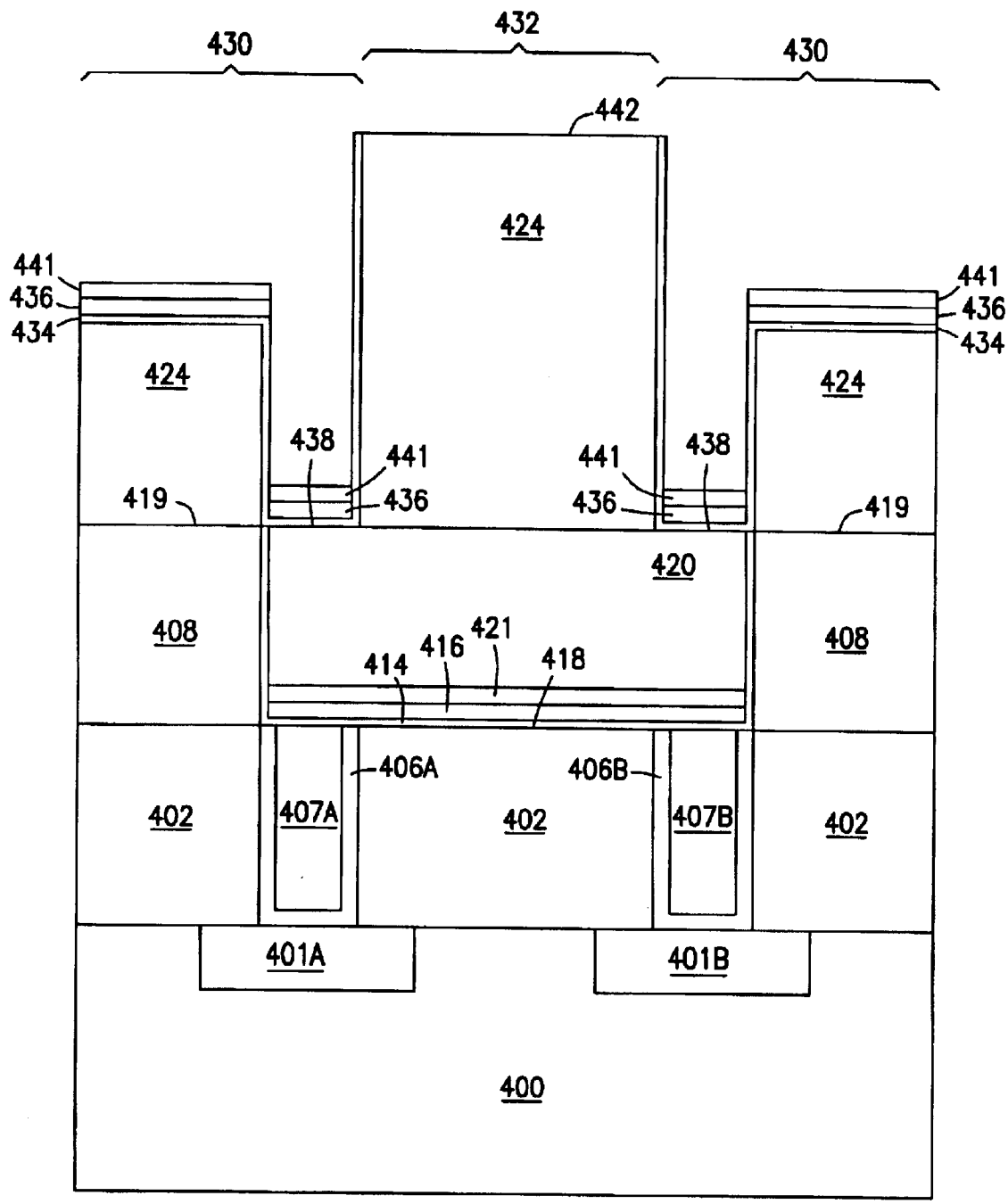

FIG. 4J illustrates the structure after the next sequence of processing steps. As one of ordinary skill in the art will understand upon reading this disclosure, the residual photoresist layer 426 has served as a blocking layer to define the implant areas for the second barrier/adhesion layer 434, the second seed layer 436, and the aluminum layer 441. The residual photoresist layer 426 is now removed using a wet strip process, as the same will be understood by one of ordinary skill in the art upon reading this disclosure. According to the teachings of the present invention, removing the residual photoresist layer 426 includes removing the unwanted aluminum layer 441, the unwanted seed layer 436, and the unwanted barrier/adhesion layer 434 from other areas of the wafer's surface, e.g. from over a number of regions 432 outside of second level of metal line trenches 430 on a top surface 442 of the second insulator layer 424. The structure is now as shown in FIG. 4J.

Figure 4K:
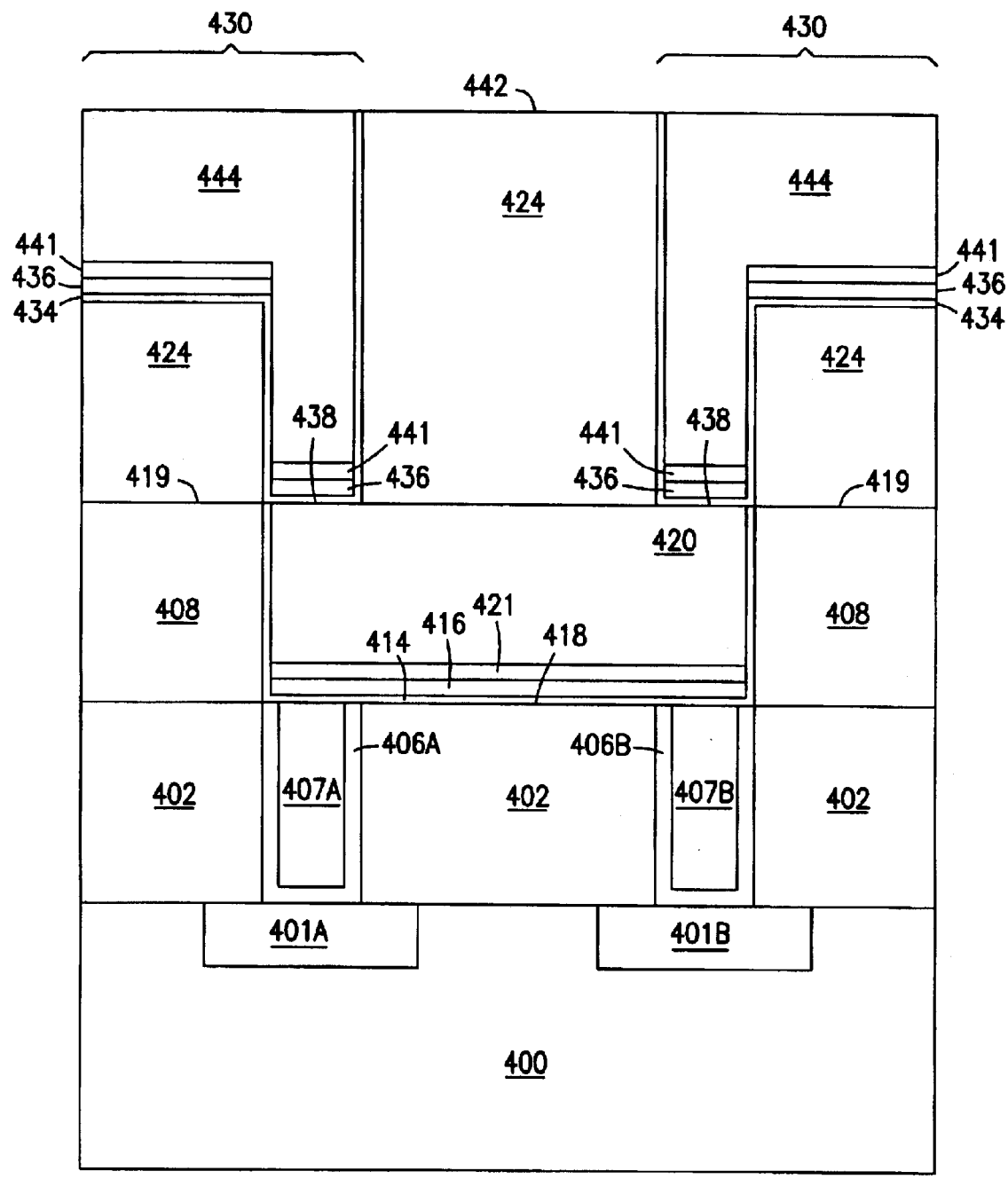

In FIG. 4K, a second metallic conductor 444, or second core conductor 444, is deposited over or formed on the second seed layer 436 and within the second barrier/adhesion layer 434 in the second level of via openings 428 and the second level of metal line trenches 430 in the polymer layer. In this embodiment the second metallic conductor 444, or second core conductor 444, is copper, but in other embodiments of the present invention the second metallic conductor 444, or second core conductor 444, can be selected from the group consisting of aluminum, silver, and gold. In one embodiment, the second metallic conductor 444, or second core conductor 444, is deposited using a selective CVD process. In another embodiment, depositing a second metallic conductor 444, or second core conductor 444, over on the second seed layer 436 and within the second barrier/adhesion layer 434 includes depositing a second metallic conductor 444, or second core conductor 444, using electroless plating. Electroless copper plating is used to deposit sufficient copper to fill the second level of via openings 428 and the second level of metal line trenches 430 to the top surface 442 of the second insulator layer 424. Thus, the second barrier/adhesion layer 434, the second seed layer 436, and the second metallic conductor 444, or second core conductor 444, constitute a second number of conductive structures which includes a number of second level vias and a number of second level metal lines which are formed over and connect to a first number of conductive structures, e.g. the metallic conductor 420, or number of first level metal lines 420.

As one of ordinary skill in the art will understand upon reading this disclosure, the above described method embodiments can be repeated until the requisite number of metal layers are formed.

Figure 4L:
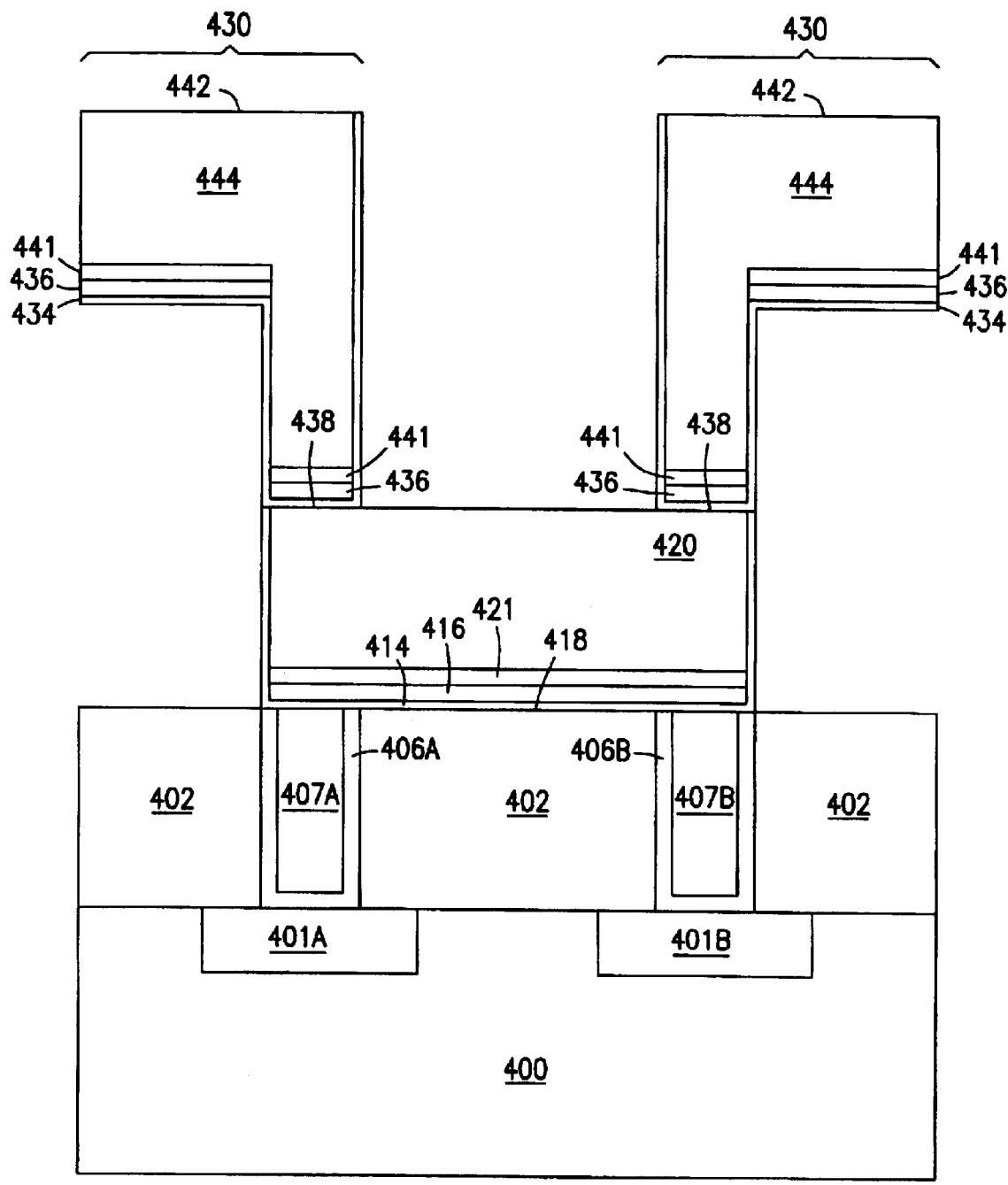

FIG. 4L illustrates the structure following the final sequence of processing steps. Upon completion of the last level of metal, the entire polymer structure, e.g. first polymer layer 408 and second polymer layer 424, are removed using an $O_2$ plasma etch. The structure is now as appears in FIG. 4L.

Figure 5:
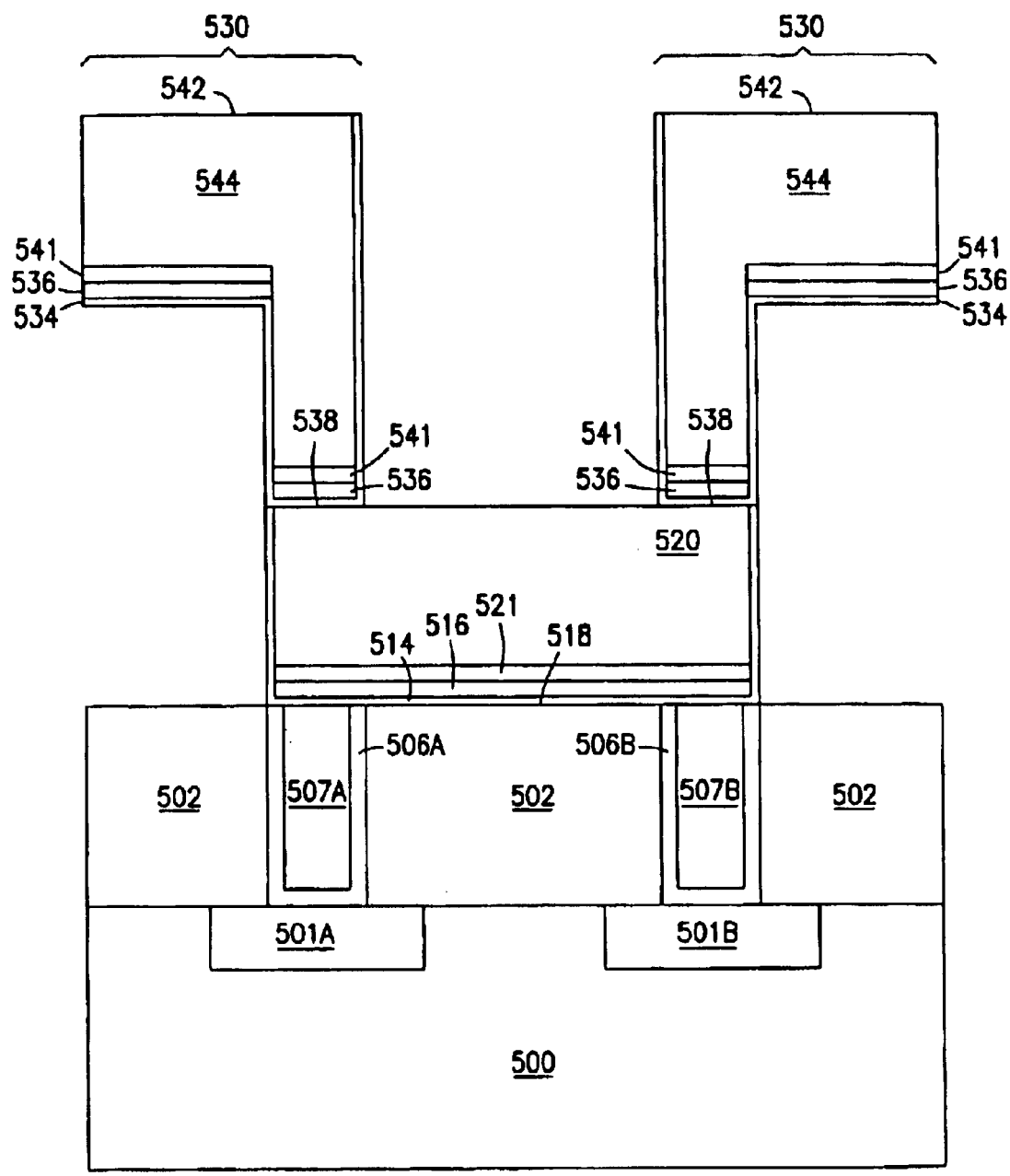
FIG. 5, is an illustration of an integrated circuit formed according to the teachings of the present invention.

FIG. 5, is an illustration of an embodiment of an integrated circuit 503 formed according to the teachings of the present invention. As shown in FIG. 5, the integrated circuit 503 includes a metal layer in an integrated circuit. The metal layer includes a number of first level vias 507A and 507B connecting to a number of silicon devices 501A and 501B in a substrate 500. A number of first level metal lines 520 are formed above and connect to the number of first level vias 507A and 507B. A barrier/adhesion layer 514 having a thickness in the range of 5 to 150 Angstroms is formed on the number of first level vias 507A and 507B. A seed layer 516 having a thickness in the range of 5 to 150 Angstroms is formed at least between a portion of the barrier/adhesion layer 514 and the number of first level metal lines 520. As described above the barrier adhesion layer 514 having a thickness in the range of 5 to 150 Angstroms includes a barrier/adhesion layer selected from the group consisting of titanium, zirconium, and hafnium. In one embodiment, as shown in FIG. 5, the number of first level vias 507A and 507B connecting to a number of silicon devices 501A and 501B in substrate 500 are surrounded by an insulator layer 502.

As described above the number of first level metal lines is selected from the group consisting of Aluminum, Copper, Silver, and Gold. In one embodiment, the integrated circuit 503 comprises a portion of an integrated memory circuit 503. In this embodiment, the number of silicon devices 501A and 501B includes one or more transistors 501A and 501B in the substrate 500.

As one of ordinary skill in the art will understand upon reading this disclosure, any one of the embodiments as shown in FIGS. 1K, 2K, 3K, and/or 4L can comprise a portion of an integrated circuit according to the teachings of the present invention.

Figure 6:
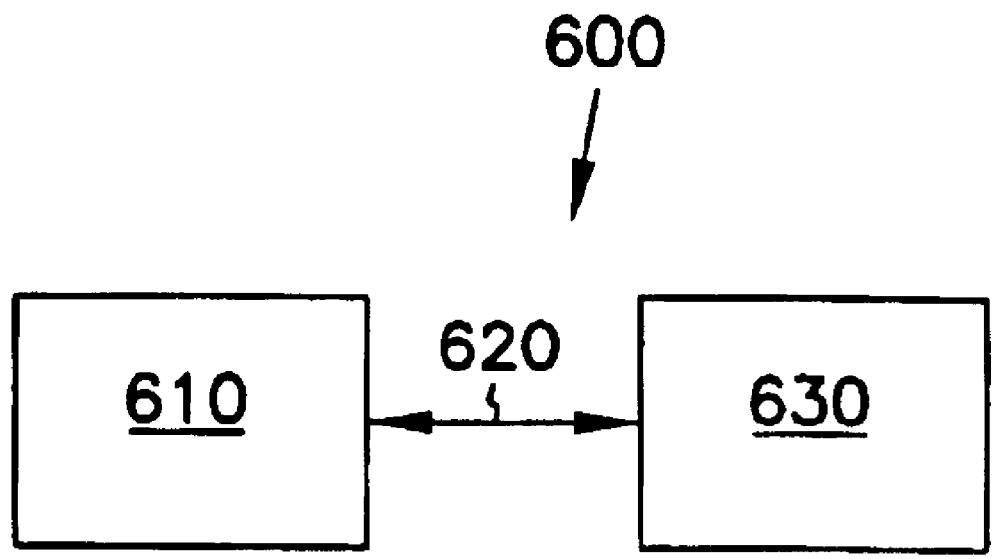
FIG. 6 illustrates an embodiment of a system including a portion of an integrated circuit formed according to any of the embodiments described in the present application.

FIG. 6 illustrates an embodiment of a system 600 including a portion of an integrated circuit formed according to any of the embodiments described in the present application. As one of ordinary skill in the art will understand upon reading this disclosure, this system 600 includes a processor 610 and an integrated circuit, or integrated memory circuit 630 coupled to the processor 610. The processor 610 can be coupled to the integrated memory circuit 630 via any suitable bus, as the same are known and understood by one of ordinary skill in the art. In the embodiment, the processor 610 and integrated circuit 630 are located on a single wafer or die. Again, at least a portion of the integrated circuit 630 includes a portion of an integrated circuit 603 as disclosed in the various embodiments provided herein.

CONCLUSION

Thus, structures and methods have been provided which improve the performance of integrated circuits according to shrinking design rules. The structures and methods include a diffusion barrier and a seed layer in an integrated circuit both formed using a low energy ion implantation followed by a selective deposition of metal lines for the integrated circuit. According to the teachings of the present invention, the selective deposition of the metal lines avoids the need for multiple chemical mechanical planarization (CMP) steps. The low energy ion implantation of the present invention allows for the distinct placement of both the diffusion barrier and the seed layer. A residual resist can be used to remove the diffusion barrier and the seed layer from unwanted areas on a wafer surface. The structures formed by the described novel processes accommodate aluminum, copper, gold, and silver metal interconnects.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. The scope of the invention includes any other applications in which the above structures and fabrication methods are used. The scope of the invention should be determined with reference to the appended claims, along with the full scope of equivalents to which such claims are entitled.

What is claimed:

1. A metal layer in an integrated circuit, comprising:
   a number of first level vias connecting to a number of devices in a substrate; and
   a number of first level metal lines formed above and connecting to the number of first level vias;
   a barrier/adhesion layer having a thickness in the range of 5 to 150 Angstroms formed on the number of first level vias, the barrier/adhesion layer including one or more materials selected from zirconium or hafnium; and
   a seed layer having a thickness in the range of 5 to 150 Angstroms formed at least between a portion of the barrier/adhesion layer and the number of first level metal lines.

2. The metal layer of claim 1, wherein the barrier/adhesion layer having a thickness in the range of 5 to 150 Angstroms includes hafnium.

3. The metal layer of claim 1, wherein the number of first level vias connecting to a number of silicon devices in a substrate are surrounded by an insulator layer.

4. The metal layer of claim 1, wherein the barrier/adhesion layer formed on the number of first level vias metal lines is surrounded by a polyimide insulator layer.

5. The metal layer of claim 1, wherein the number of first level metal lines includes a number of first level metal lines selected from the group consisting of Aluminum, Copper, Silver, and Gold.

6. A metal layer in an integrated circuit, comprising:
   a number of first level vias in a first insulator layer connecting to a number of silicon devices in a substrate; and
   an oxide layer formed over the number of first level vias in the first insulator layer, wherein the oxide layer includes a number of conductive structures connecting from a top surface of the oxide layer to the number of first level vias, each conductive structure comprising:
   a layer of Titanium or Zirconium having a thickness of approximately 50 Angstroms;
   a first layer of Aluminum on the layer of Titanium or Zirconium having a thickness of approximately 50 Angstroms;
   a layer of Copper on the first layer of Aluminum having a thickness of approximately 10 Angstroms; and
   a second layer of Aluminum on the layer of Copper having a thickness of approximately 50 Angstroms.

7. The metal layer of claim 6, wherein the insulator layer includes Si3N4 having a thickness between about 100 Å to about 500 Å.

8. The metal layer of claim 6, wherein the oxide layer includes a fluorinated silicon oxide layer.

9. A metal interconnect in an integrated circuit, comprising:
   a number of first level vias in a first insulator layer connecting to a number of silicon devices in a substrate; and
   an oxide layer formed over the number of first level vias in the first insulator layer, wherein the oxide layer includes a number of conductive structures connecting from a top surface of the oxide layer to the number of first level vias, each conductive structure comprising:
   a layer of tantalum and CuTi, the layer having a thickness of approximately 5 to 100 Angstroms disposed on a first level via of the number of first level vias;
   a seed layer of Copper on the layer of tantalum and CuTi, the seed layer having a thickness of approximately 100 Angstroms; and
   a copper metal line formed on the seed layer of copper.

10. The metal layer of claim 9, wherein each conductive structure further includes a layer of tantalum nitride forming a top surface of each conductive structure such that the top surface of each conductive structure is level with the top surface of the oxide layer.

11. The metal interconnect of claim 9, wherein at least one of the number of first level vias is a tungsten via.

12. The metal interconnect of claim 9, wherein at least one of the number of first level vias is within a titanium silicide liner.

13. A metal interconnect in an integrated circuit, comprising:
   a first level via in a first insulator layer connecting to a device in a substrate; and
   an oxide layer formed over the first level via in the first insulator layer, wherein the oxide layer includes a conductive structure connecting from a top surface of the oxide layer to the first level via, the conductive structure including:
      a barrier/adhesion layer having two material layers, the barrier/adhesion layer disposed on a first level via of the number of first level vias;
      a seed layer on the barrier/adhesion layer;
      a layer of aluminum on the seed layer, the layer of aluminum having a thickness of about 50 Angstroms; and
      a metal line formed on the layer of aluminum.

14. The metal interconnect of claim 13, wherein the barrier/adhesion layer has a thickness of approximately 5 to 100 Angstroms.

15. The metal interconnect of claim 13, wherein the barrier/adhesion layer includes material selected from the group consisting of titanium, zirconium, and hafnium.

16. The metal interconnect of claim 13, wherein the seed layer includes material selected from a group consisting of silver and gold.

17. The metal interconnect of claim 13, wherein the first level via includes tungsten and is contained in a liner.

18. The metal interconnect of claim 13, wherein the first level via is contained in a liner that separates the first level via from a layer of $Si_3N_4$.

19. The metal interconnect of claim 13, wherein the seed layer has a thickness of approximately 10 Angstroms.

20. A metal interconnect in an integrated circuit, comprising:
   a first level via in a first insulator layer connecting to a device in a substrate;
   a titanium silicide liner that contains the first level via; and
   a conductive structure formed over the first level via in the first insulator layer, the conductive structure including:
      a barrier/adhesion layer disposed on the first level via;
      a seed layer on the barrier/adhesion layer; and
      a metal line disposed above the seed layer.

21. The metal interconnect of claim 20, wherein the barrier/adhesion layer has a thickness in the range of 5 to 150 Angstroms.

22. The metal interconnect of claim 20, wherein the barrier/adhesion layer includes CuTi.

23. The metal interconnect of claim 20, further including a layer of aluminum between the seed layer and the metal line.

24. The metal interconnect of claim 20, wherein the conductive structure is contained within a fluorinated silicon oxide layer.

25. A metal interconnect in an integrated circuit, comprising:
   a first level via in a first insulator layer connecting to a device in a substrate;
   a first conductive structure formed over the first level via in the first insulator layer, the first conductive structure including:
      a first barrier/adhesion layer disposed on the first level via the first barrier/adhesion layer including one or more materials selected from zirconium, hafnium, or CuTi;
      a first seed layer disposed on the first barrier/adhesion layer; and
      a first metal line disposed above the first seed layer;
   a second conductive structure having a portion disposed on the first metal line of the first conductive structure, the second conductive structure including:
      a second barrier/adhesion layer disposed on the first metal line;
      a second seed layer disposed on the second barrier/adhesion layer; and
      a second metal line disposed above the second seed layer.

26. The metal interconnect of claim 25, further including a layer of aluminum between the first seed layer and the first metal line.

27. The metal interconnect of claim 25, further including a layer of aluminum between the second seed layer and the second metal line.

28. The metal interconnect of claim 25, wherein the first metal line and the second metal line are composed of different materials.

29. The metal interconnect of claim 25, wherein the first metal line and the second metal line each include material selected from a group consisting of copper, aluminum, silver, and gold.

30. The metal interconnect of claim 25, wherein the first and the second seed layers include material selected from the group consisting of aluminum, copper, silver, and gold.

31. The metal interconnect of claim 25, wherein the first and the second barrier/adhesion layers each have a thickness in the range of 5 to 150 Angstroms.

32. The metal interconnect of claim 25, wherein the first and second barrier/adhesion layers each include zirconium.

33. A metal interconnect in an integrated circuit, comprising:
   a first level via in a first insulator layer connecting to a device in a substrate;
   a liner containing the first level via;
   a first conductive structure formed over the first level via in the first insulator layer, the first conductive structure including:
      a first barrier/adhesion layer disposed on the first level via, the first barrier/adhesion layer including one or more materials selected from zirconium, hafnium, or CuTi;

a first seed layer disposed on the first barrier/adhesion layer; and a first metal line disposed above the first seed layer;

a second conductive structure having a portion disposed on the first metal line of the first conductive structure, the second conductive structure including:

a second barrier/adhesion layer disposed on the first metal line;

a second seed layer disposed on the second barrier/adhesion layer; and a second metal line disposed above the second seed layer.

34. The metal interconnect of claim 33, wherein the liner contains titanium silicide.

35. The metal interconnect of claim 33, wherein the liner separates the via from a layer of $Si_3N_4$.

36. The metal interconnect of claim 33, wherein the first metal line and the second metal line each include material selected from a group consisting of copper, aluminum, silver, and gold.

37. The metal interconnect of claim 33, wherein the first and second barrier/adhesion layers each have a thickness in the range of 5 to 150 Angstroms.

38. The metal interconnect of claim 33, wherein the first and second barrier/adhesion layers each include material selected from the group consisting of zirconium or hafnium.

* * * * *

UNITED STATES PATENT AND TRADEMARK OFFICE
CERTIFICATE OF CORRECTION

| | | |
|---|---|---|
| PATENT NO. | : 7,105,914 B2 | Page 1 of 4 |
| APPLICATION NO. | : 10/117041 | |
| DATED | : September 12, 2006 | |
| INVENTOR(S) | : Farrar | |

It is certified that error appears in the above-identified patent and that said Letters Patent is hereby corrected as shown below:

TITLE PAGE, ITEM (56), under "Foreign Patent Documents", in column 2, line 1, after "10/1993" insert -- H01L 029/46 --.

TITLE PAGE, ITEM (56), under "Foreign Patent Documents", in column 2, line 3, after "3/1995" insert -- H01L 21/3205 --.

TITLE PAGE, ITEM (56), under "Foreign Patent Documents", in column 2, line 4, after "8/1995" insert -- H01L 21/3205 --.

On page 3, ITEM (56), under "U.S. Patent Documents", in column 1, below line 7, insert

| | | | |
|---|---|---|---|
| -- 5,937,320 | 08/1999 | Andricacos et al. | |
| 6,103,320 | 08/2000 | Matsumoto et al. | |
| 6,120,641 | 10/2000 | Stevens et al. | 156/345.22 |
| 6,197,181 | 03/2001 | Chen | 205/123 |
| 6,208,016 | 03/2001 | Farrar | 257/643 |
| 6,245,662 | 06/2001 | Naik et al. | |
| 6,277,263 | 08/2001 | Chen | 205/182 |
| 6,288,442 | 09/2001 | Farrar | 257/678 |
| 6,290,833 | 09/2001 | Chen | 205/182 |
| 6,350,678 | 02/2002 | Pramanick et al. | |
| 6,368,966 | 04/2002 | Krishnamoorthy et al. | 438/687 |
| 6,376,368 | 04/2002 | Jung et al. | |
| 6,486,533 | 11/2002 | Krishnamoorthy et al. | 257/586 |

UNITED STATES PATENT AND TRADEMARK OFFICE
CERTIFICATE OF CORRECTION

PATENT NO.       : 7,105,914 B2
APPLICATION NO.  : 10/117041
DATED            : September 12, 2006
INVENTOR(S)      : Farrar It is certified that error appears in the above-identified patent and that said Letters Patent is hereby corrected as shown below:

| | | | |
|---|---|---|---|
| 6,508,920 | 01/2003 | Ritzdorf et al. | 204/194 |
| 6,552,432 | 04/2003 | Farrar | 257/751 |
| 6,565,729 | 05/2003 | Chen et al. | 205/82 |
| 6,614,099 | 09/2003 | Farrar | 257/643 |
| 6,632,345 | 10/2003 | Chen | 205/182 |
| 6,638,410 | 10/2003 | Chen et al. | 205/182 |
| 6,664,197 | 12/2003 | Stevens et al. | 438/754 |
| 6,743,716 | 06/2004 | Farrar | 438/652 |
| 6,756,298 | 06/2004 | Ahn et al. | 438/635 --. |

On page 3, ITEM (56), under "Other Publications", in column 1, line 2, delete "Multilivel" and insert -- Multilevel --, therefor.

On page 3, ITEM (56), under "Other Publications", in column 1, line 39, delete "Depostion" and insert -- Deposition --, therefor.

On page 3, ITEM (56), under "Other Publications", in column 2, line 12, delete "Planerization" and insert -- Planarization --, therefor.

On page 3, ITEM (56), under "Other Publications", in column 2, line 25, delete "PRoceedings" and insert -- Proceedings --, therefor.

On page 4, ITEM (56), under "Other Publications", in column 1, line 28, delete "electrless" and insert -- electroless --, therefor.

UNITED STATES PATENT AND TRADEMARK OFFICE
CERTIFICATE OF CORRECTION

PATENT NO. : 7,105,914 B2
APPLICATION NO. : 10/117041
DATED : September 12, 2006
INVENTOR(S) : Farrar It is certified that error appears in the above-identified patent and that said Letters Patent is hereby corrected as shown below:

On page 4, ITEM (56), under "Other Publications", in column 1, line 28, delete "Sio2" and insert -- $SiO_2$ --, therefor.

On page 4, ITEM (56), under "Other Publications", in column 2, line 1, delete "PLasma" and insert -- Plasma --, therefor.

On page 4, ITEM (56), under "Other Publications", in column 2, line 7, delete "Prodceedings" and insert -- Proceedings --, therefor.

On page 4, ITEM (56), under "Other Publications", in column 2, line 24, delete "Depostion" and insert -- Deposition --, therefor.

On page 5, ITEM (56), under "Other Publications", in column 2, below line 17, insert -- Copy of Provisional Application Number US-60/114,039, Havemann, H. R., et al., December 29, 1998 --.

On Sheet 46 of 47, in FIG. 5 (Top Right-Above Reference Numeral 530), line 1, above "530" insert -- ∕$^{530}$ --.

In column 4, line 46, delete "unhoped" and insert -- undoped --, therefor.

In column 5, line 43, delete "are" and insert -- art --, therefor.

In column 6, line 30, delete "$10^7$" and insert -- $10^{17}$ --, therefor.

In column 7, line 3, delete "$3x10^6$" and insert -- $3 \times 10^{16}$ --, therefor.

In column 8, line 65, delete "1H" and insert -- 1I --, therefor.

UNITED STATES PATENT AND TRADEMARK OFFICE
CERTIFICATE OF CORRECTION

PATENT NO.        : 7,105,914 B2
APPLICATION NO. : 10/117041
DATED             : September 12, 2006
INVENTOR(S)       : Farrar It is certified that error appears in the above-identified patent and that said Letters Patent is hereby corrected as shown below:

In column 8, line 66, delete "1H" and insert -- 1I --, therefor.

In column 10, line 43, delete "are" and insert -- art --, therefor.

In column 15, line 35, delete "are" and insert -- art --, therefor.

In column 20, line 34, delete "are" and insert -- art --, therefor.

In column 25, line 13, delete "barrier adhesion" and insert -- barrier/adhesion --, therefor.

In column 26, lines 32-33, in Claim 4, after "vias" delete "metal lines".

In column 26, line 57, in Claim 7, delete "Si3N4" and insert -- $Si_3N_4$ --, therefor.

In column 28, line 18, in Claim 25, after "via" insert -- , --.

Signed and Sealed this

Twenty-sixth Day of February, 2008

JON W. DUDAS
*Director of the United States Patent and Trademark Office*